(12) United States Patent
Masuoka et al.

(10) Patent No.: US 9,929,341 B2
(45) Date of Patent: Mar. 27, 2018

(54) SEMICONDUCTOR DEVICE AND METHOD FOR PRODUCING A SEMICONDUCTOR DEVICE

(71) Applicant: UNISANTIS ELECTRONICS SINGAPORE PTE. LTD., Singapore (SG)

(72) Inventors: Fujio Masuoka, Tokyo (JP); Hiroki Nakamura, Tokyo (JP)

(73) Assignee: Unisantis Electronics Singapore Pte. Ltd., Singapore (SG)

( * ) Notice: Subject to any disclaimer, the term of this patent is extended or adjusted under 35 U.S.C. 154(b) by 0 days.

(21) Appl. No.: 15/489,108

(22) Filed: Apr. 17, 2017

(65) Prior Publication Data

US 2017/0222142 A1 Aug. 3, 2017

Related U.S. Application Data

(63) Continuation of application No. 14/937,429, filed on Nov. 10, 2015, which is a continuation of application No. PCT/JP2013/077002, filed on Oct. 3, 2013.

(51) Int. Cl.
*H01L 31/062* (2012.01)
*H01L 31/0392* (2006.01)
(Continued)

(52) U.S. Cl.
CPC ........ *H01L 45/1233* (2013.01); *C23C 16/305* (2013.01); *C30B 29/46* (2013.01);
(Continued)

(58) Field of Classification Search
CPC ........... H01L 21/823487; H01L 27/228; H01L 27/0886; H01L 27/2454; H01L 29/785;
(Continued)

(56) References Cited

U.S. PATENT DOCUMENTS 5,801,398 A 9/1998 Hebiguchi
5,929,477 A 7/1999 McAllister Burns, Jr. et al.
(Continued)

FOREIGN PATENT DOCUMENTS

JP 08116060 A 5/1996
JP 10209404 A 8/1998
(Continued)

OTHER PUBLICATIONS

Mistry, K., et al., "A 45nm Logic Technology with High-k+Metal Gate Transistors, Strained Silicon, 9 Cu Interconnect Layers, 193 nm Dry Patterning, and 100% Pb-free Packaging", 2007, pp. 247-250, IEEE.

*Primary Examiner* — Hsien Ming Lee
(74) *Attorney, Agent, or Firm* — Laurence Greenberg; Werner Stemer; Ralph Locher

(57) ABSTRACT

A semiconductor device includes first pillar-shaped semiconductor layers, a first gate insulating film formed around the first pillar-shaped semiconductor layers, gate electrodes formed around the first gate insulating film, gate lines connected to the gate electrodes, a second gate insulating film formed around upper portions of the first pillar-shaped semiconductor layers, first contacts formed of a first metal material and formed around the second gate insulating film, second contacts formed of a second metal material and connecting upper portions of the first contacts and upper portions of the first pillar-shaped semiconductor layers, diffusion layers formed in lower portions of the first pillar-shaped semiconductor layers, pillar-shaped insulator layers formed on the second contacts, variable-resistance films formed around upper portions of the pillar-shaped insulator layers, and lower electrodes formed around lower portions of the pillar-shaped insulator layers and connected to the variable-resistance films.

26 Claims, 61 Drawing Sheets

(51) Int. Cl.
*H01L 21/00* (2006.01)
*H01L 21/8238* (2006.01)
*H01L 21/336* (2006.01)
*H01L 45/00* (2006.01)
*H01L 21/02* (2006.01)
*C30B 29/46* (2006.01)
*C23C 16/30* (2006.01)
*H01L 21/762* (2006.01)

(52) U.S. Cl.
CPC .. *H01L 21/02417* (2013.01); *H01L 21/02568* (2013.01); *H01L 21/76208* (2013.01)

(58) Field of Classification Search
CPC ......... H01L 29/66545; H01L 29/66666; H01L 29/66795; H01L 45/06; H01L 45/1608
USPC ............... 438/149, 156, 173, 192, 212, 268; 257/288, 350, 401
See application file for complete search history.

(56) References Cited

U.S. PATENT DOCUMENTS

| | | | |
|---|---|---|---|
| 6,891,234 B1 | 5/2005 | Connelly et al. | |
| 7,251,157 B2 | 7/2007 | Osada et al. | |
| 7,940,573 B2 | 5/2011 | Masuoka et al. | |
| 7,943,502 B2 | 5/2011 | Park et al. | |
| 8,569,741 B2 | 10/2013 | Scherer et al. | |
| 8,637,843 B2 | 1/2014 | Asano | |
| 8,735,971 B2 | 5/2014 | Masuoka et al. | |
| 9,025,369 B2 | 5/2015 | Takashima | |
| 9,281,472 B2 | 3/2016 | Masuoka et al. | |
| 9,484,532 B2 * | 11/2016 | Masuoka | H01L 45/126 |
| 2004/0262681 A1 | 12/2004 | Masuoka et al. | |
| 2015/0357378 A1 | 12/2015 | Masuoka et al. | |

FOREIGN PATENT DOCUMENTS

| | | |
|---|---|---|
| JP | 11297984 A | 10/1999 |
| JP | 2004356314 A | 12/2004 |
| JP | 2005260014 A | 9/2005 |
| JP | 2008021781 A | 1/2008 |
| JP | 2008311664 A | 12/2008 |
| JP | 2011166163 A | 8/2011 |
| JP | 2011199017 A | 10/2011 |
| JP | 2012174827 A | 9/2012 |
| JP | 2012186424 A | 9/2012 |
| JP | 2012204404 A | 10/2012 |
| JP | 2012531751 A | 12/2012 |
| WO | 2013038553 A1 | 3/2013 |
| WO | 2013093988 A1 | 4/2015 |

* cited by examiner

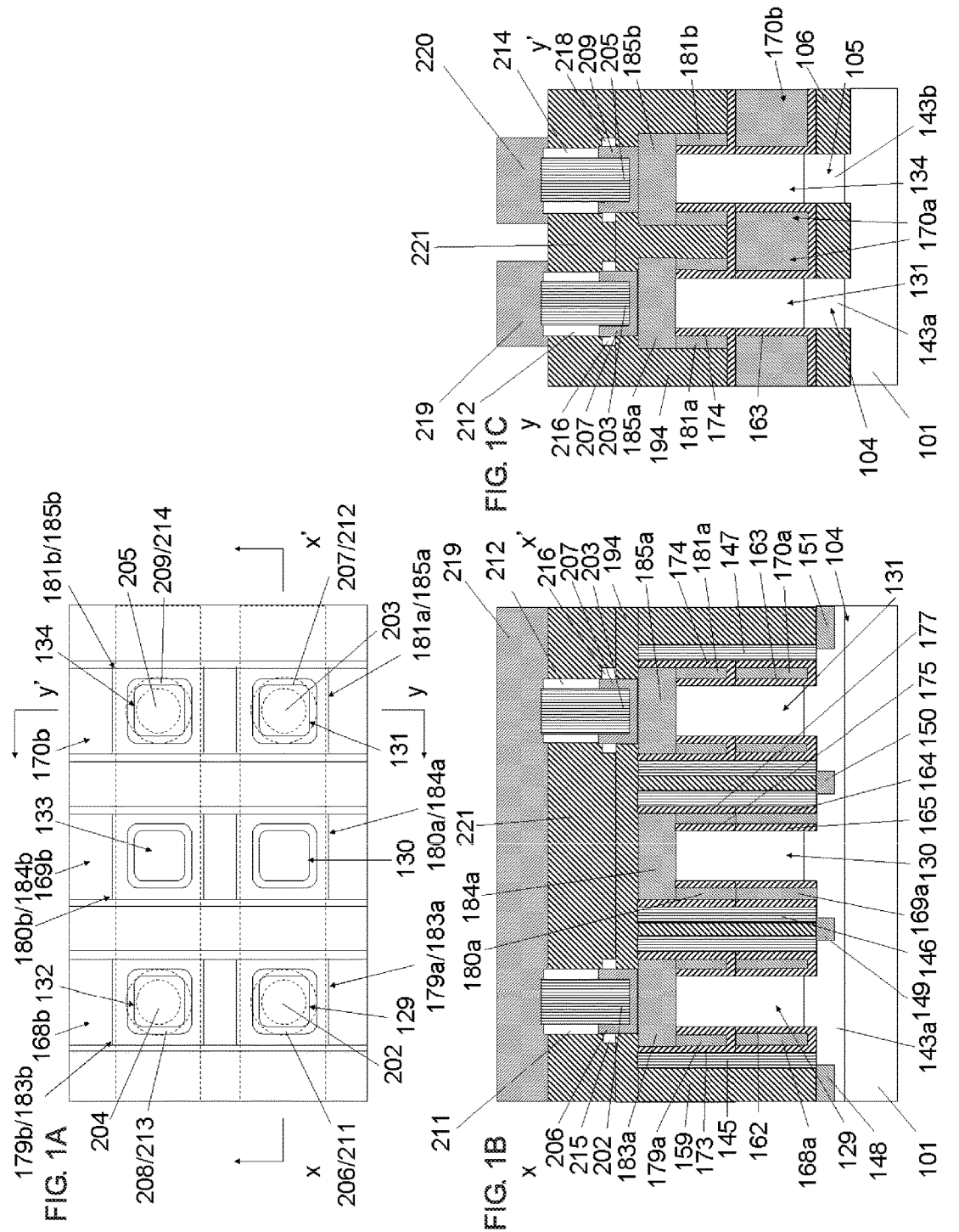

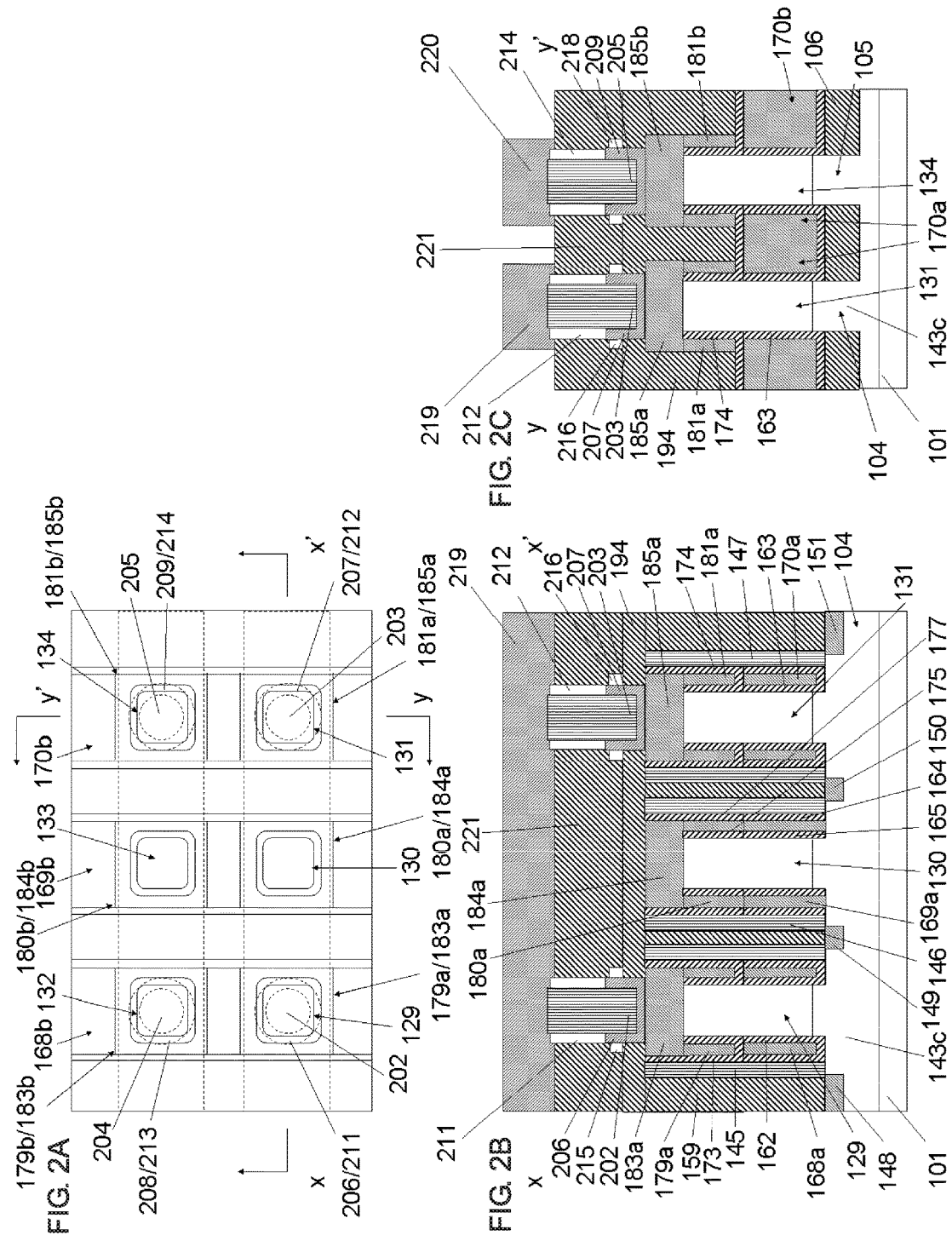

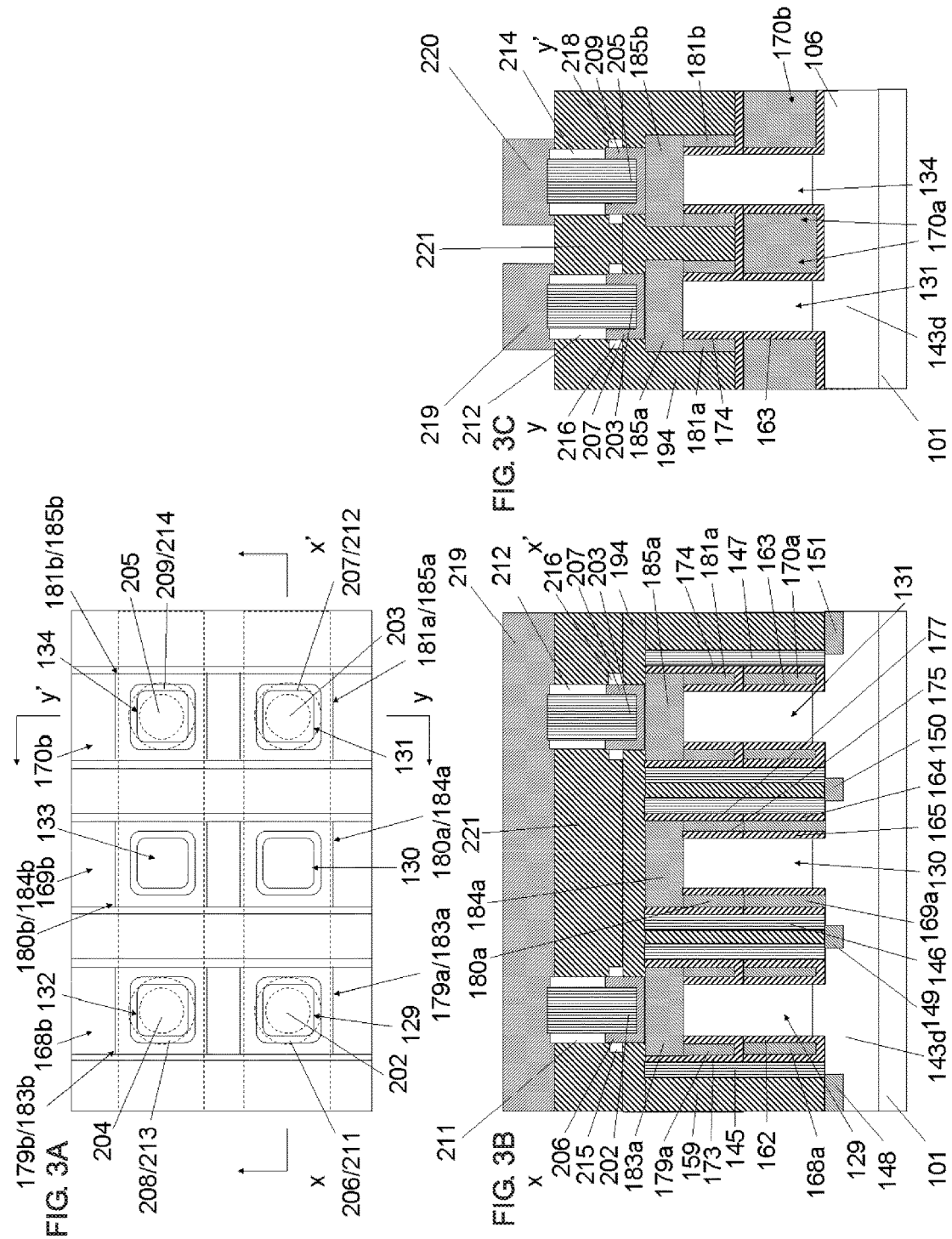

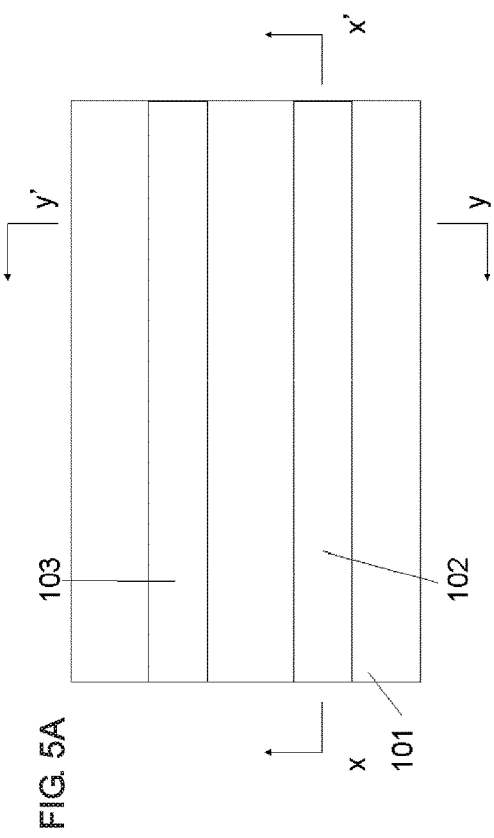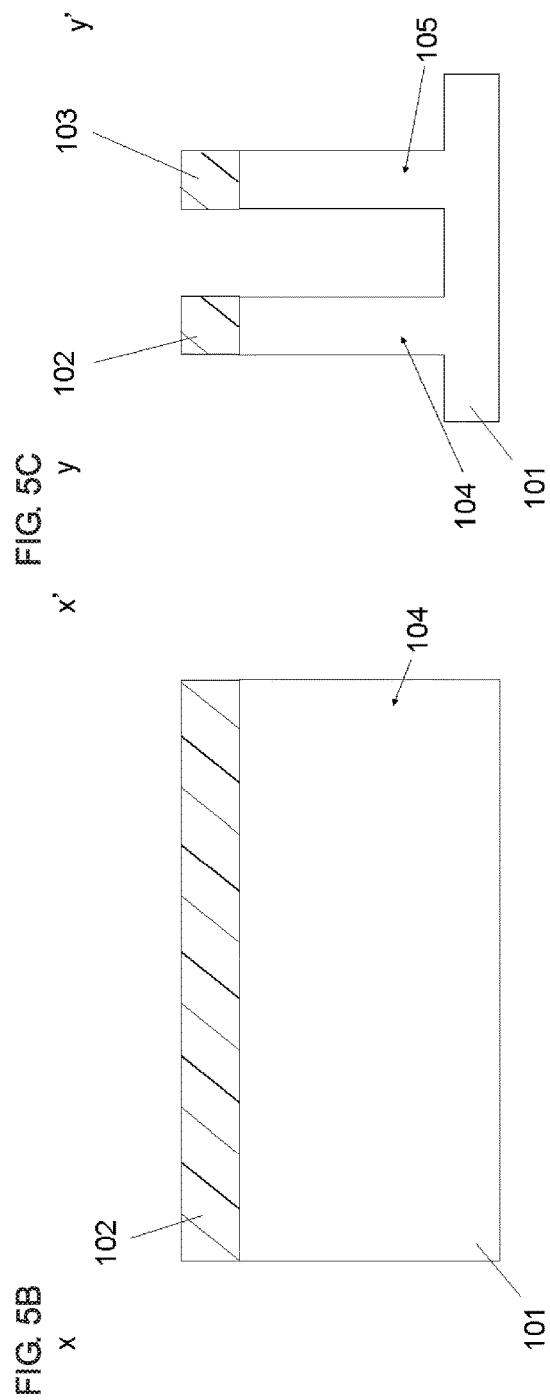

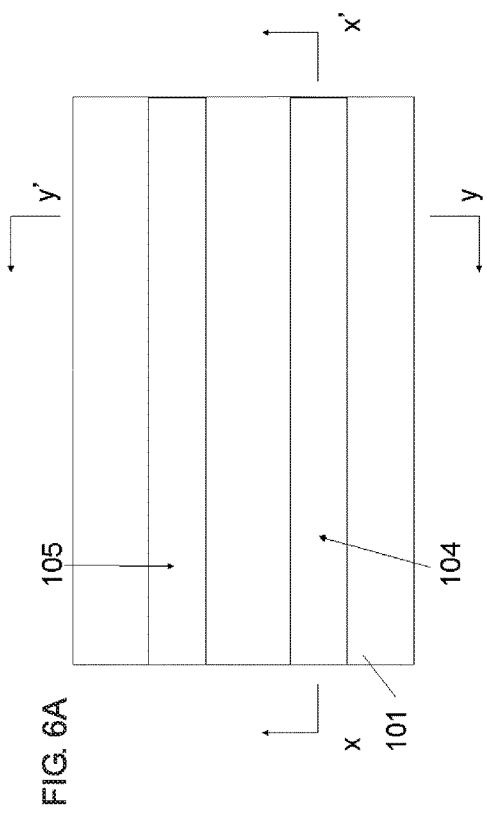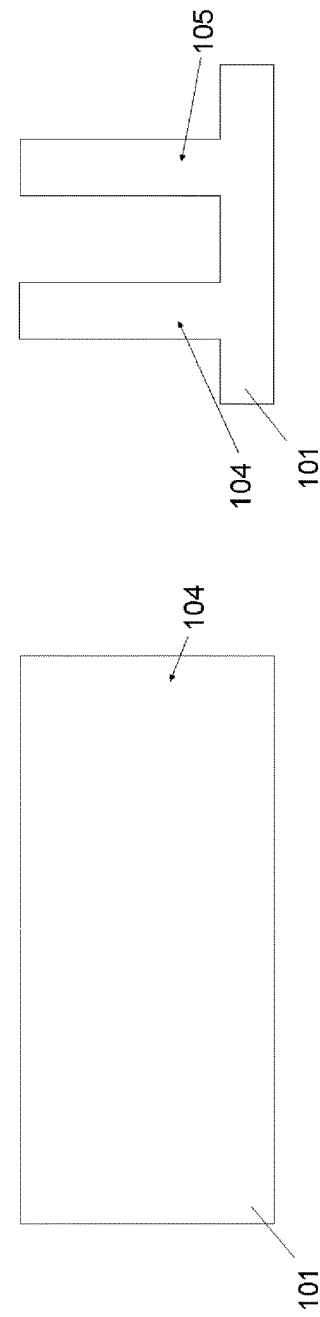

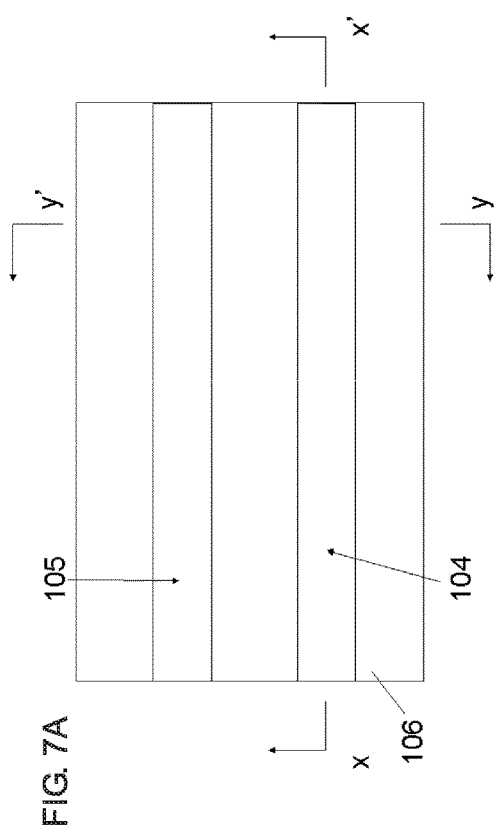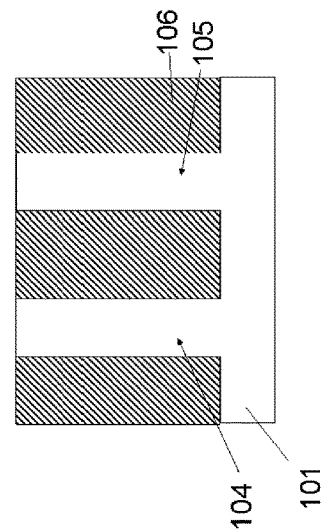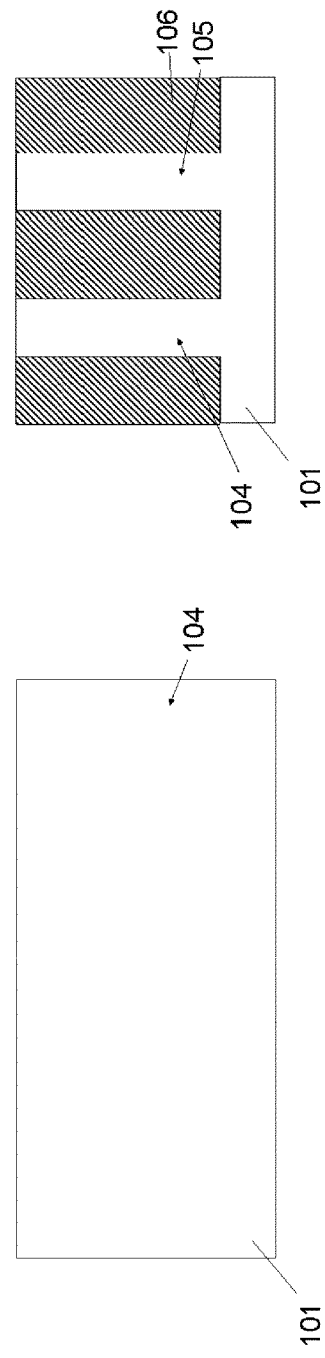

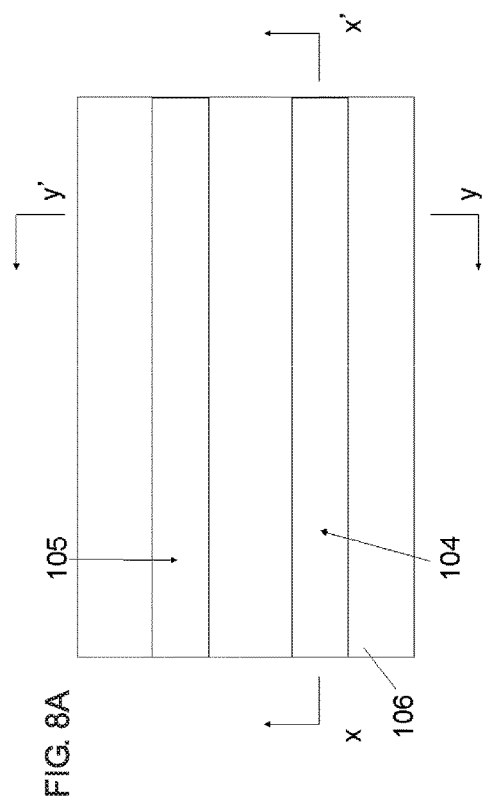
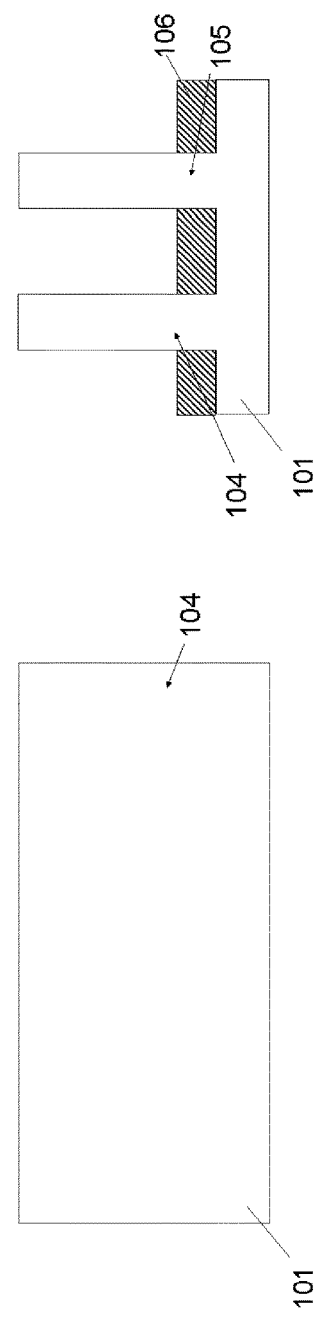

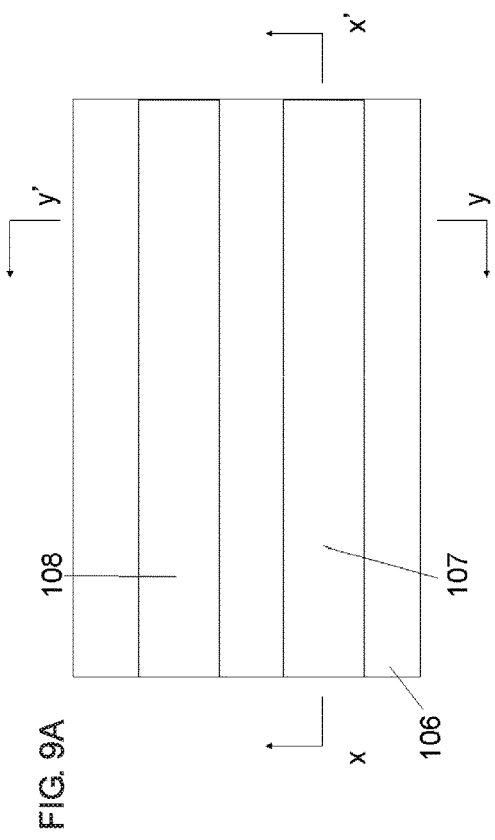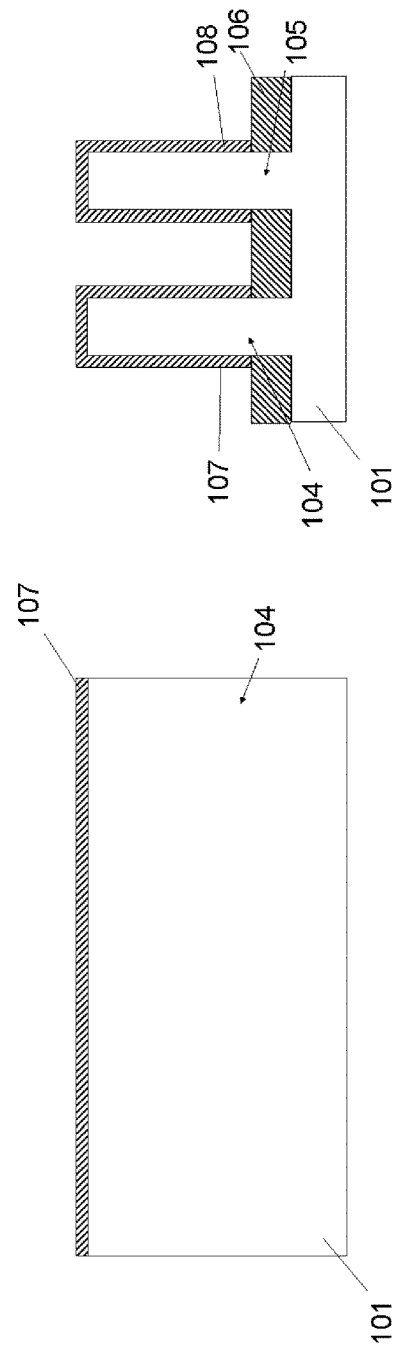

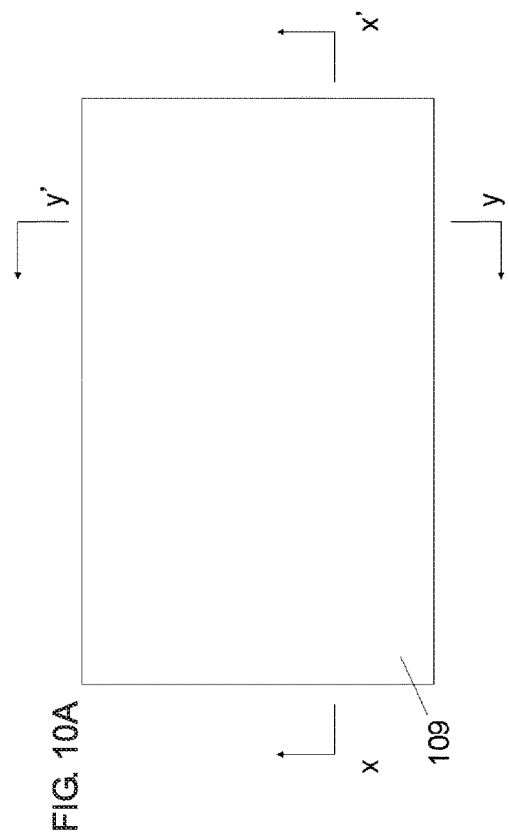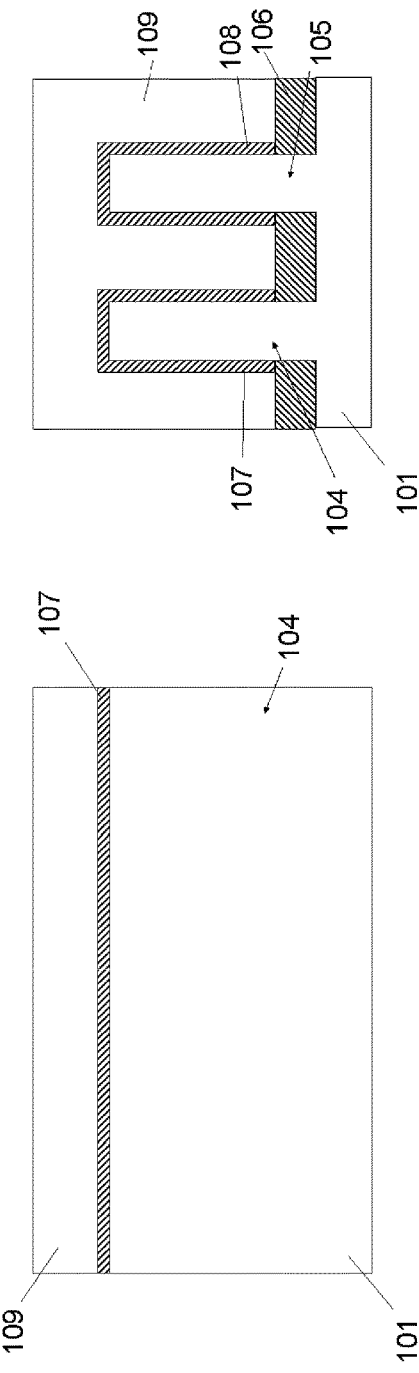

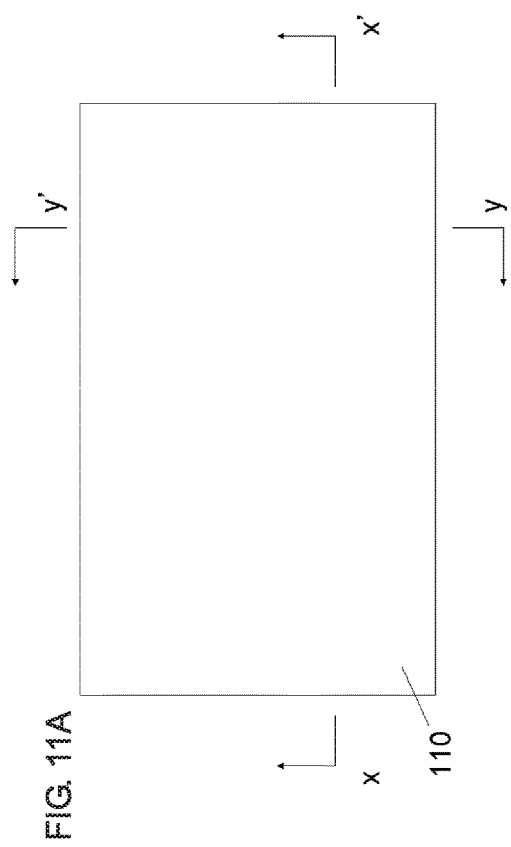
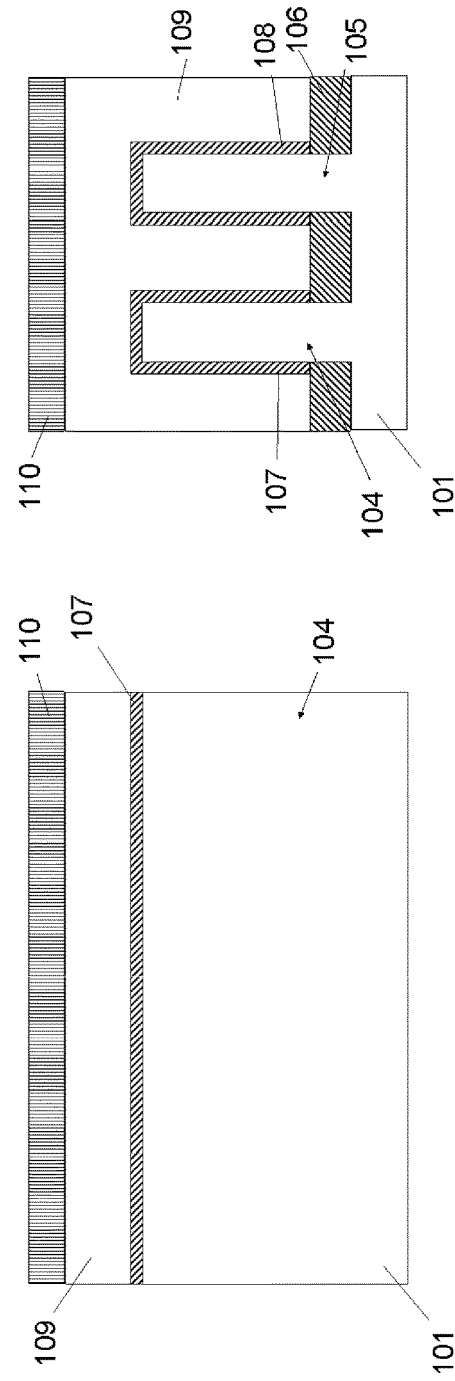
FIG. 11A
FIG. 11B
FIG. 11C

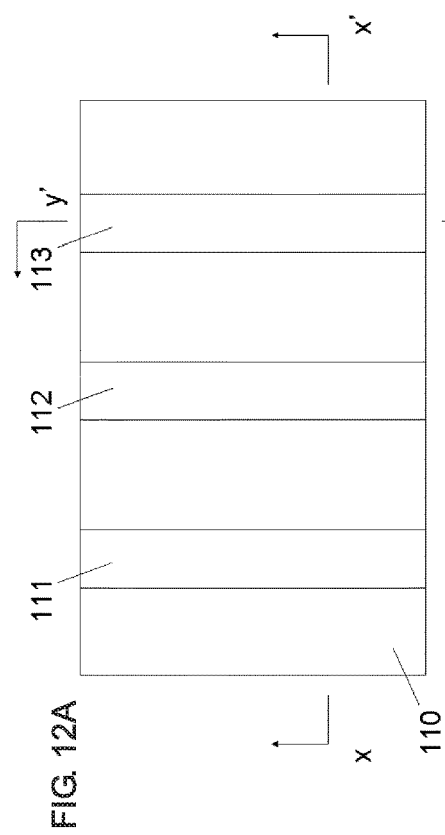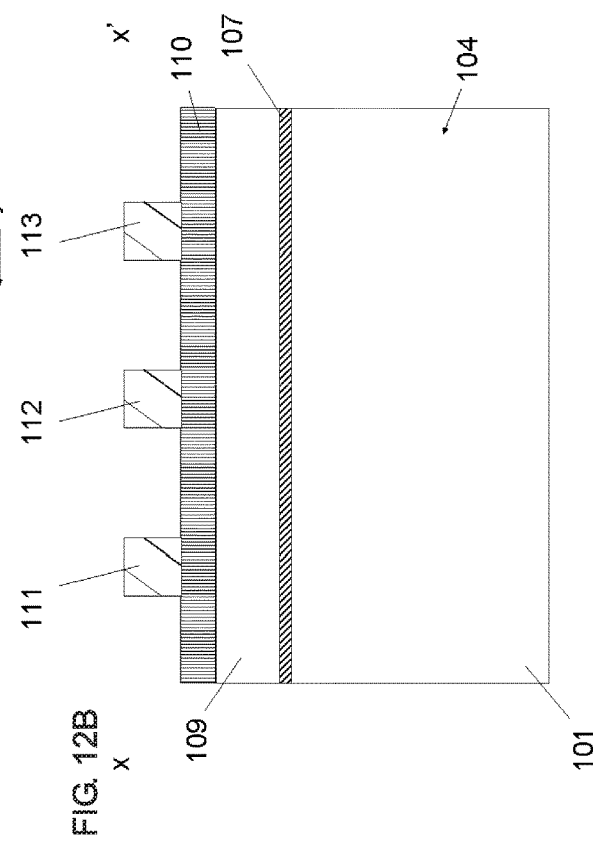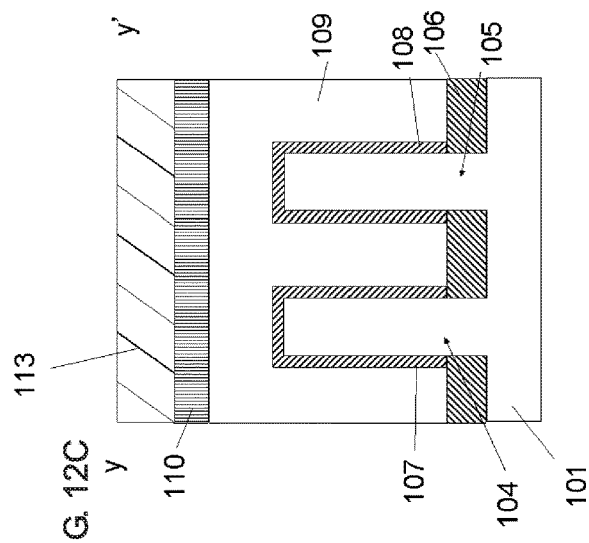

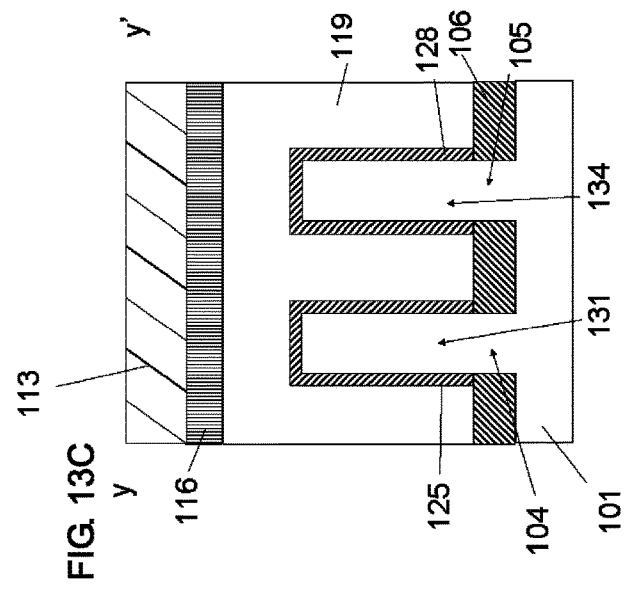
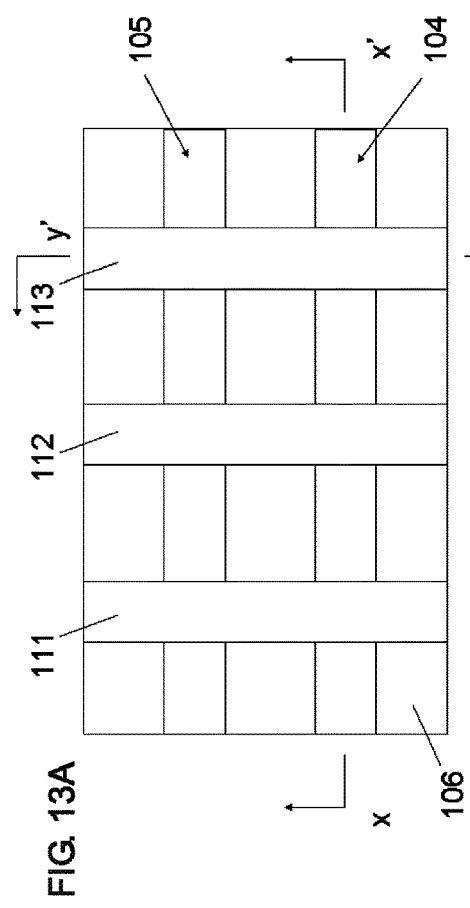
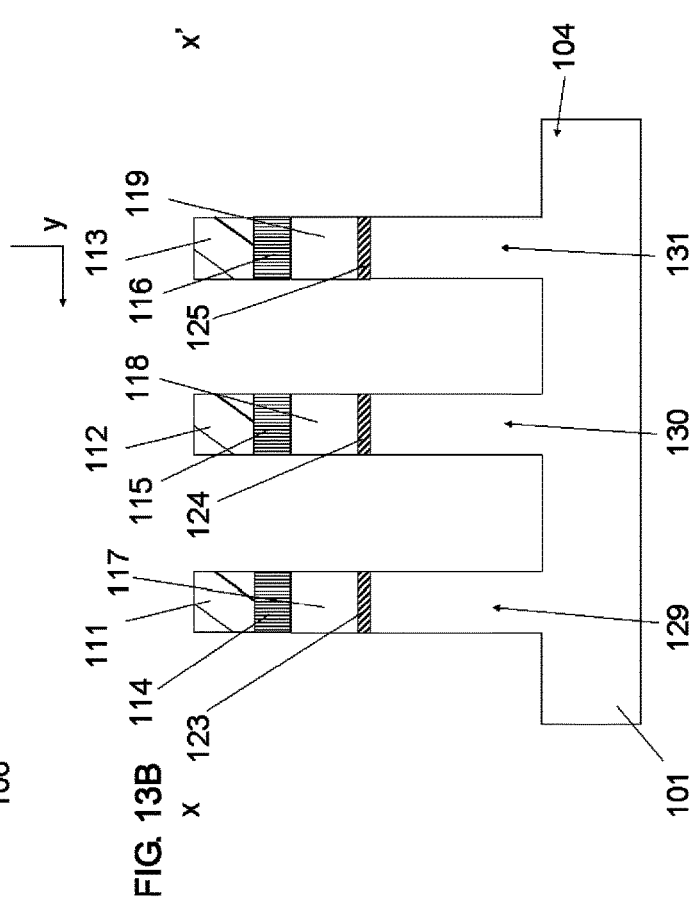

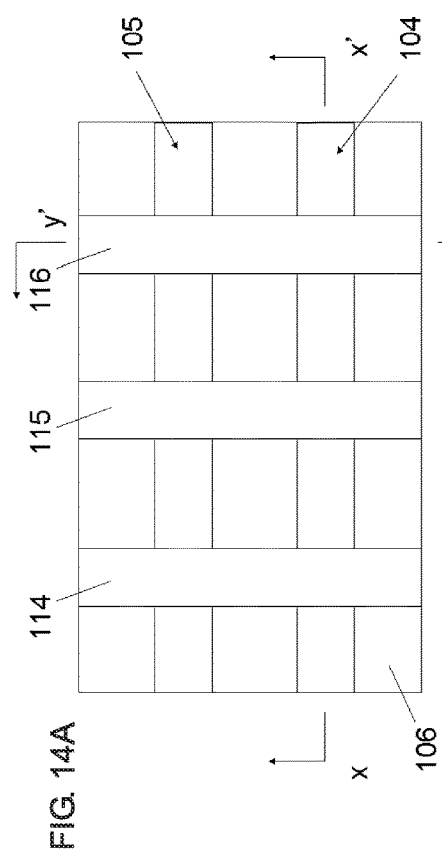
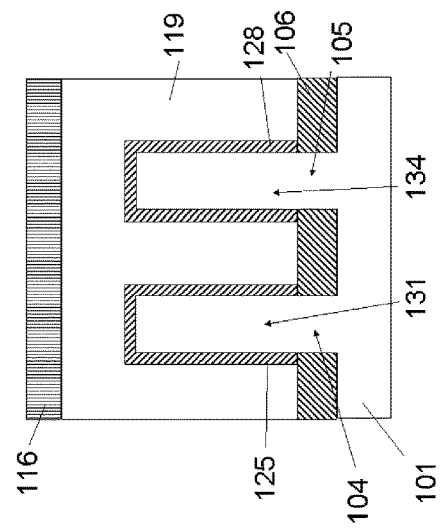
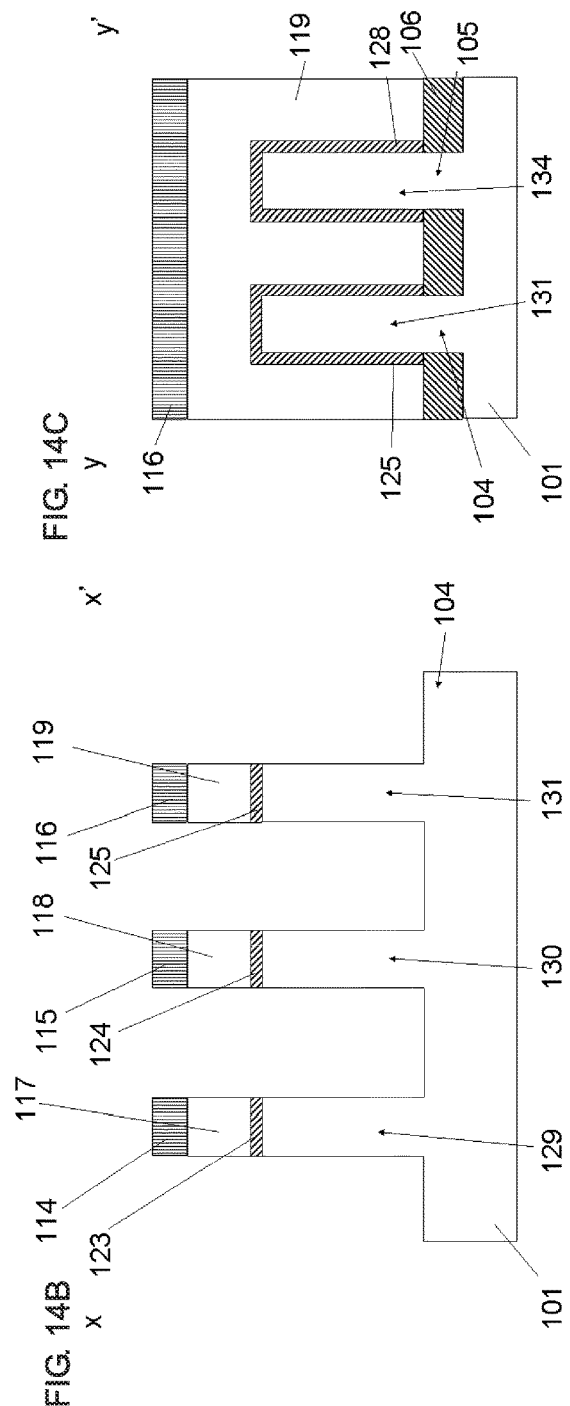

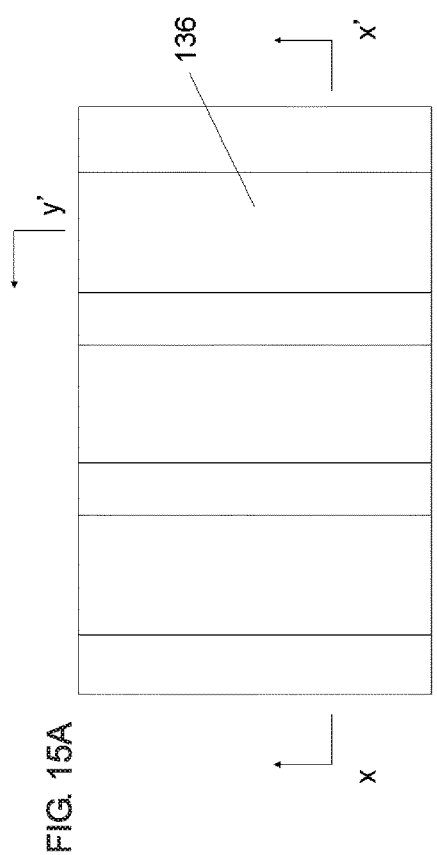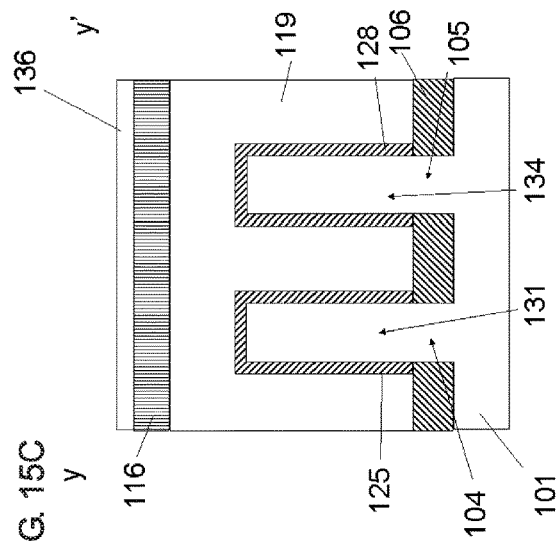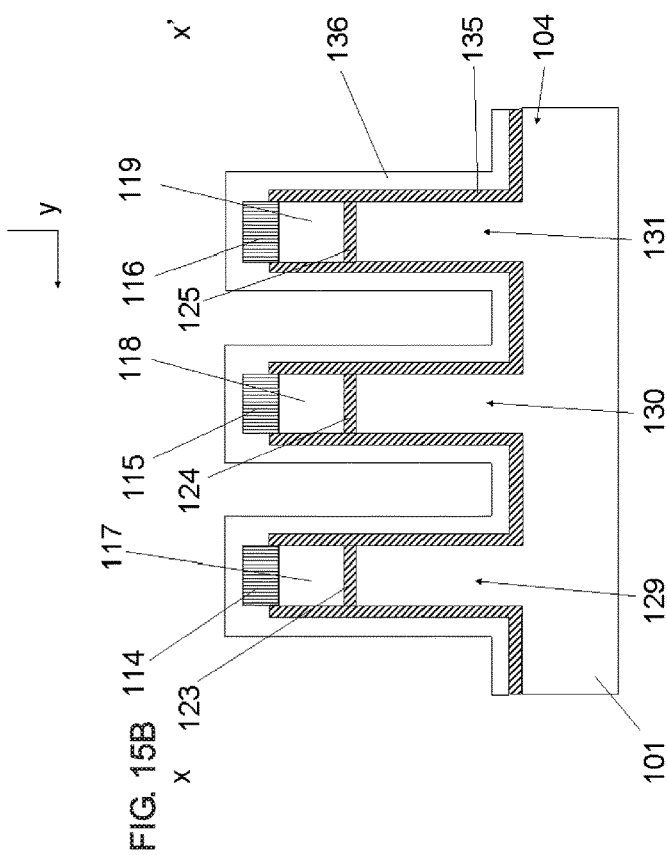

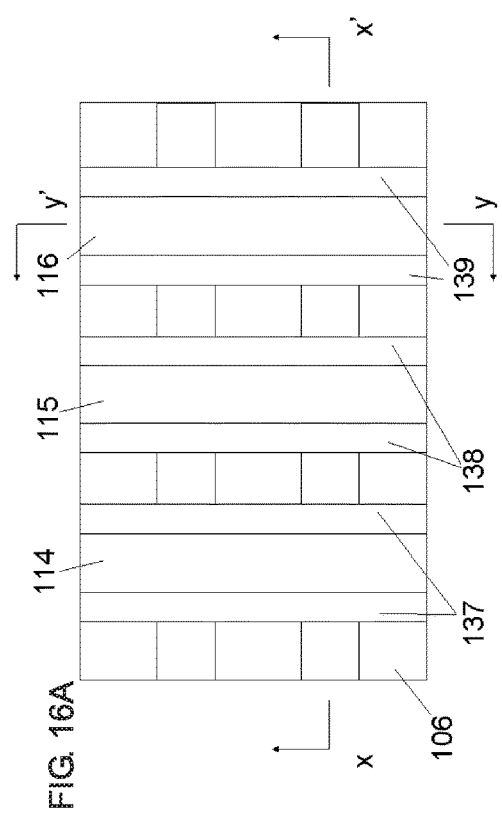
FIG. 16A
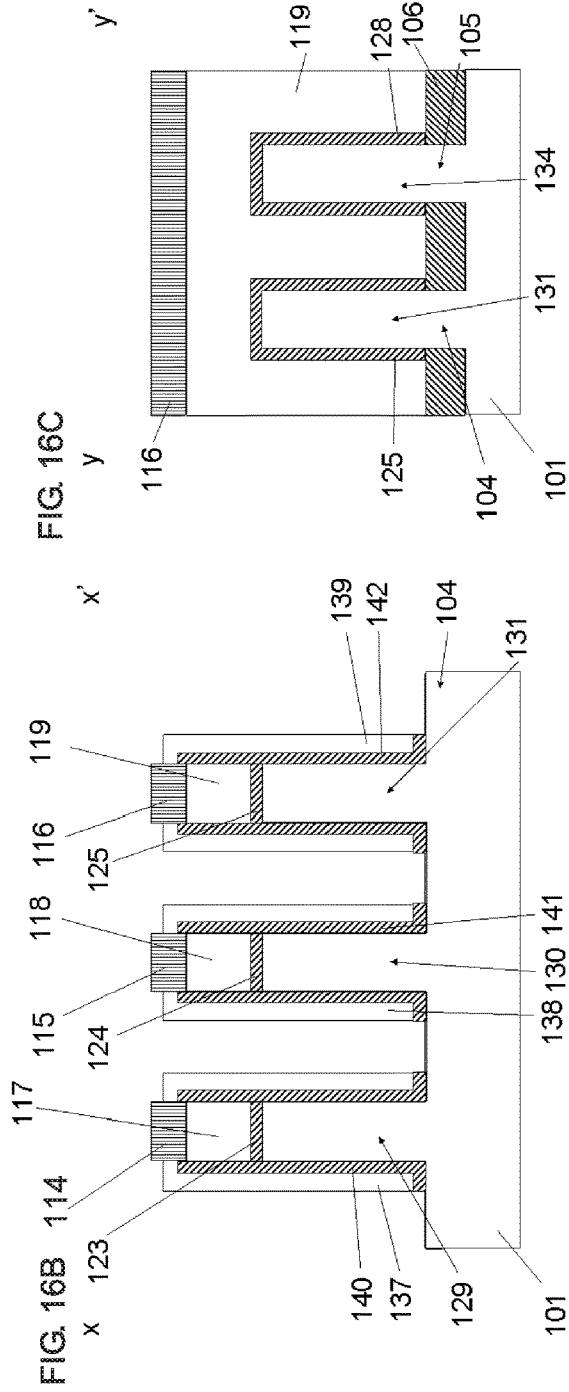
FIG. 16B
FIG. 16C

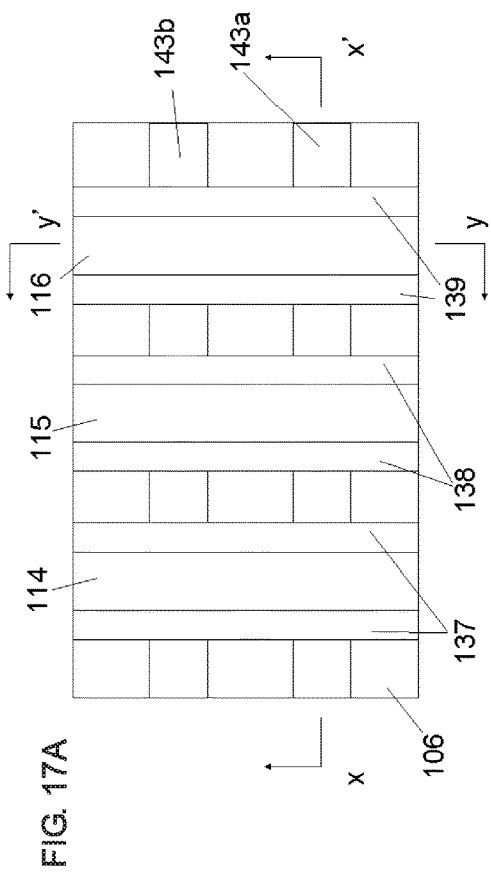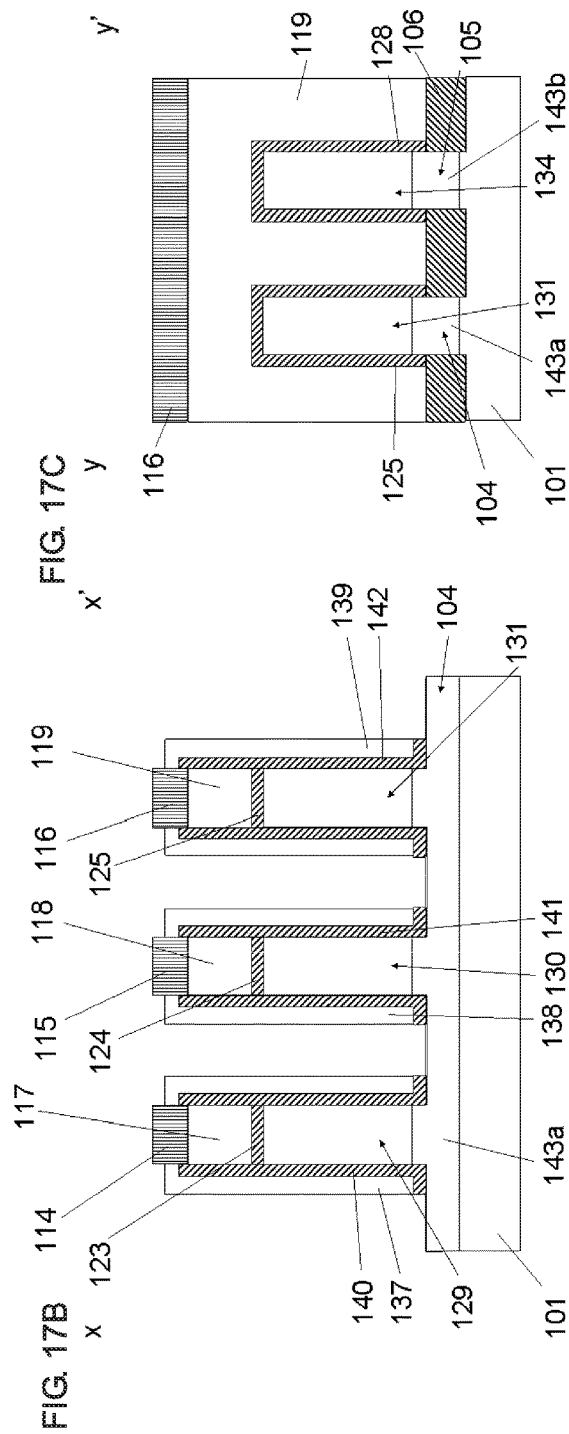

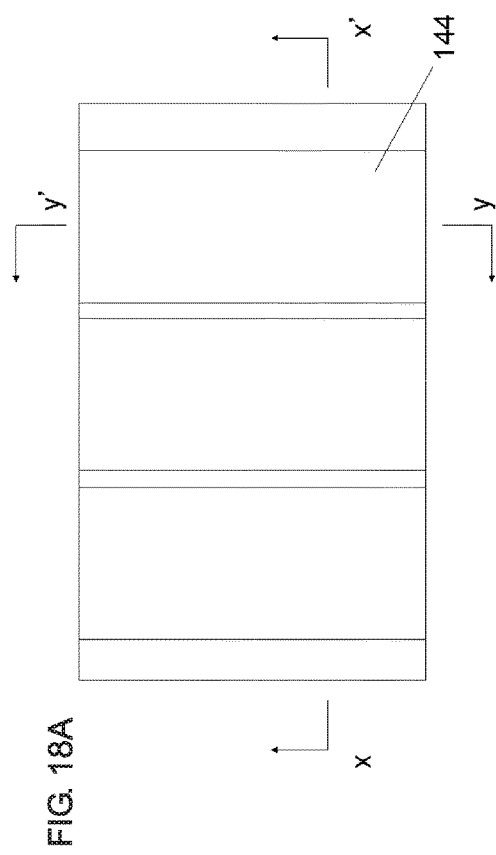
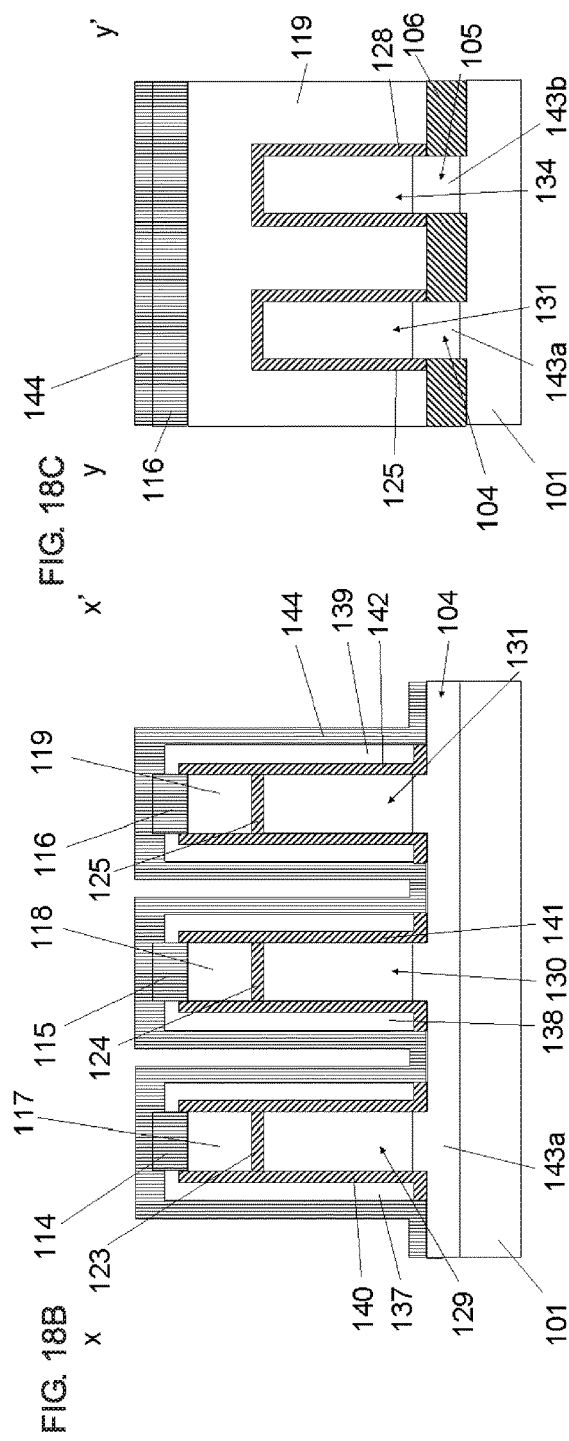
FIG. 18A
FIG. 18B
FIG. 18C

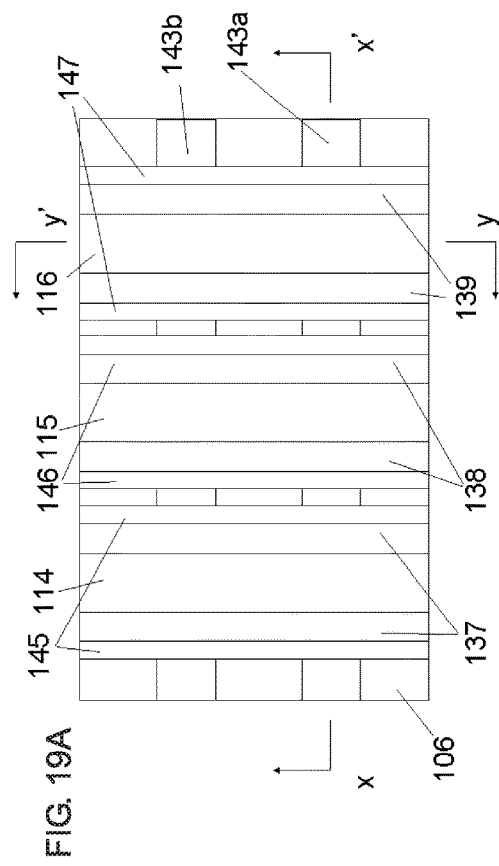
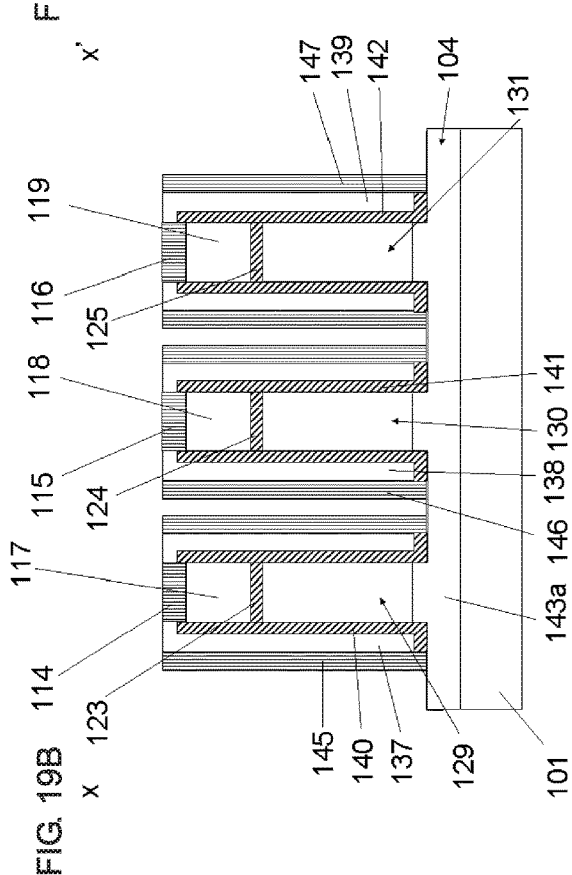
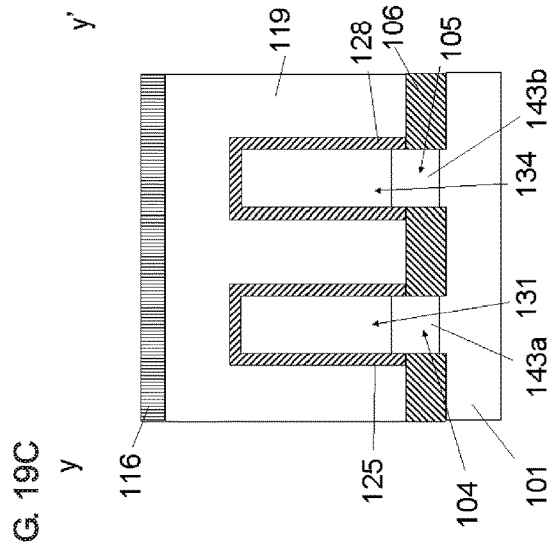

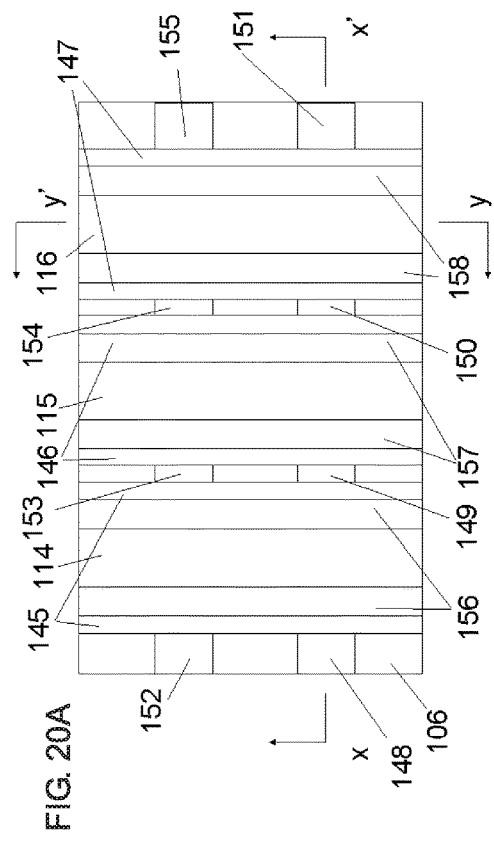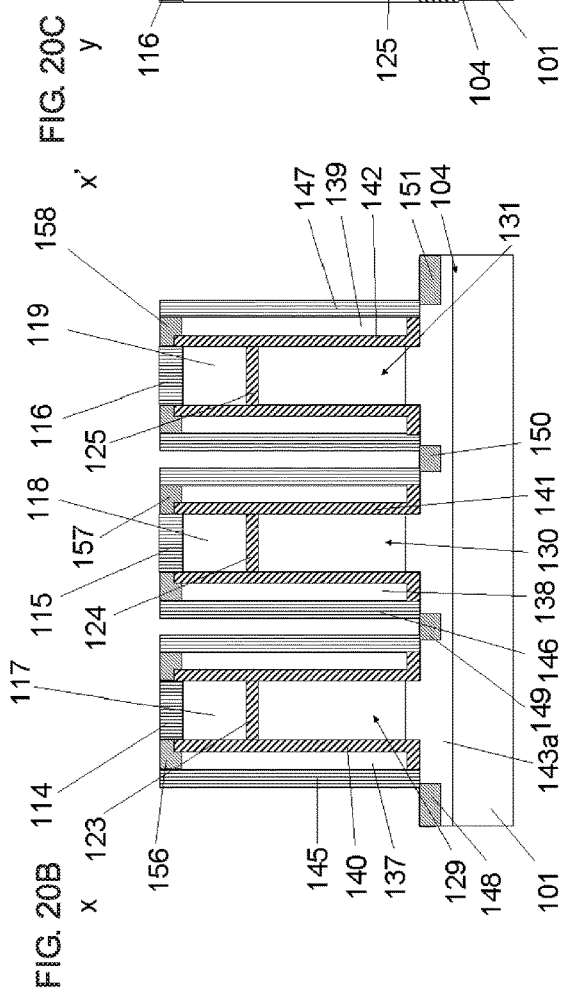

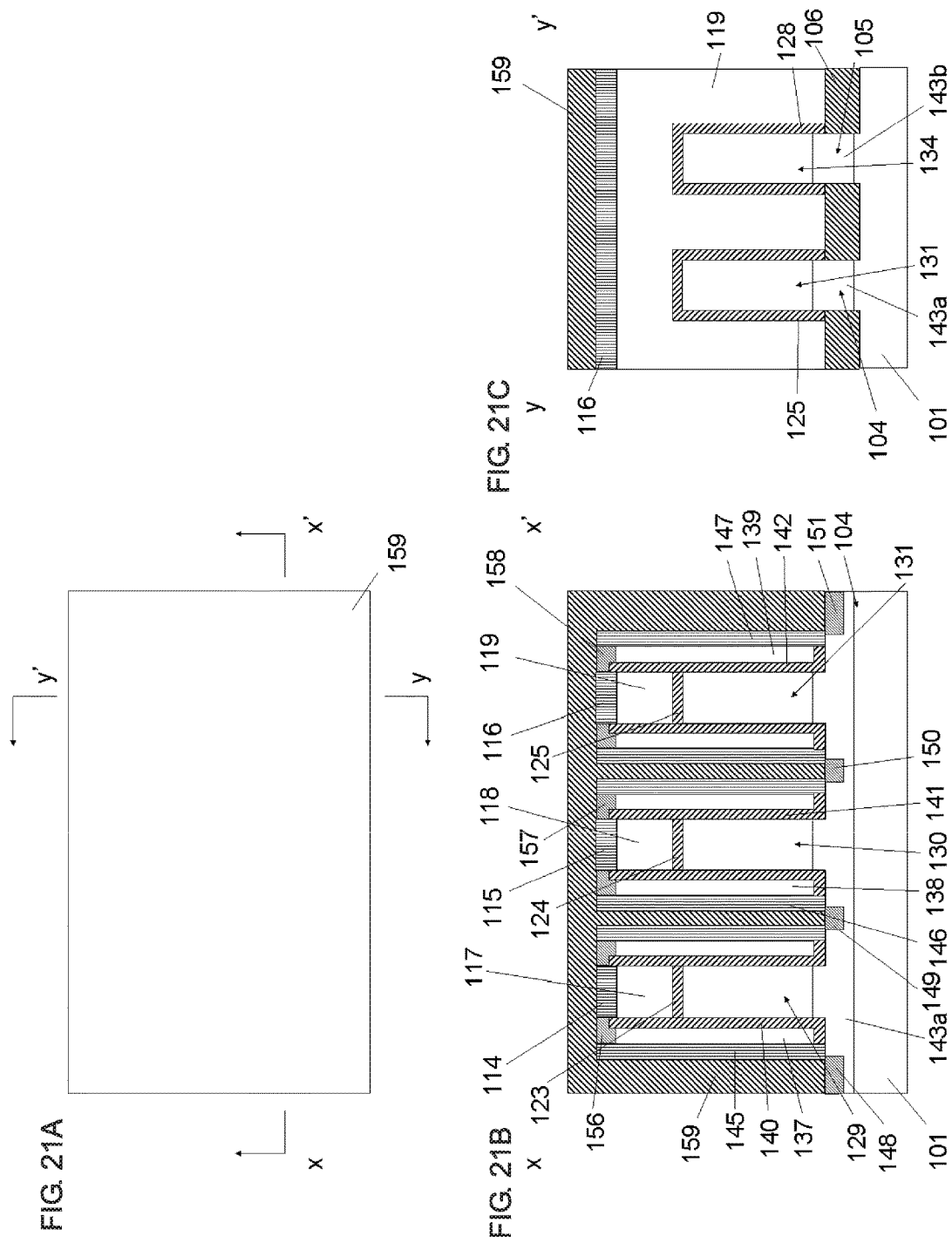

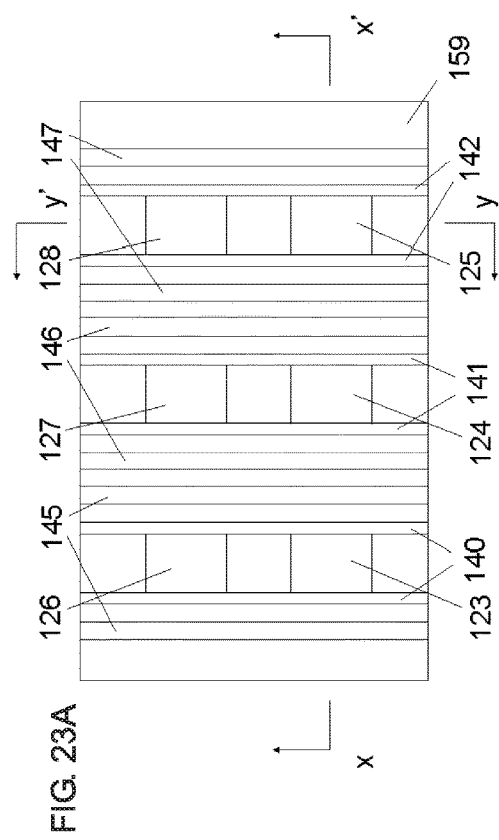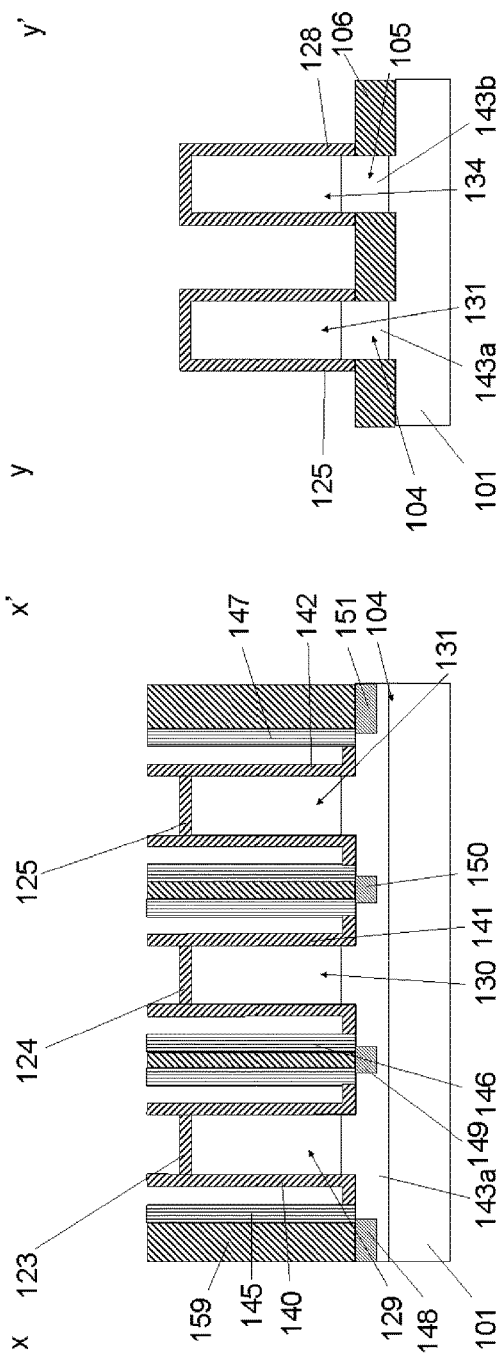

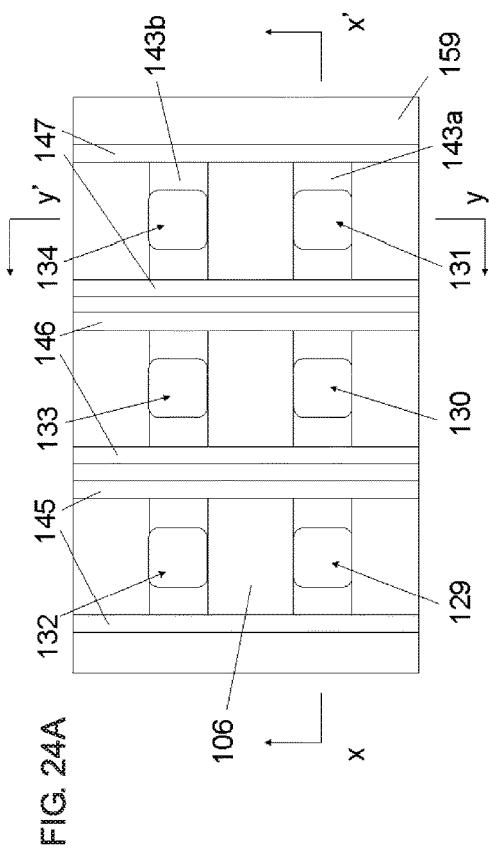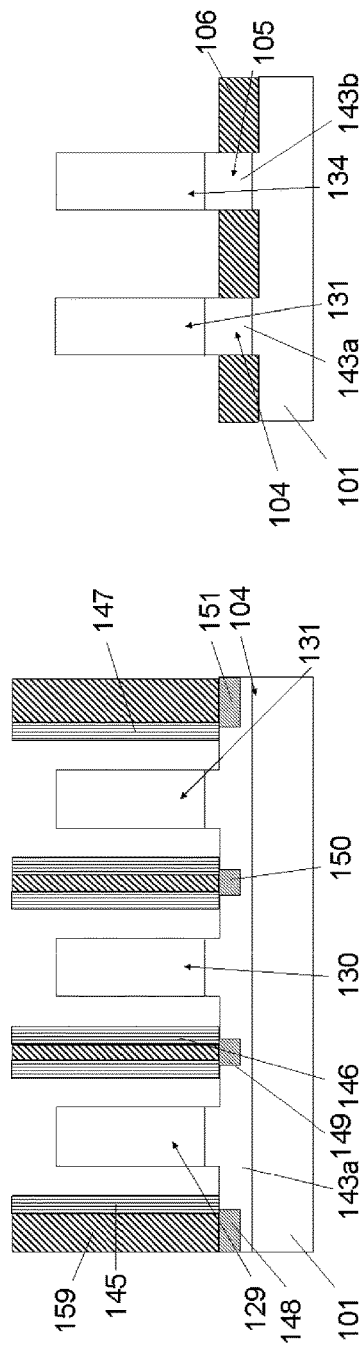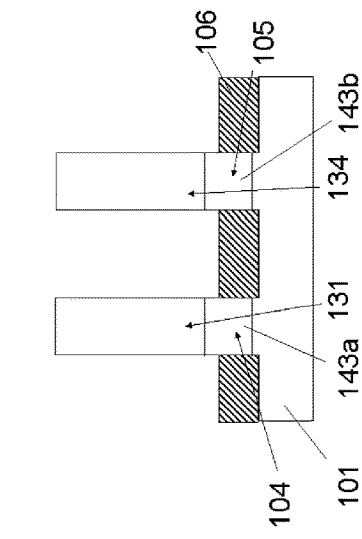

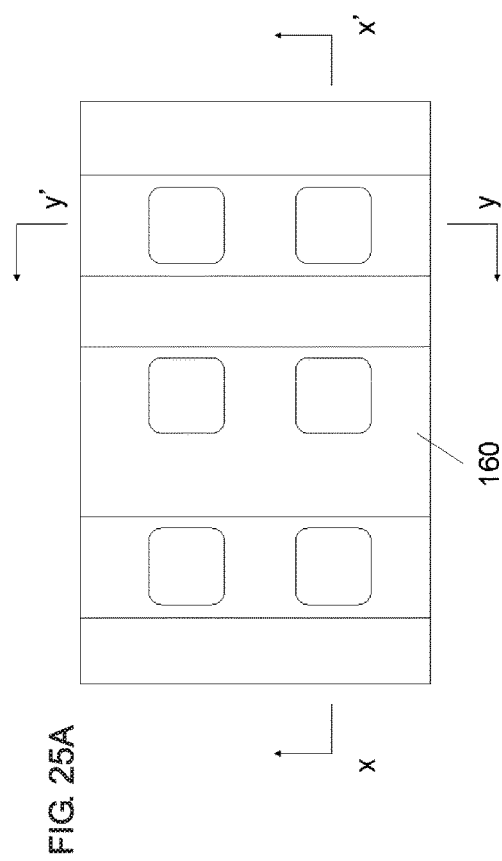
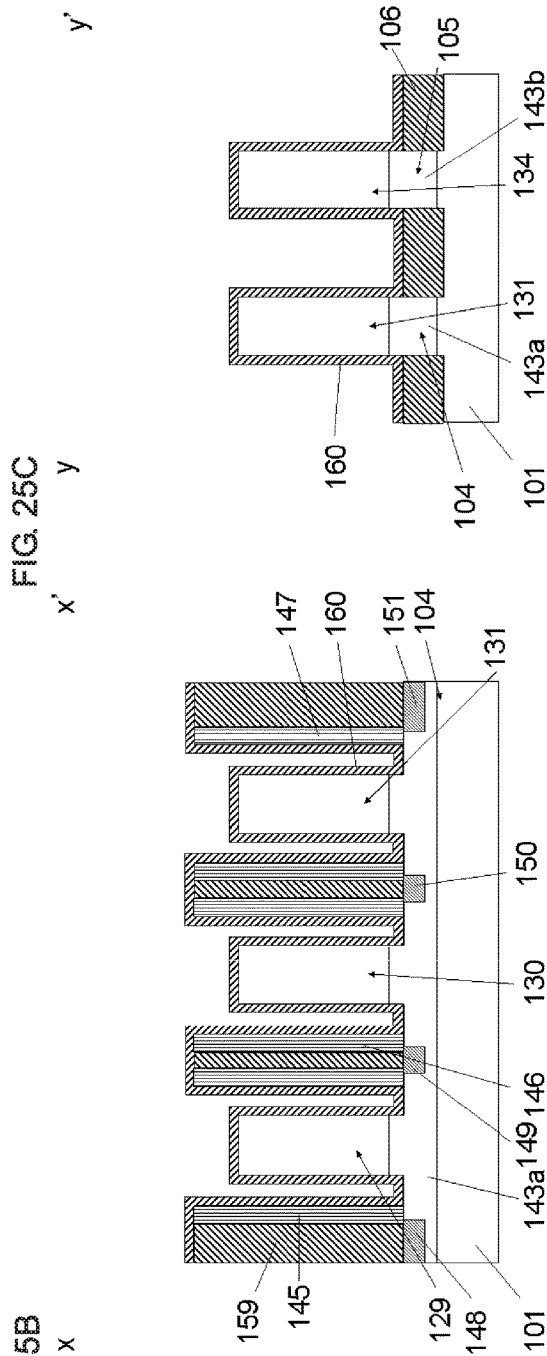
FIG. 25A
FIG. 25B
FIG. 25C

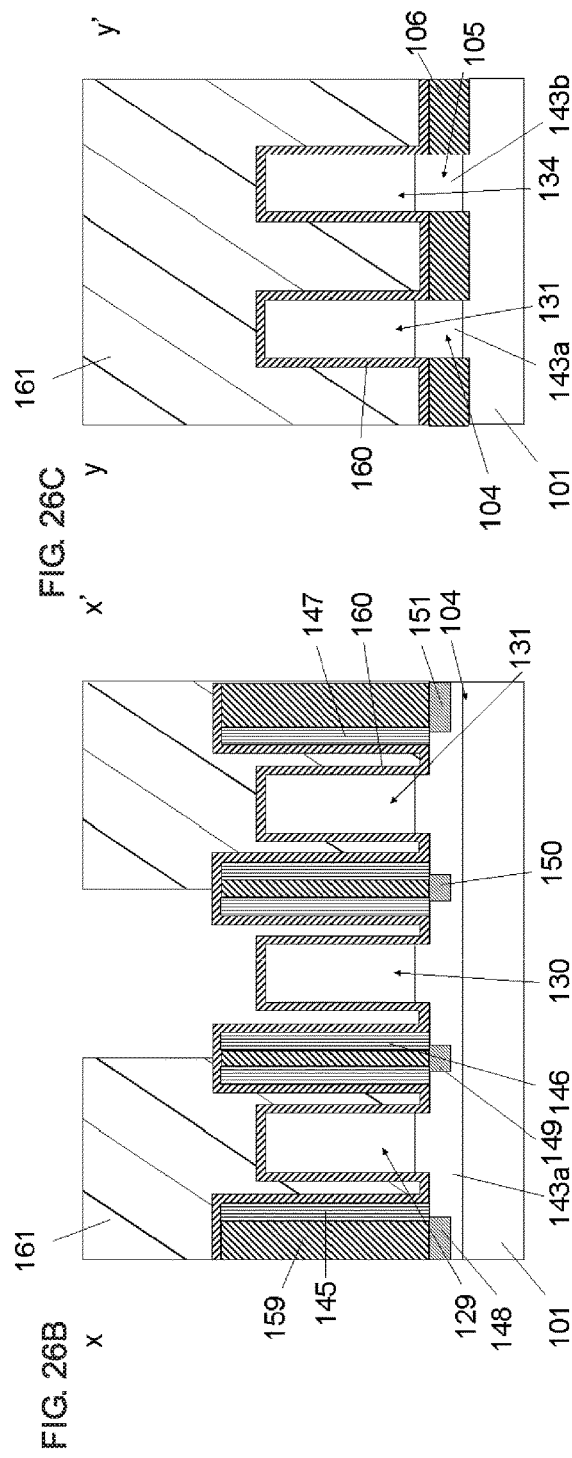

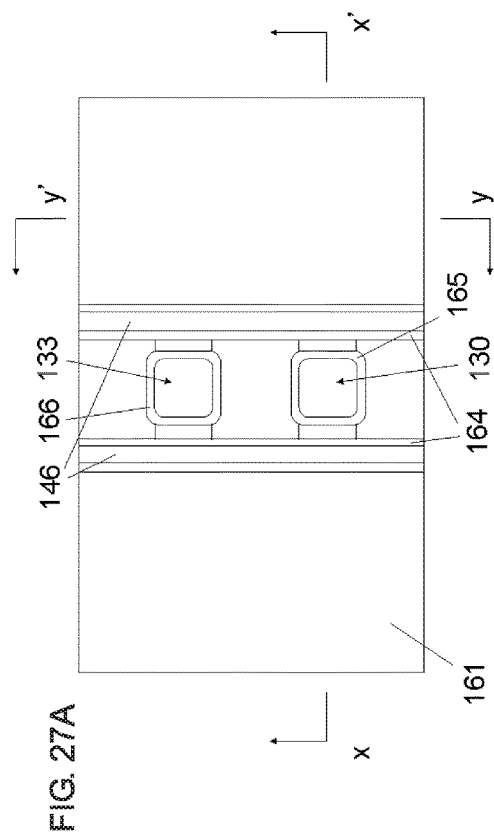
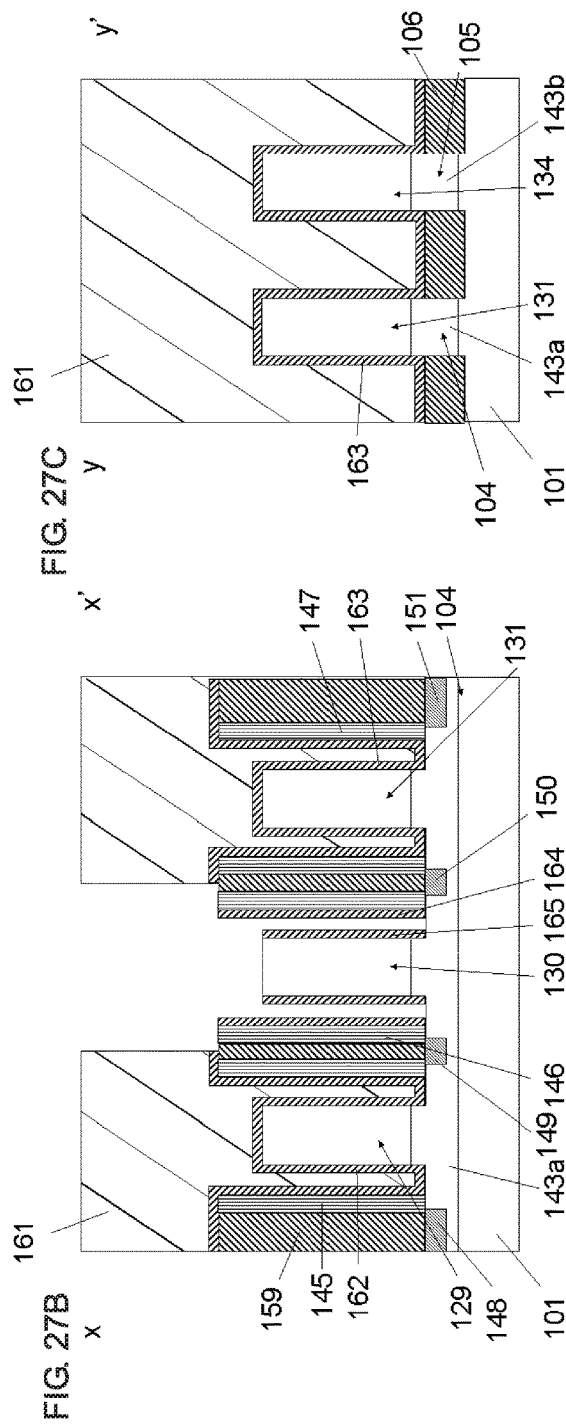
FIG. 27A
FIG. 27B
FIG. 27C

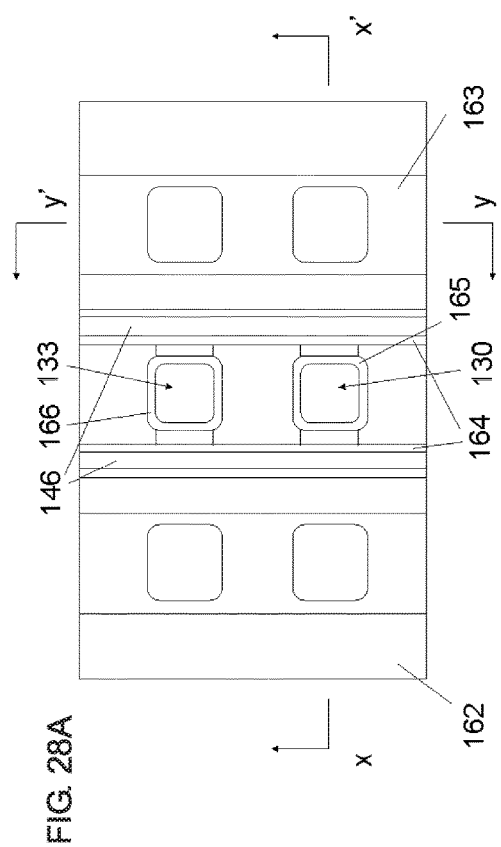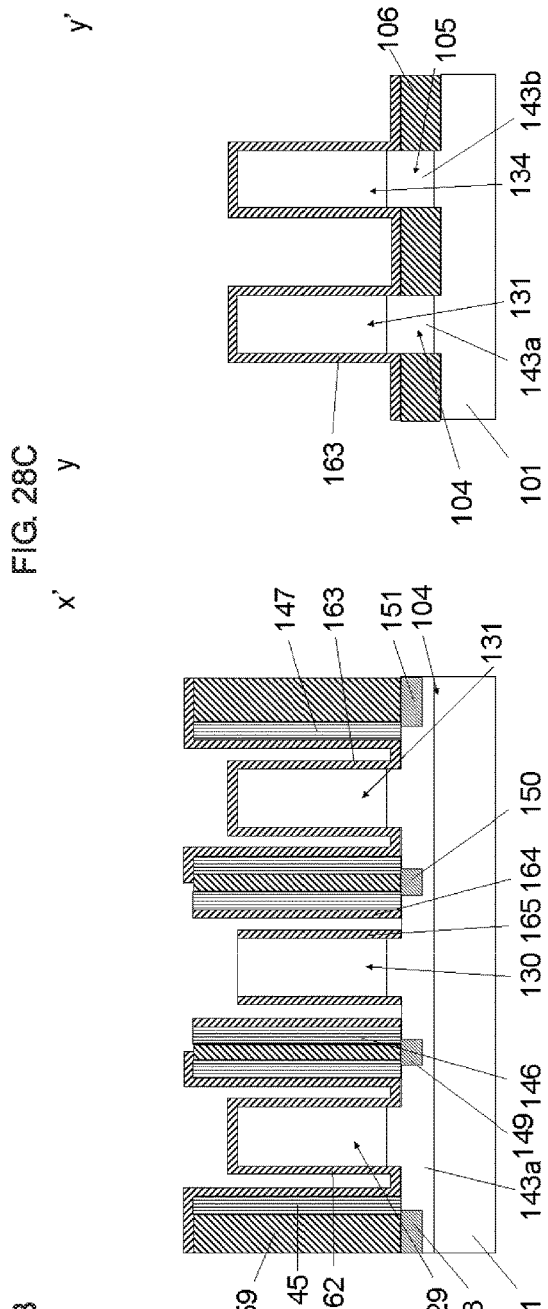
FIG. 28A
FIG. 28B
FIG. 28C

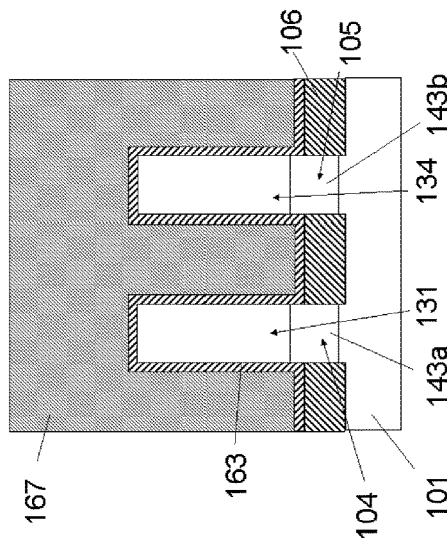
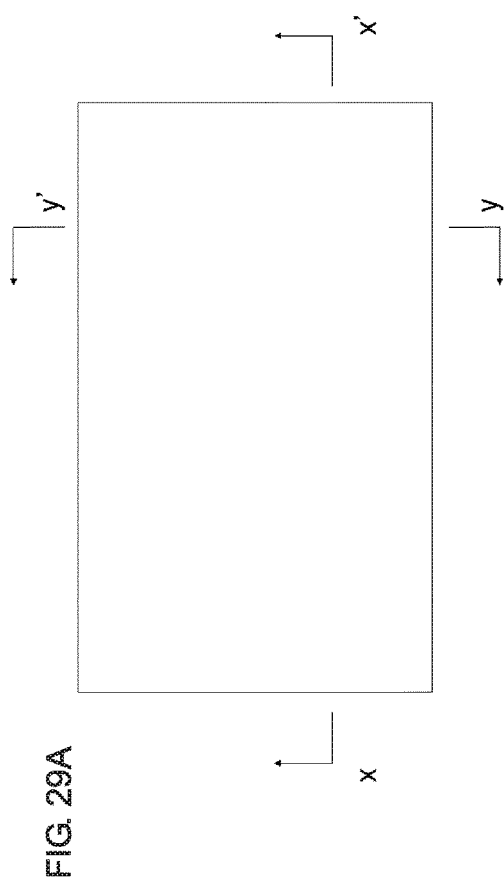
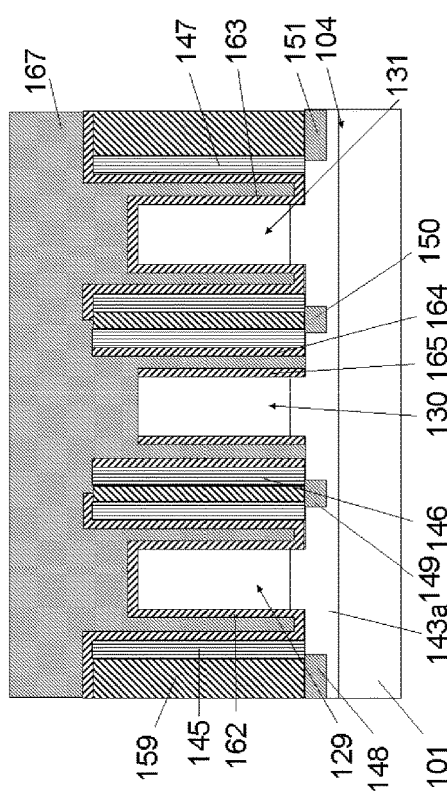

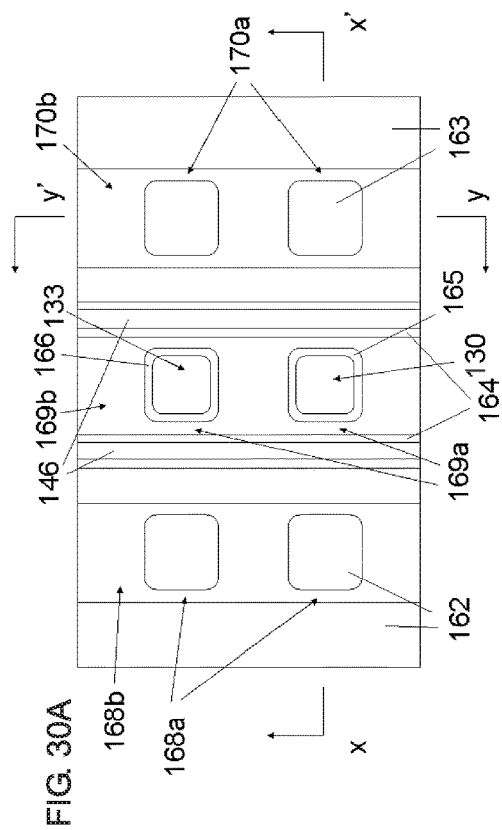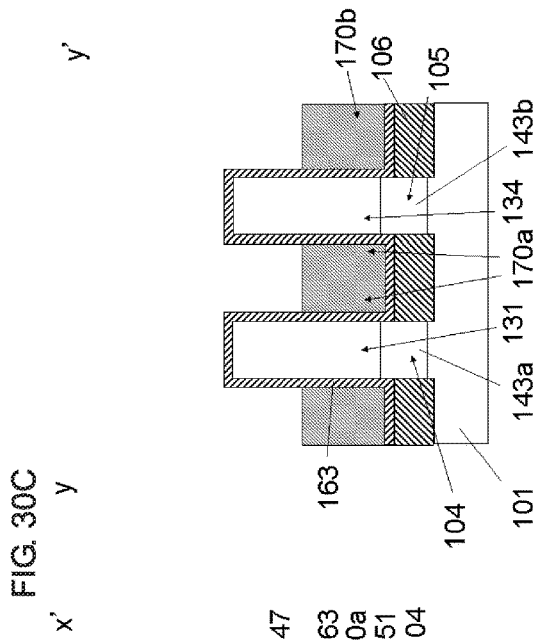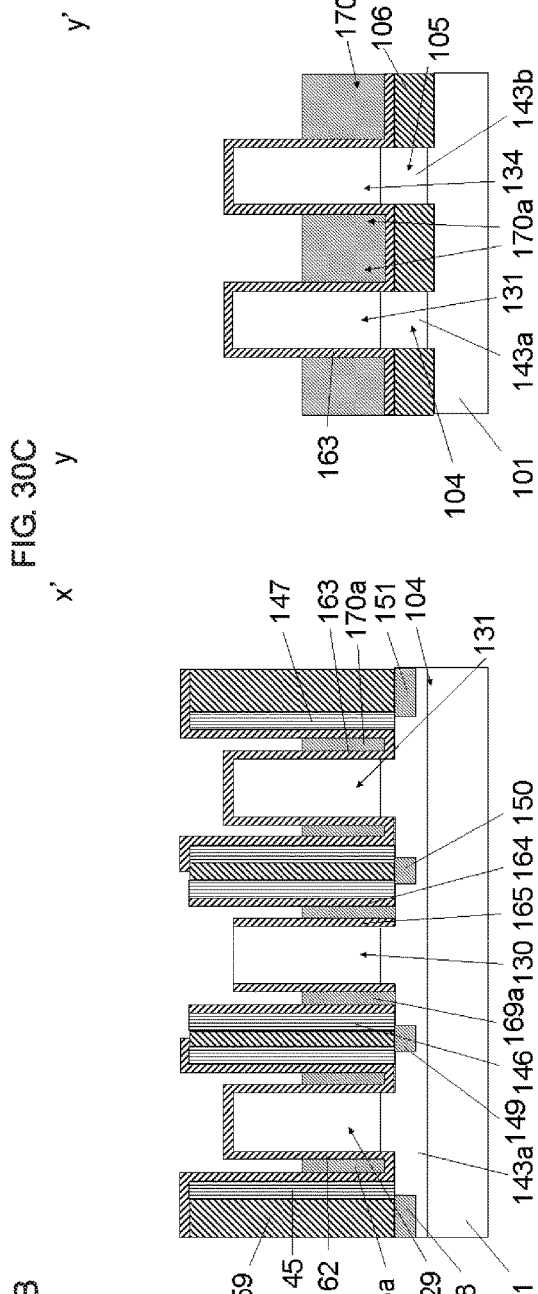

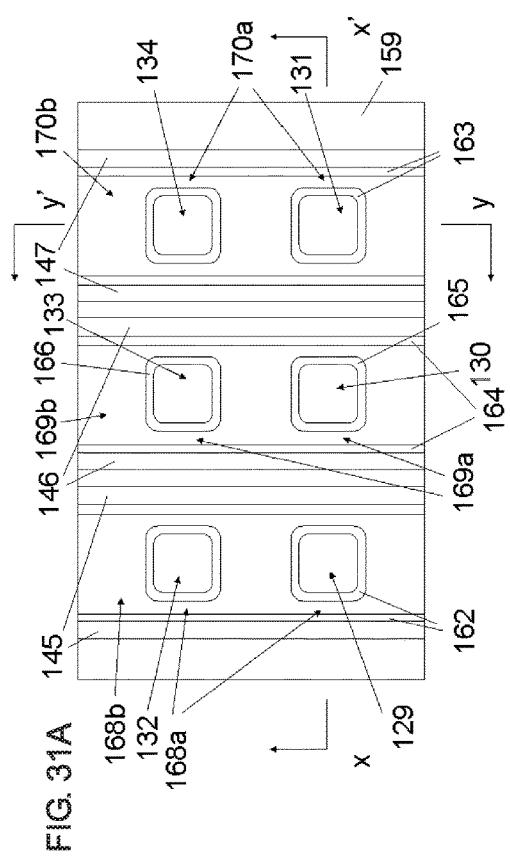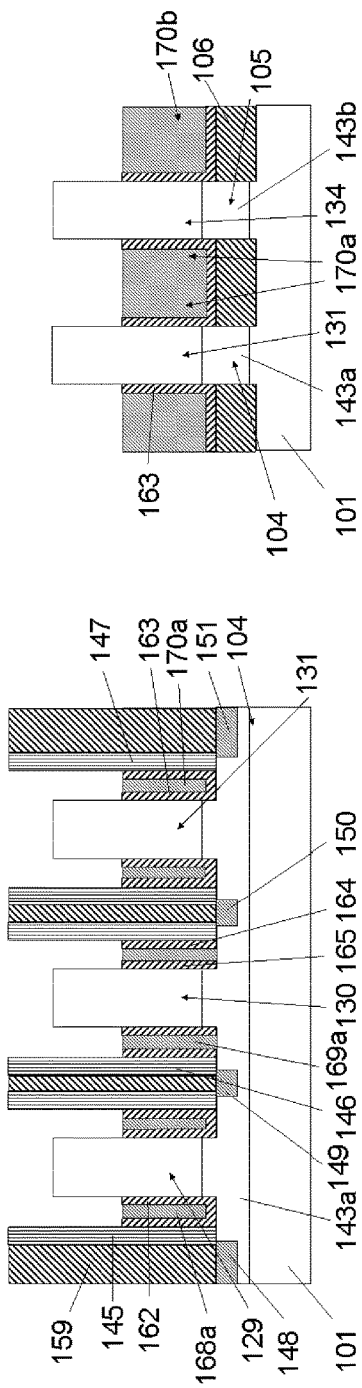

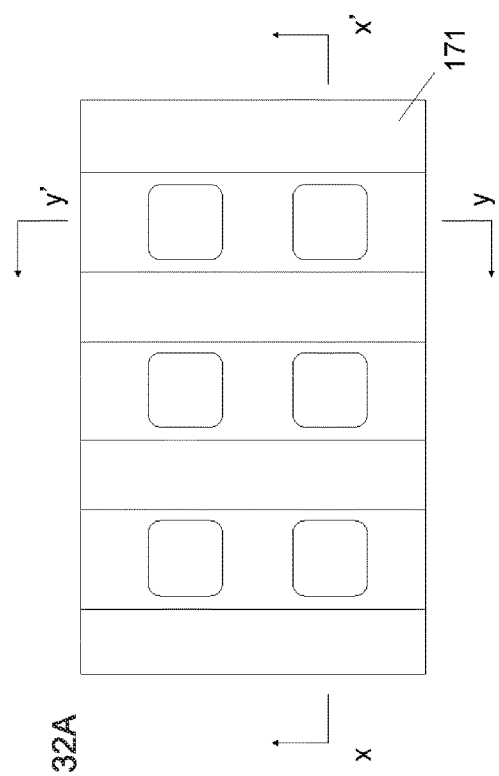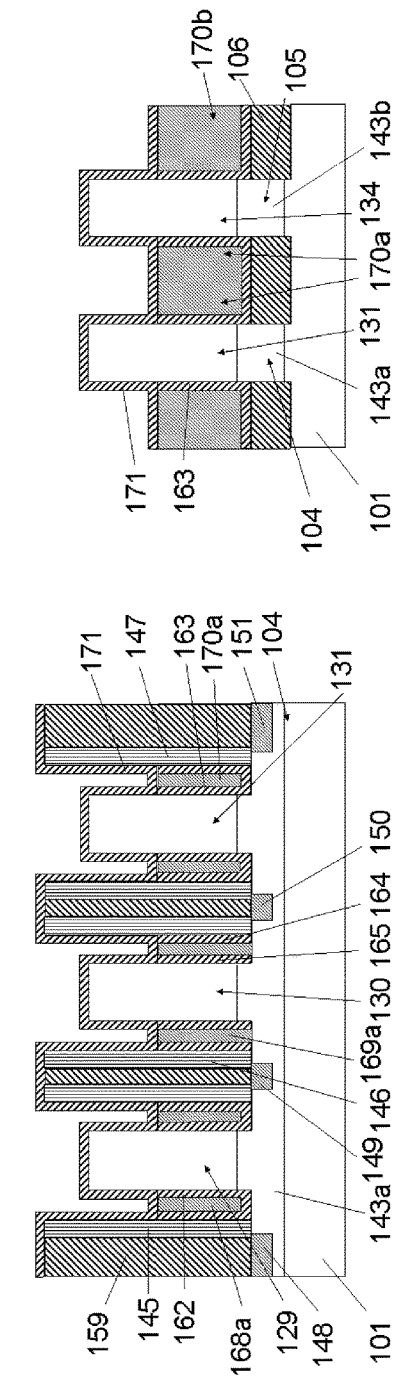
FIG. 32A
FIG. 32B
FIG. 32C

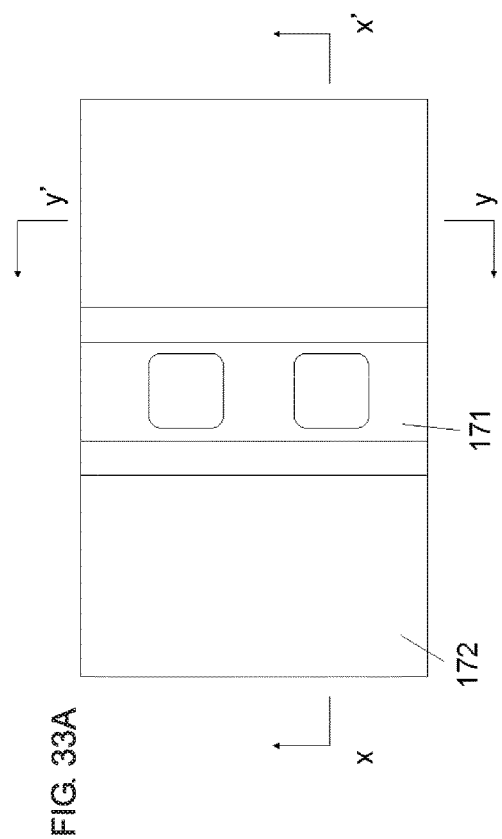
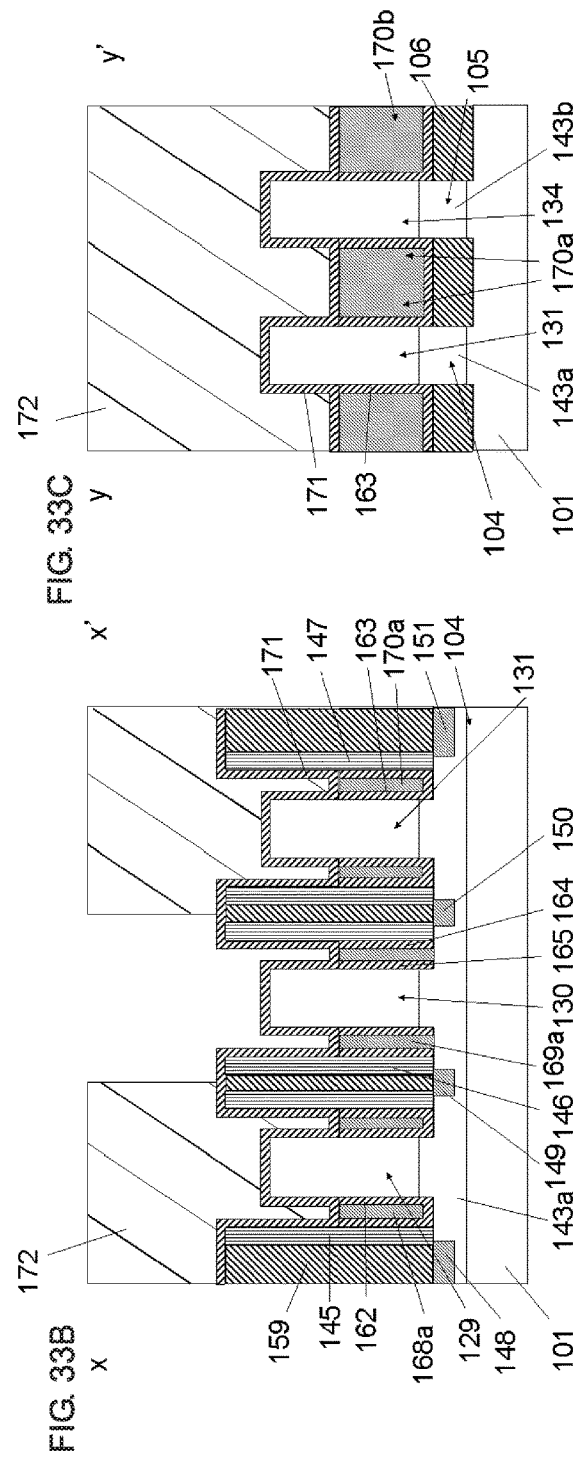

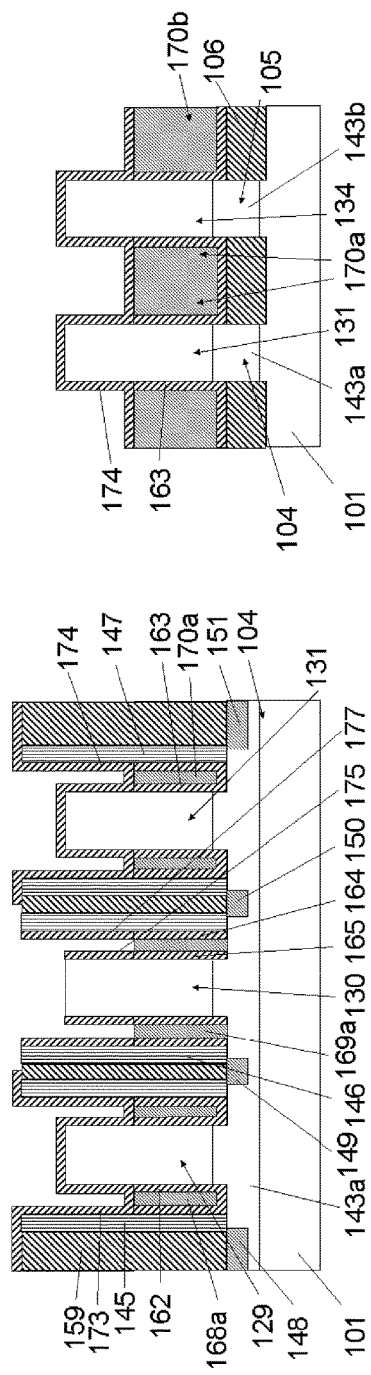

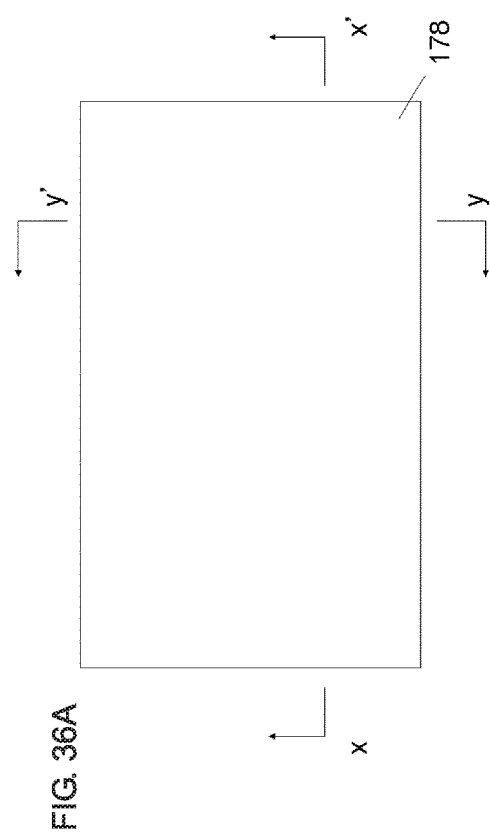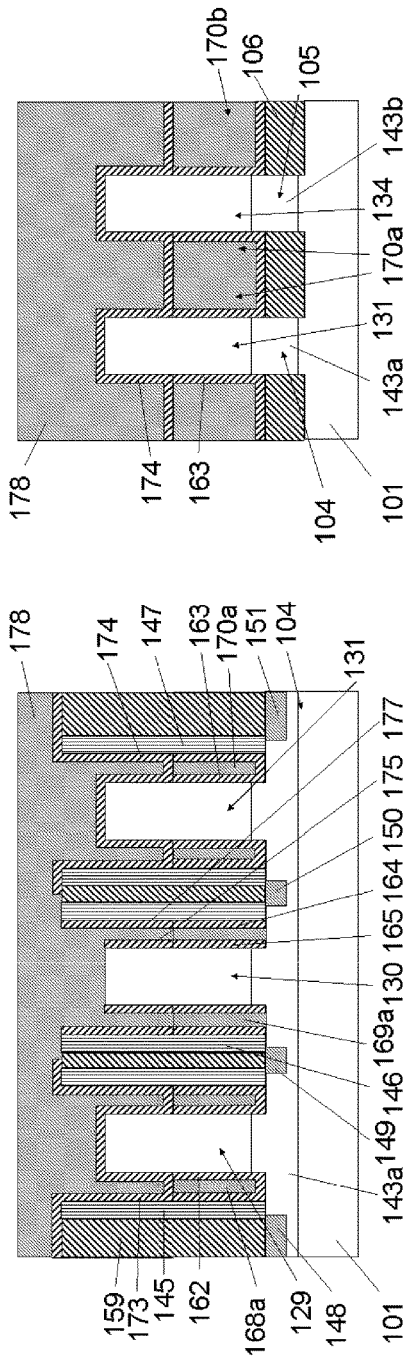
FIG. 36A
FIG. 36B
FIG. 36C

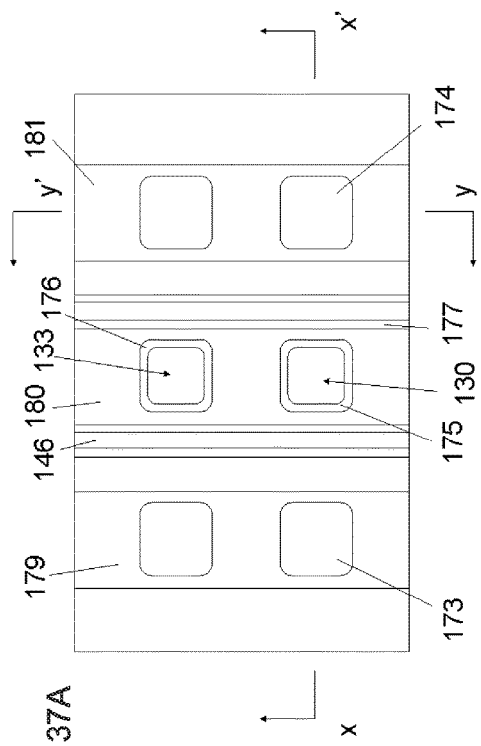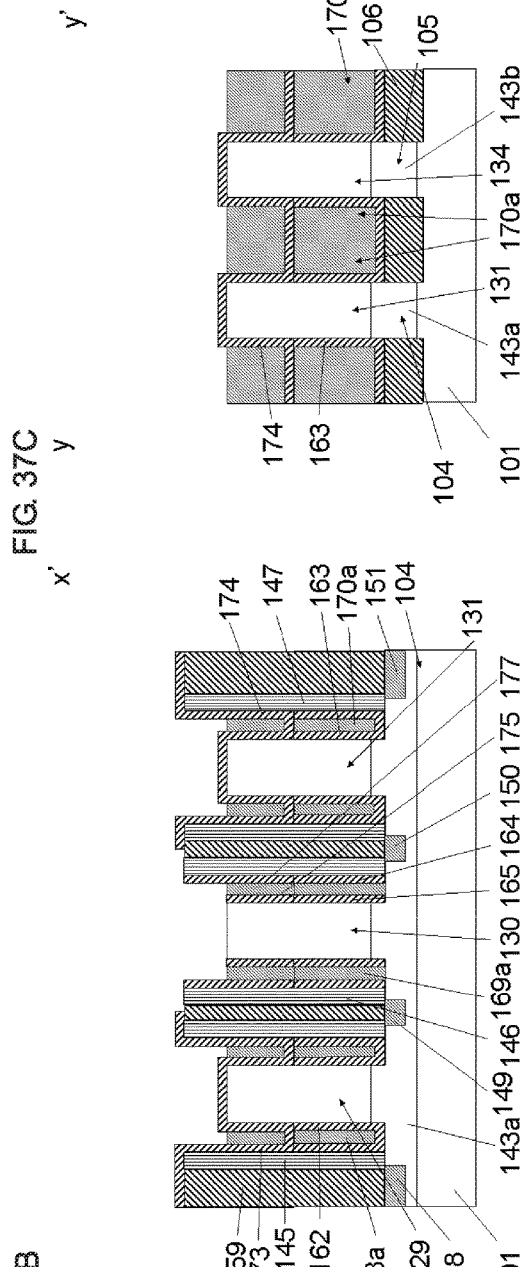
FIG. 37A
FIG. 37B
FIG. 37C

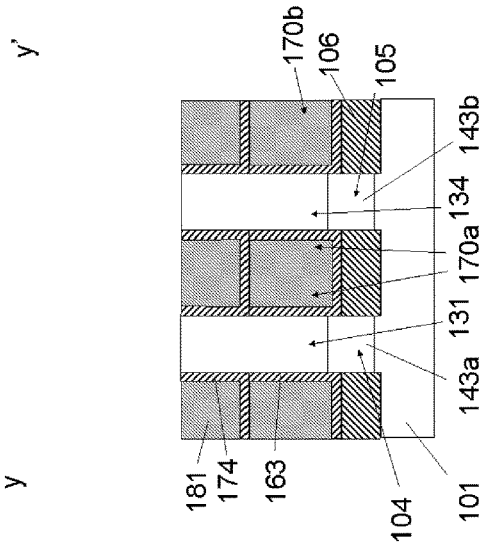

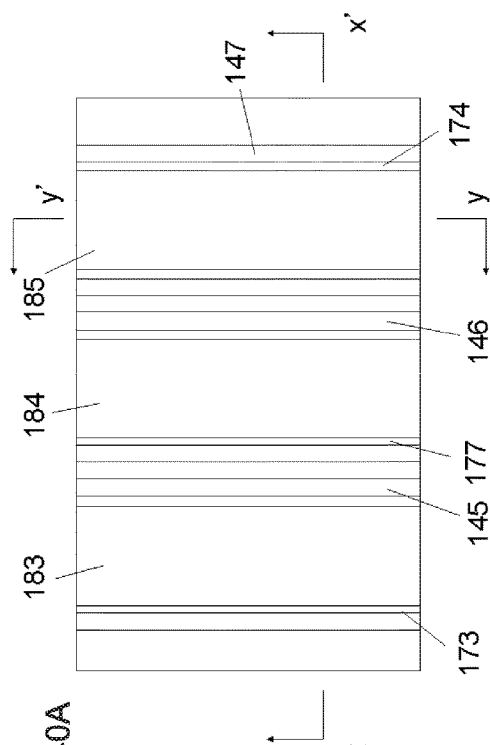
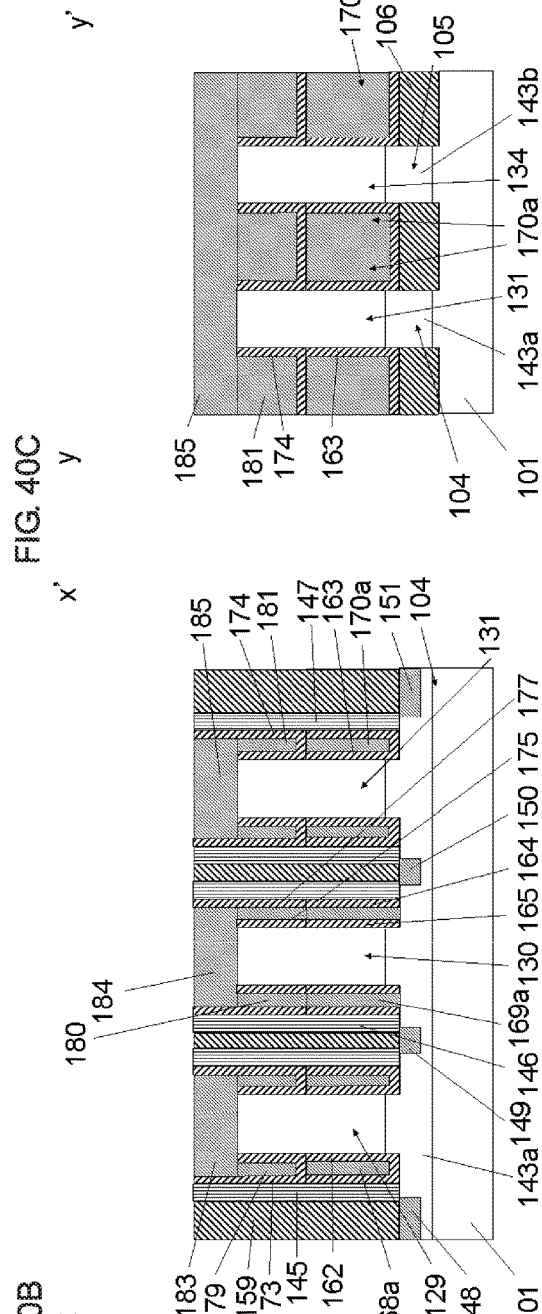

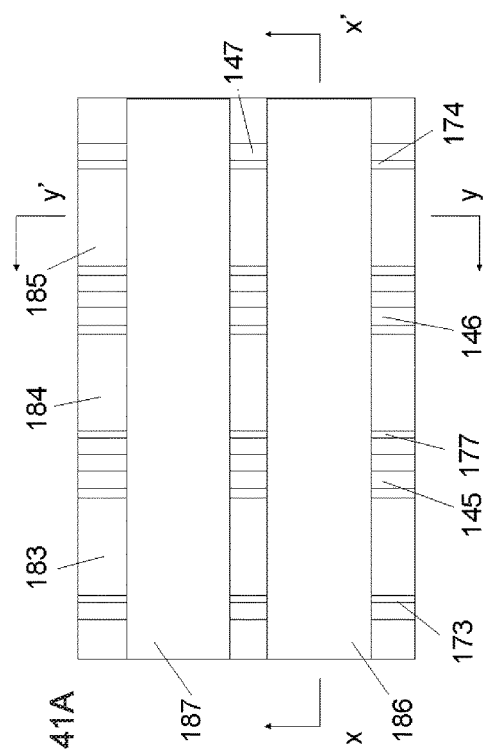
FIG. 41A
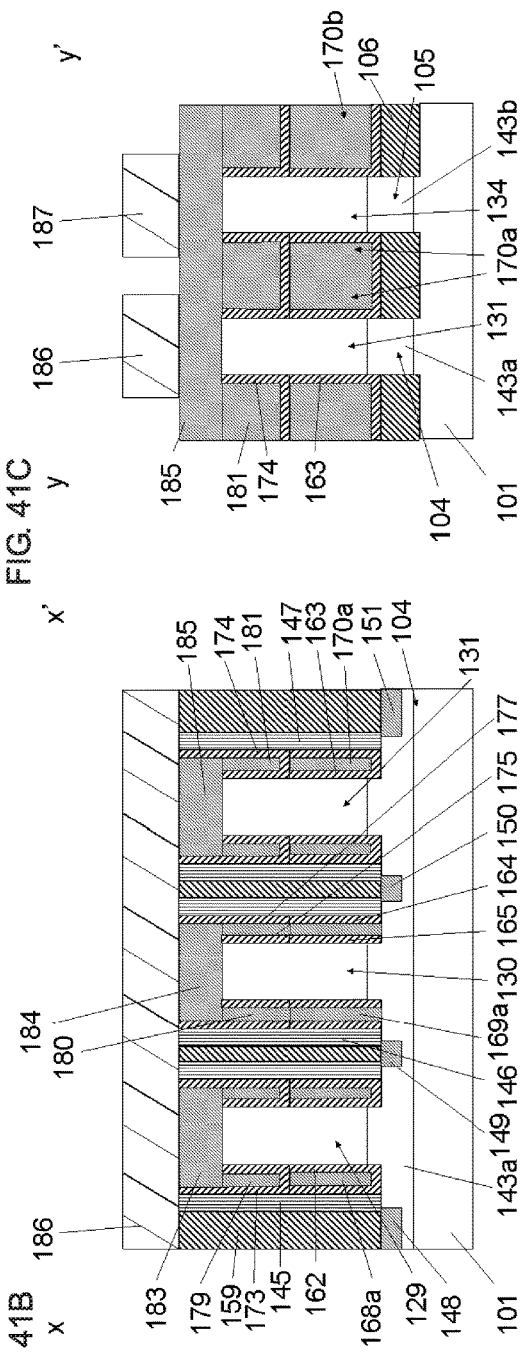
FIG. 41C
FIG. 41B

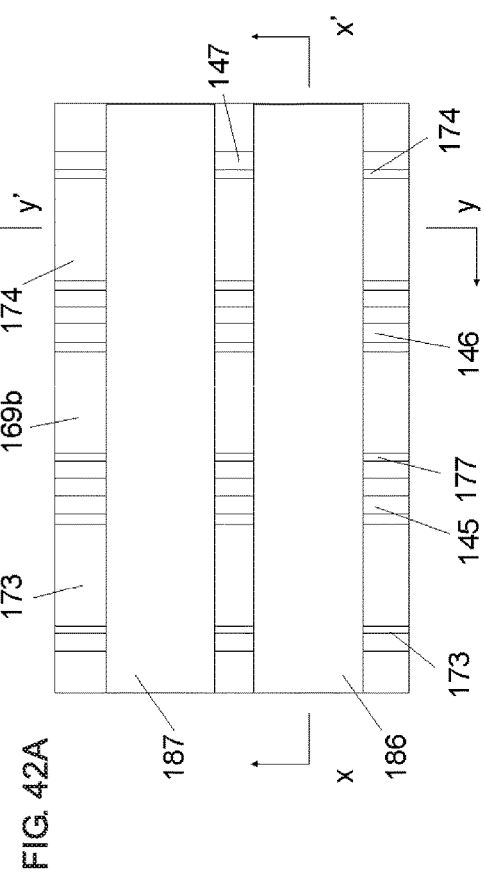
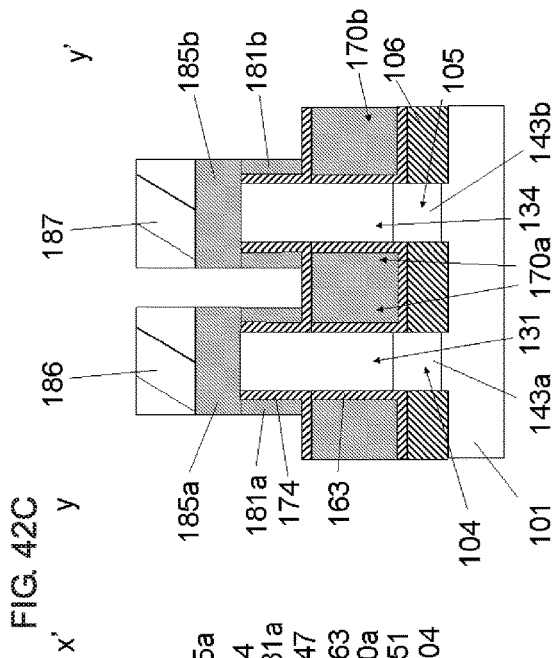
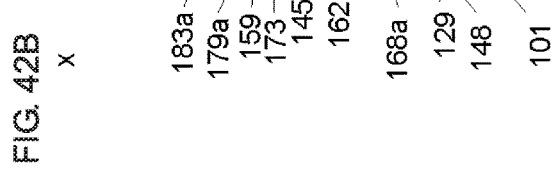

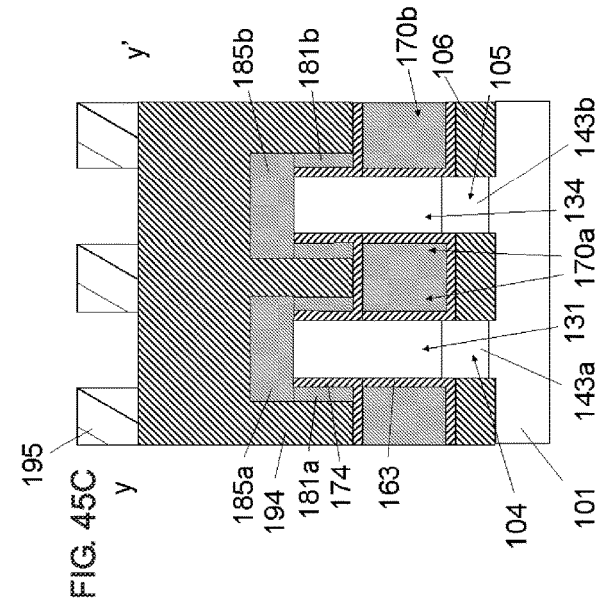
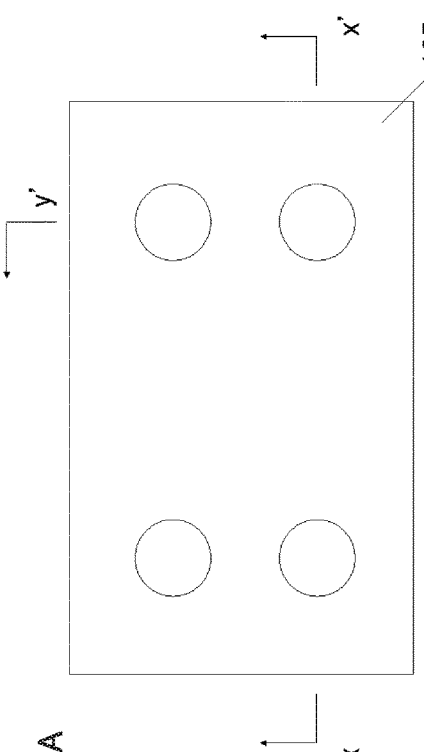
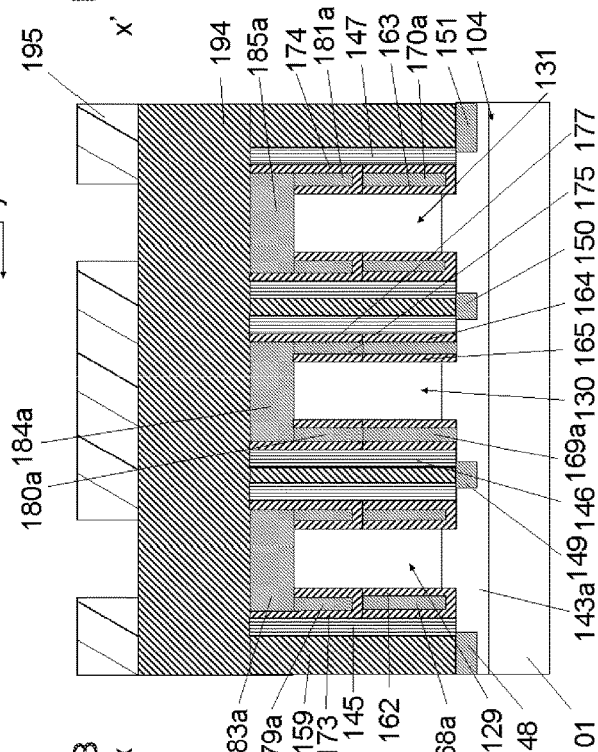

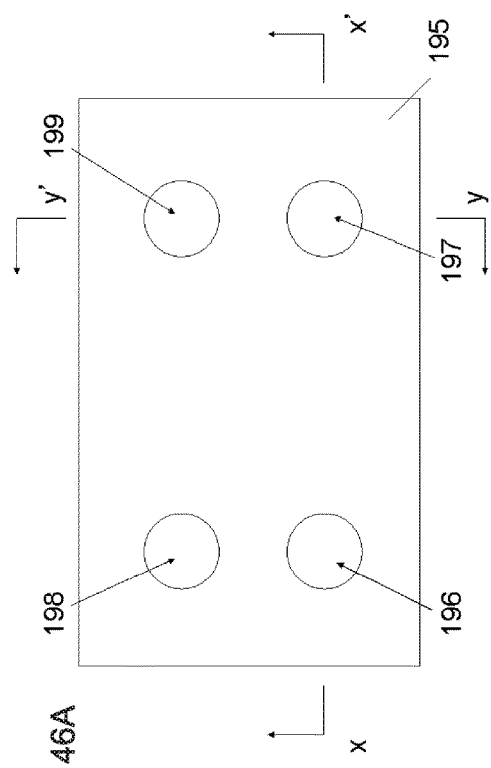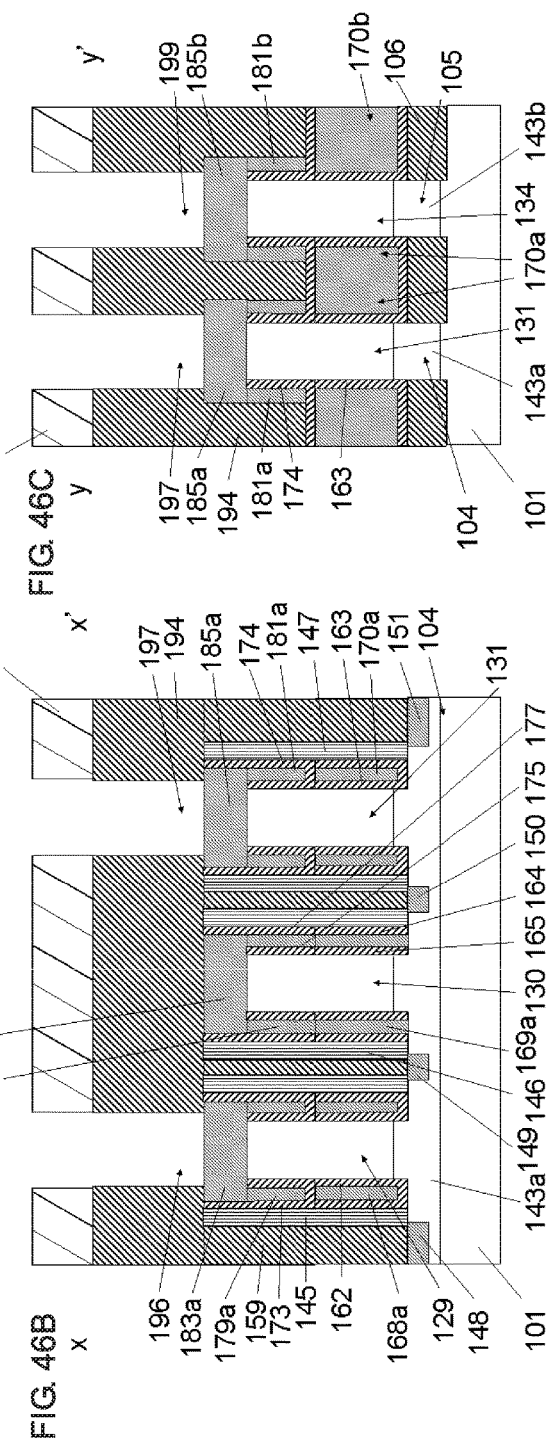
FIG. 46A
FIG. 46B
FIG. 46C

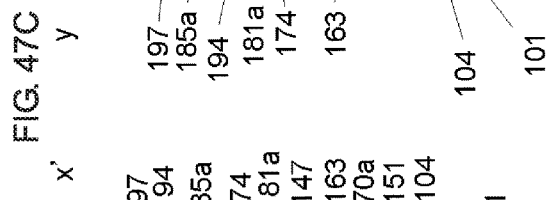
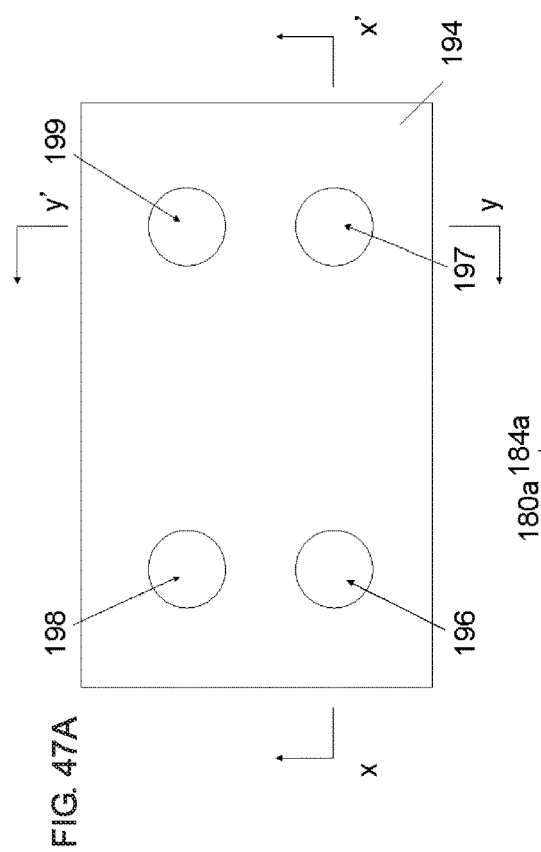
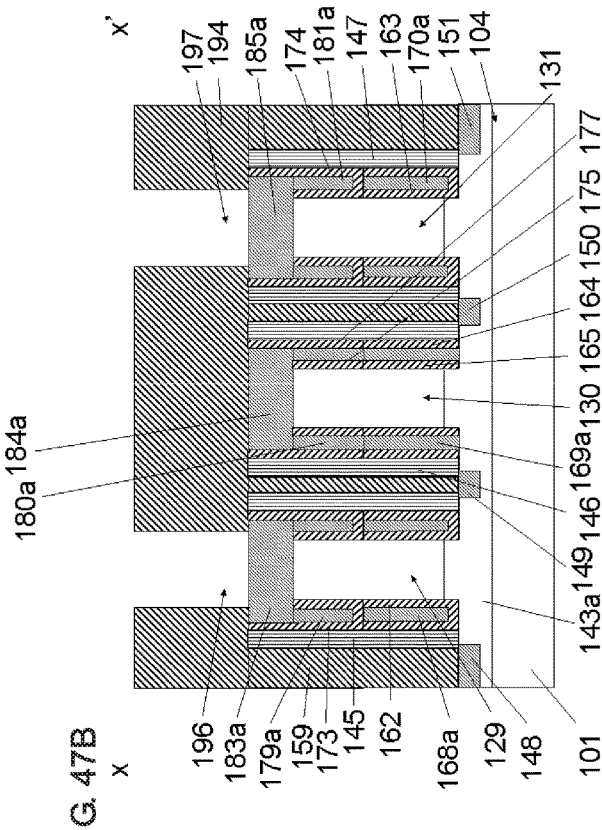

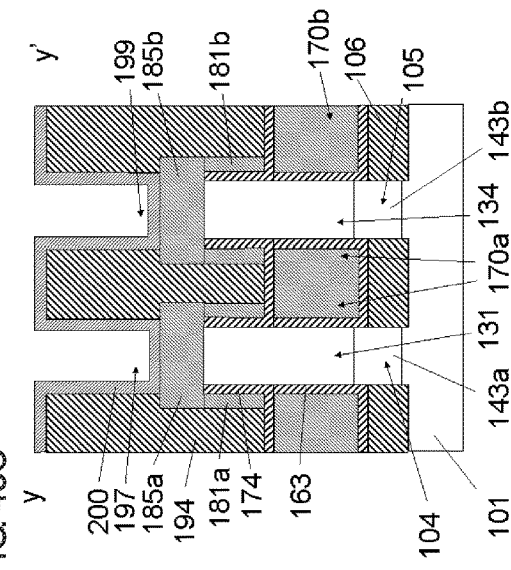
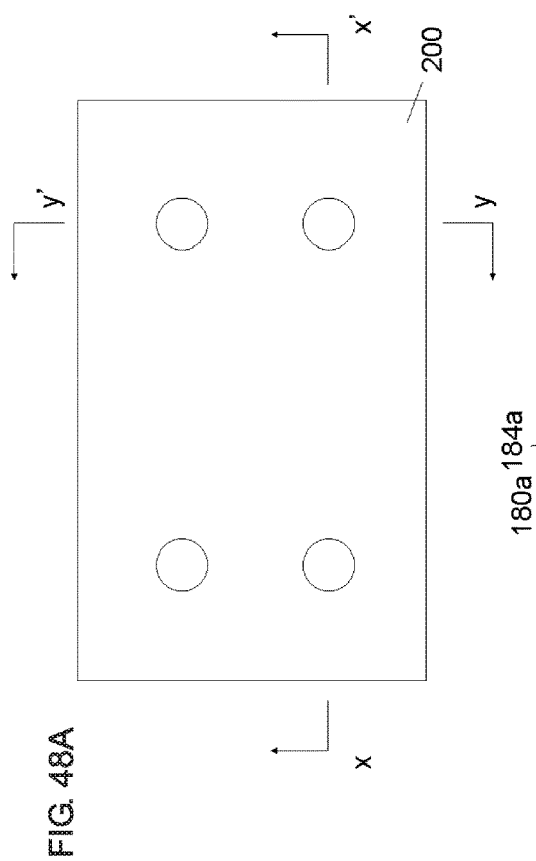
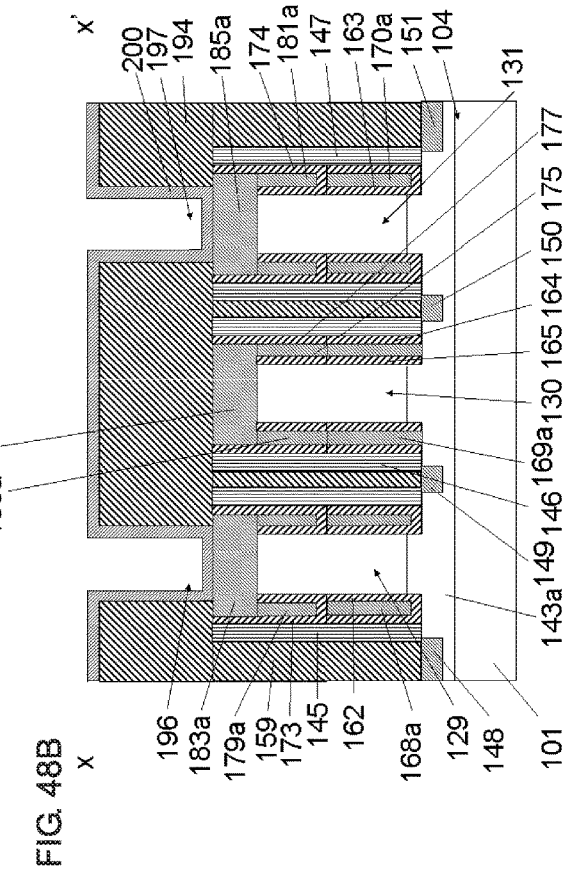

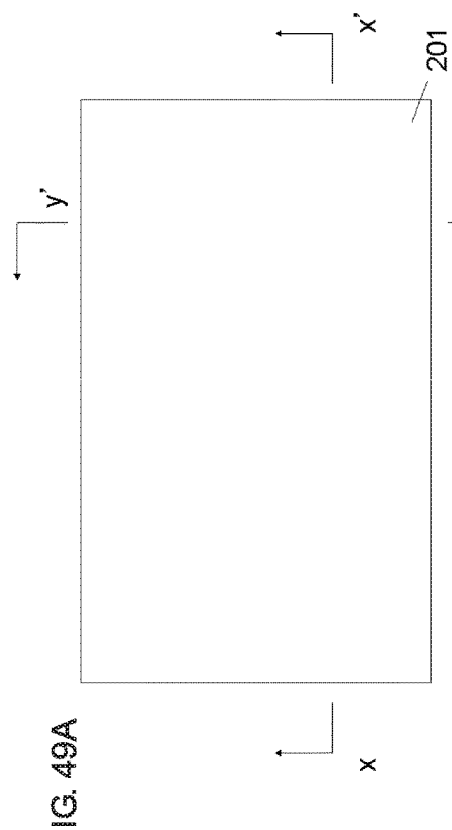
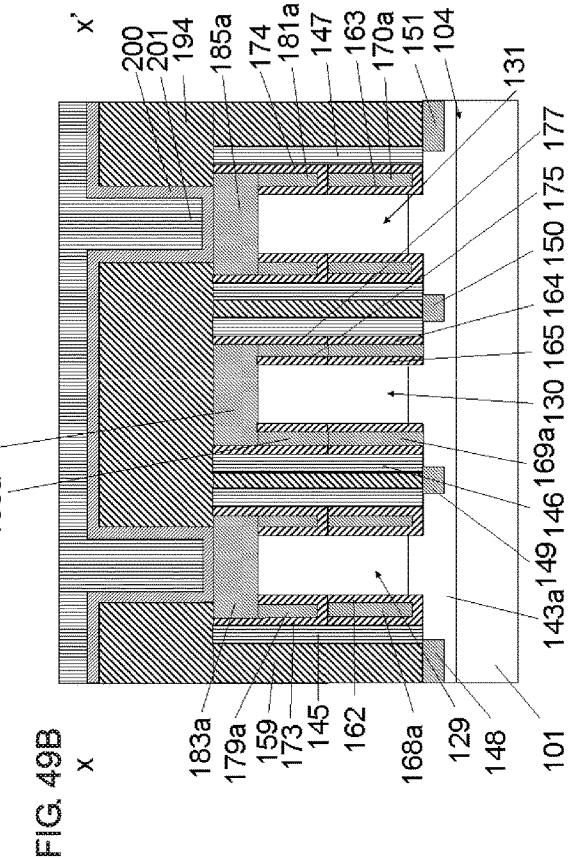
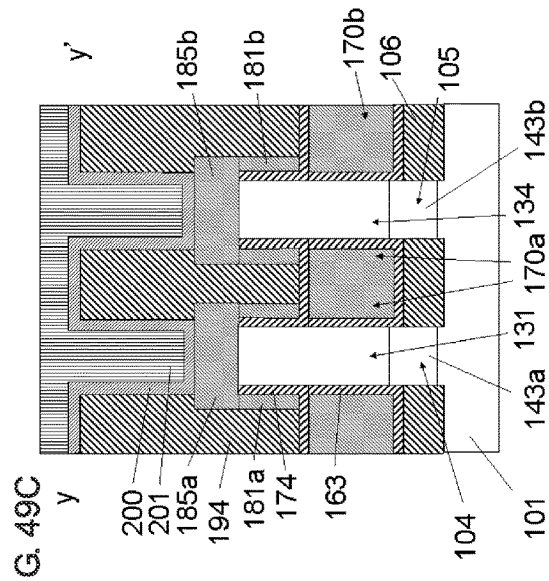
FIG. 49A
FIG. 49B
FIG. 49C

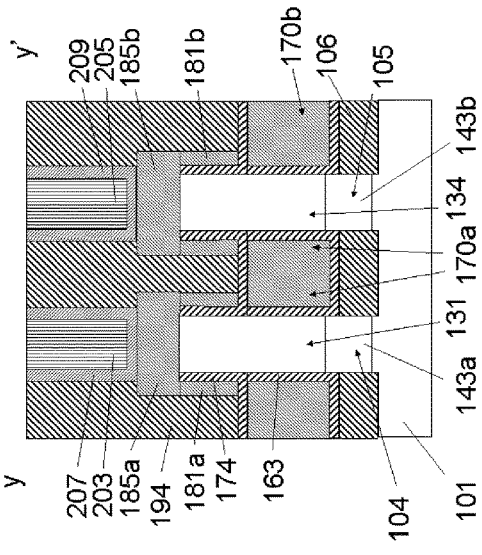
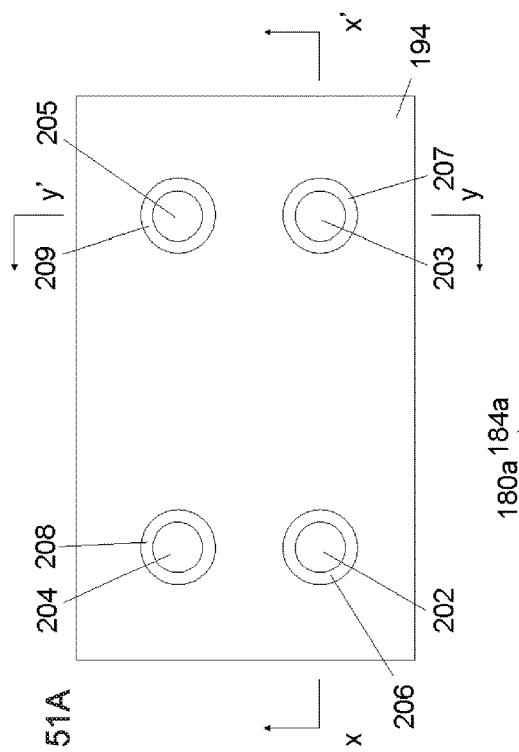
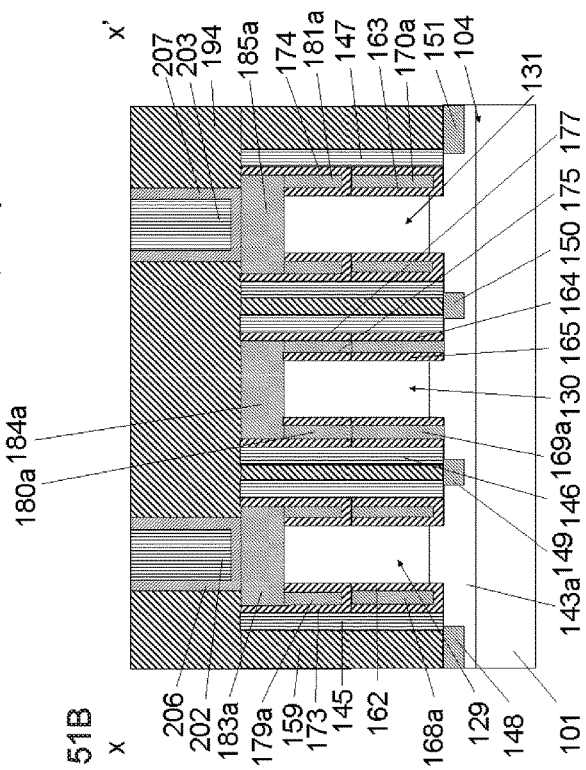

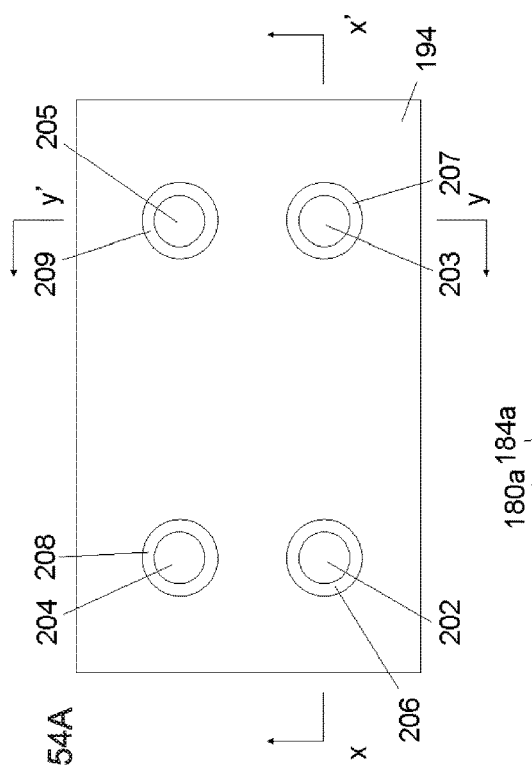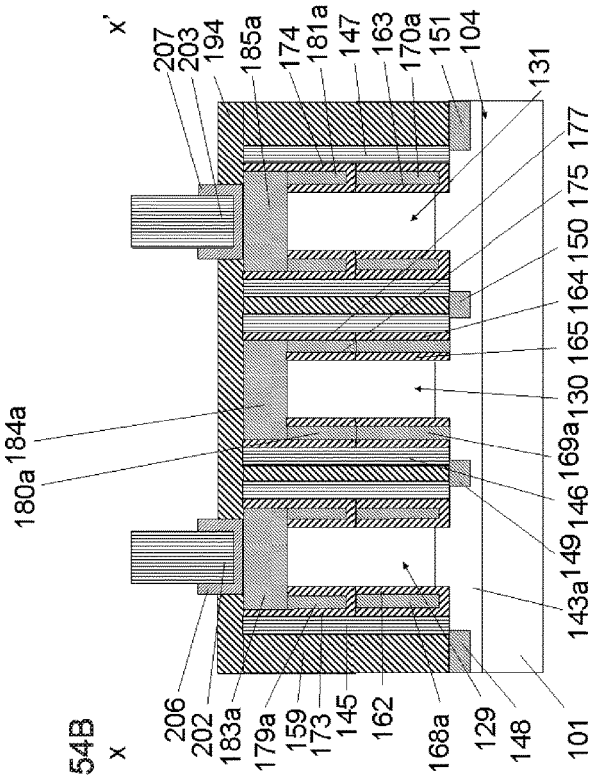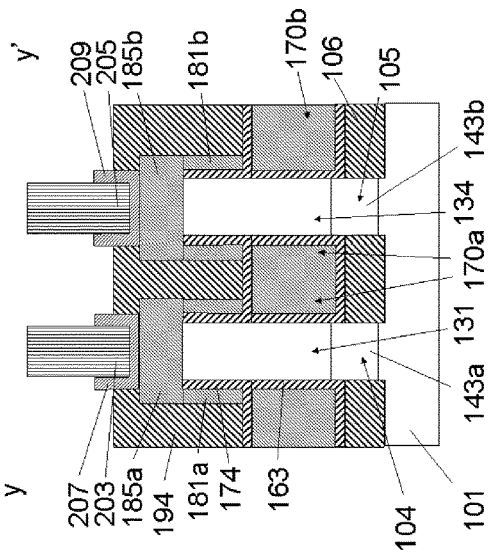

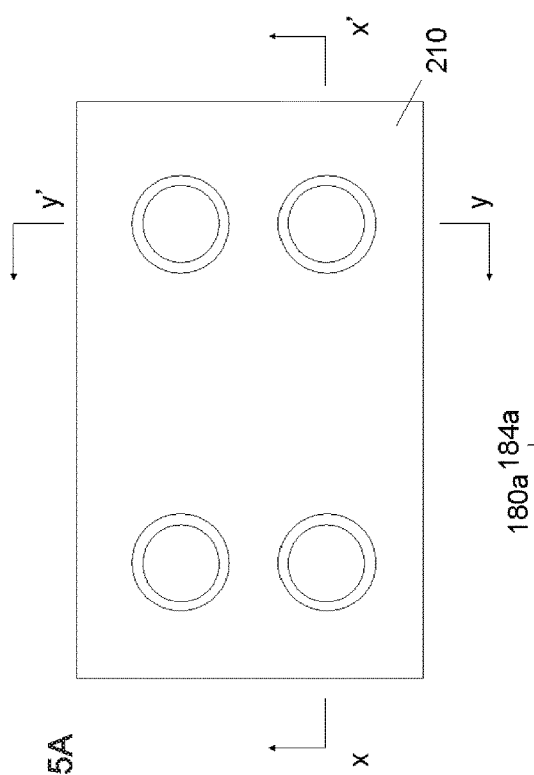
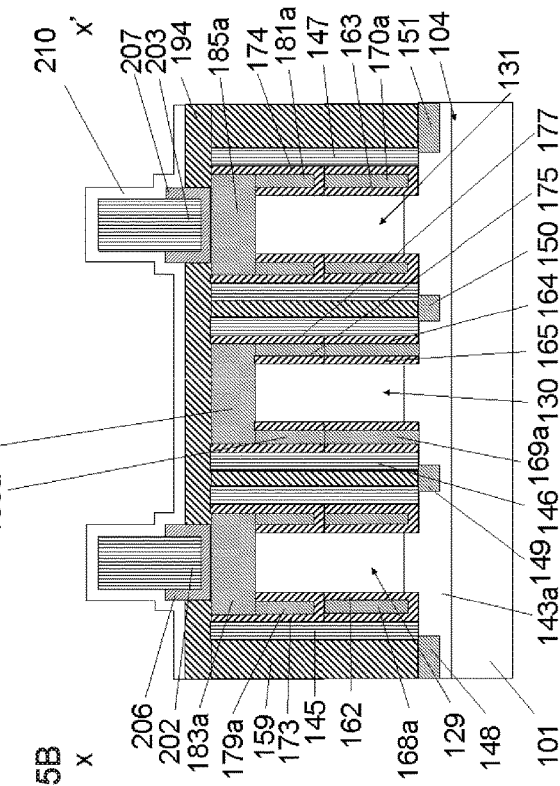
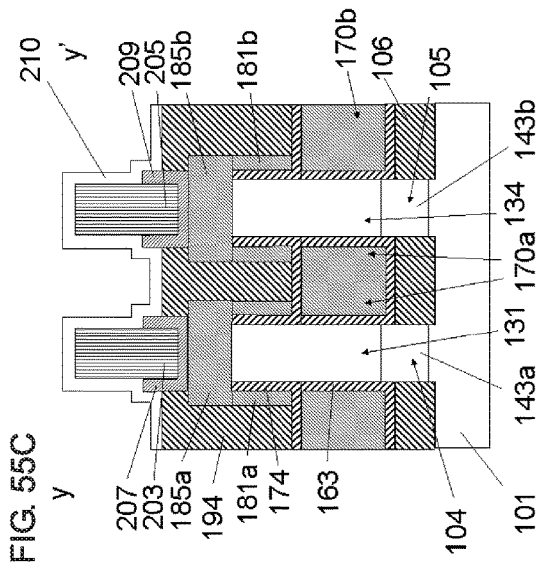

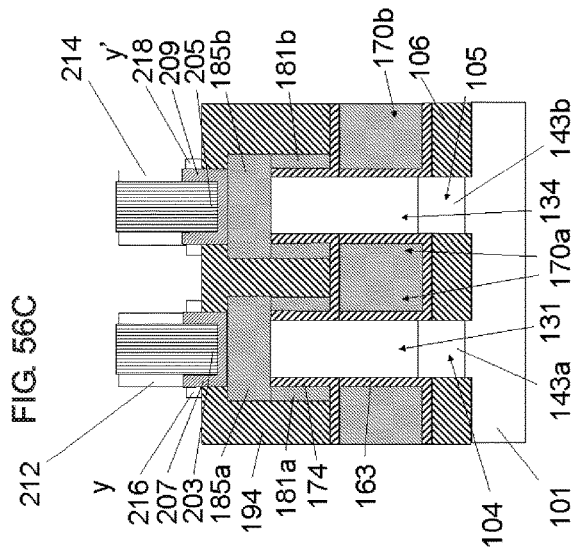
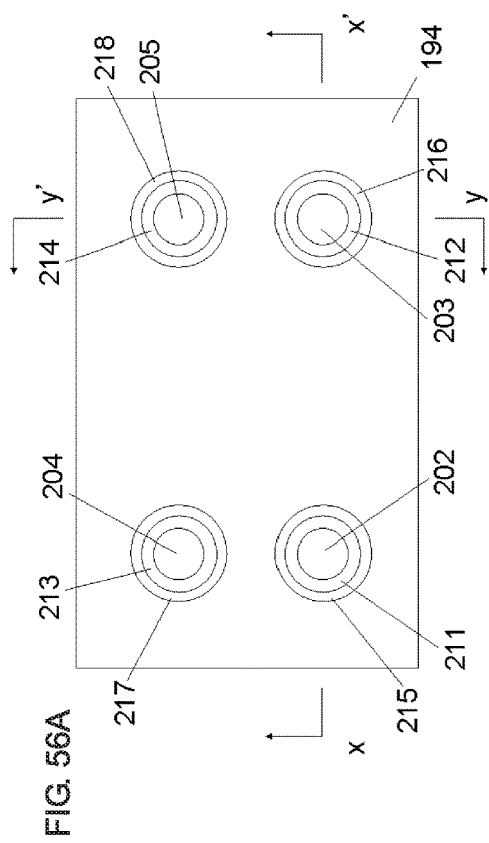
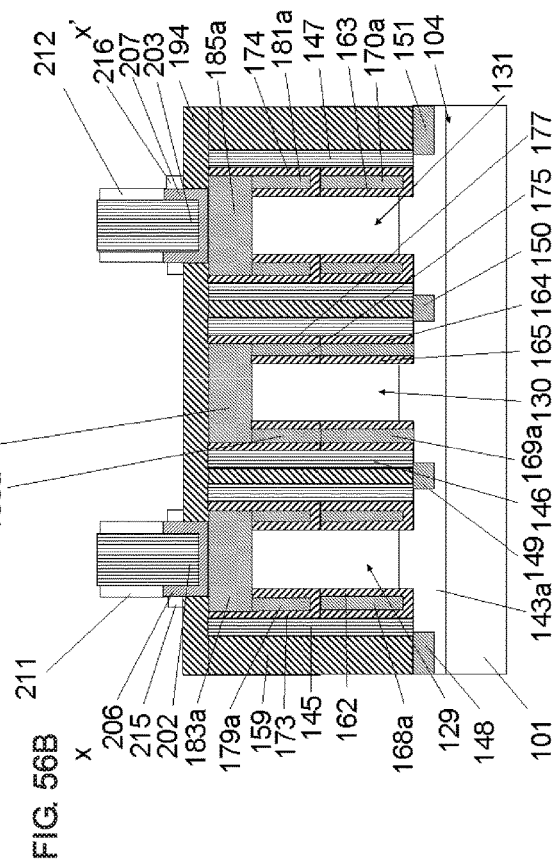

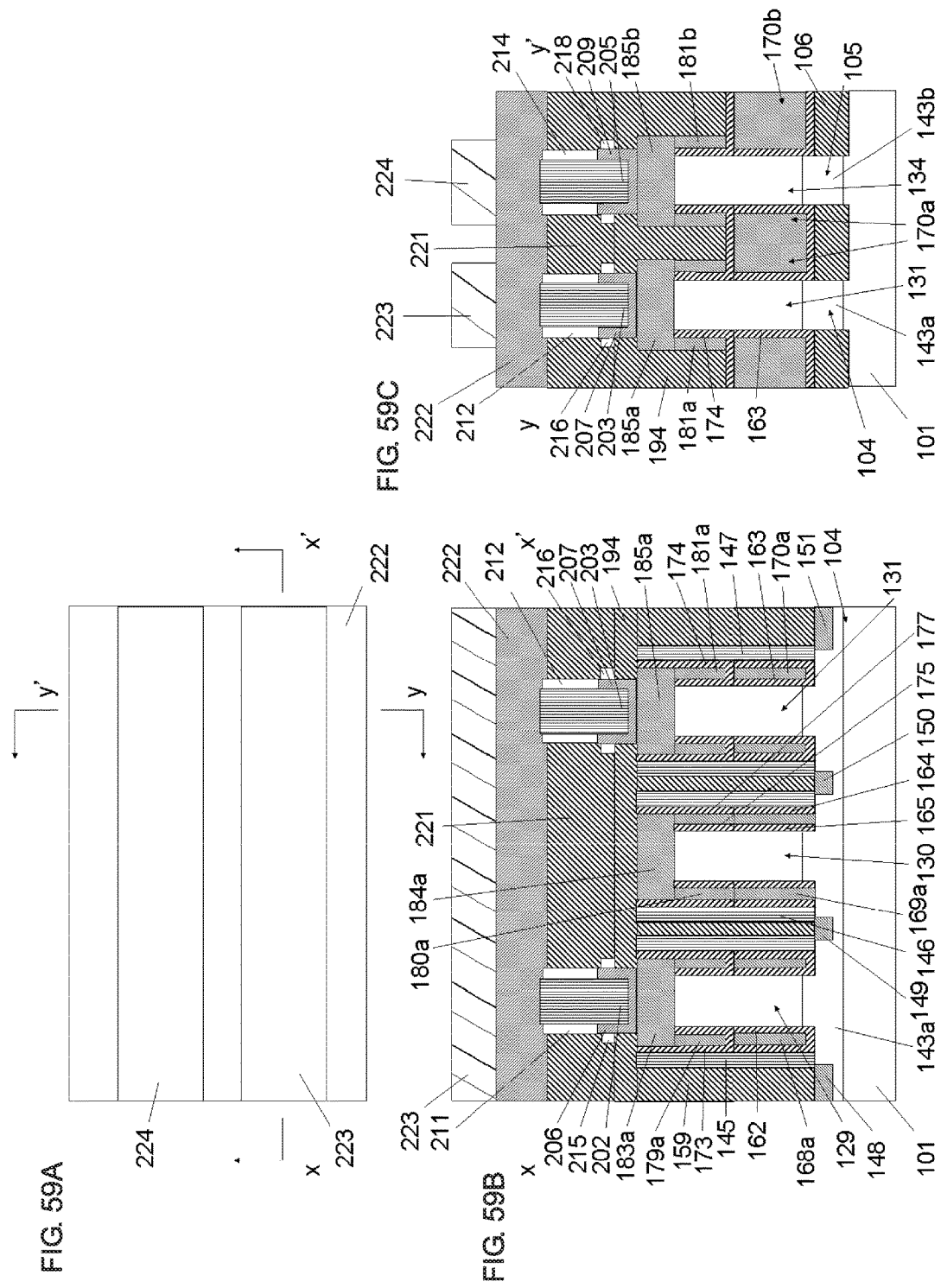

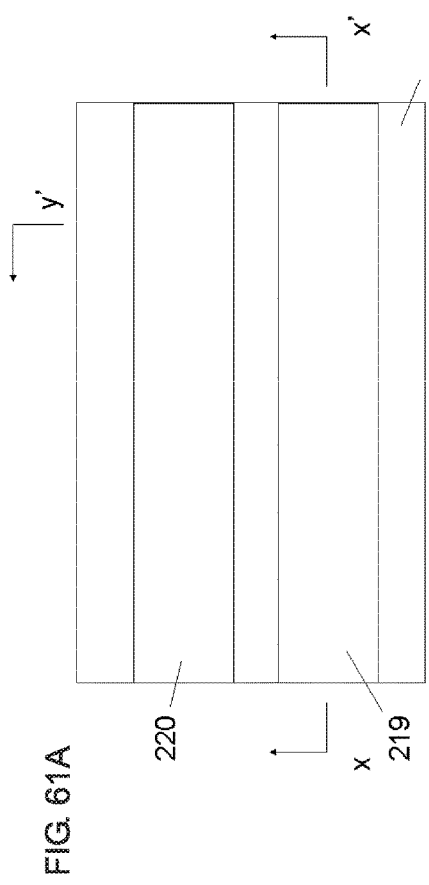
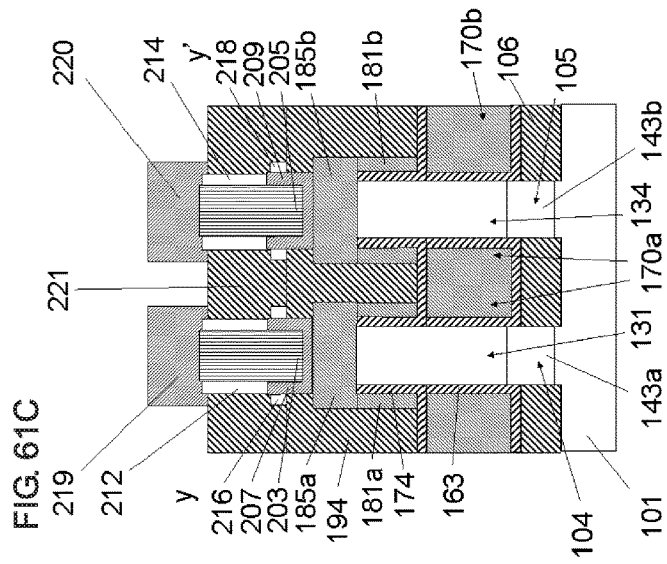
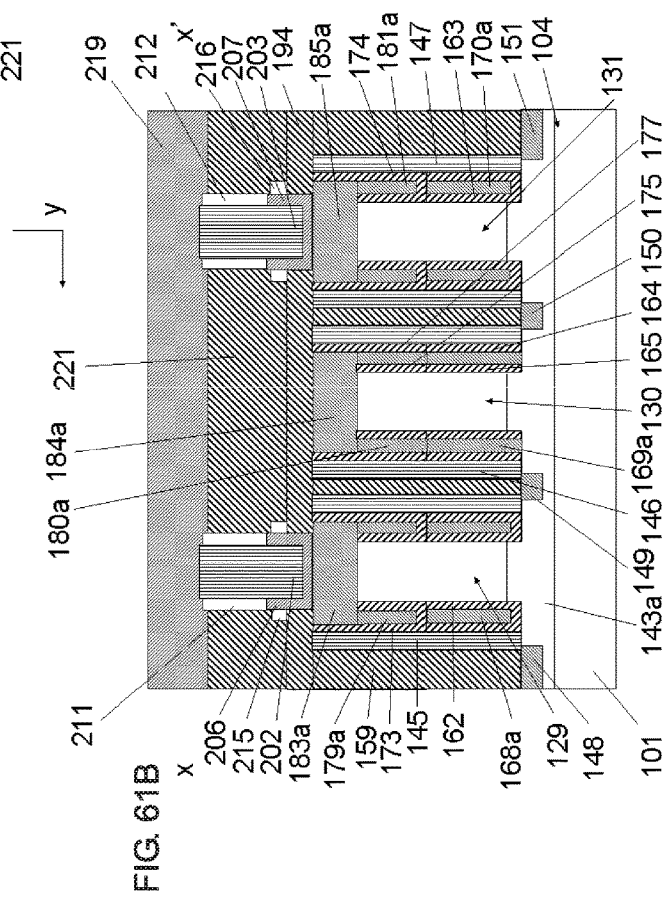

SEMICONDUCTOR DEVICE AND METHOD FOR PRODUCING A SEMICONDUCTOR DEVICE

CROSS REFERENCE TO RELATED APPLICATIONS

This application is a continuation of copending patent application Ser. No. 14/937,429, filed Nov. 10, 2015, which was a continuation of international patent application PCT/JP2013/077002, filed Oct. 3, 2013; the entire contents of the prior applications are incorporated herein by reference.

BACKGROUND OF THE INVENTION

Field of the Invention

The present invention relates to a semiconductor device and a method for producing a semiconductor device.

Description of the Related Art

In recent years, phase-change memories have been developed (for example, refer to Japanese Unexamined Patent Application Publication No. 2012-204404 and its counterpart U.S. Pat. No. 9,025,369 B2). Such a phase-change memory records changes in the resistances of information memory elements in memory cells to thereby store information.

The phase-change memory uses the following mechanism: turning on a cell transistor causes a current to pass between a bit line and a source line; this causes a high-resistance-element heater to generate heat; this melts chalcogenide glass (GST: $Ge_2Sb_2Te_5$) in contact with the heater to thereby cause a state transition. Chalcogenide glass that is melted at a high temperature (with a large current) and rapidly cooled (by stopping the current) is brought to an amorphous state (Reset operation). On the other hand, chalcogenide glass that is melted at a relatively-low high temperature (with a small current) and slowly cooled (with a gradual decrease in the current) is brought to crystallization (Set operation). Thus, at the time of reading information, the binary information ("0" or "1") is determined on the basis of whether a large current passes between the bit line and the source line (a low resistance, that is, the crystalline state) or a small current passes (a high resistance, that is, the amorphous state) (for example, refer to Japanese Unexamined Patent Application Publication No. 2012-204404 and U.S. Pat. No. 9,025,369 B2).

In this case, for example, a very large reset current of 200 μA passes. In order to pass such a large reset current through cell transistors, the memory cells need to have a considerably large size. In order to pass such a large current, selection elements such as bipolar transistors and diodes can be used (for example, refer to Japanese Unexamined Patent Application Publication No. 2012-204404 and U.S. Pat. No. 9,025,369 B2).

A diode is a two-terminal element. Thus, when one source line is selected for the purpose of selecting a memory cell, the current of all the memory cells connected to the one source line passes through the one source line. This results in a large IR drop, which is a voltage drop equal to the product of IR (current and resistance), in the source line.

On the other hand, a bipolar transistor is a three-terminal element. However, a current passes through the gate, which makes it difficult to connect a large number of transistors to the word line.

By reducing the area of the cross sections (in the current flow direction) of a GST film and a heater element, the reset current and the read current can be decreased. In an existing example, a heater element is formed on a side wall of the gate of a planar transistor and a GST film is formed on the gate, to thereby reduce the area of the cross sections (in the current flow direction) of the GST film and the heater element. This method requires cell strings with which a plurality of cells constituted by planar transistors are connected in series (for example, refer to Japanese Unexamined Patent Application Publication No. 2012-204404 and U.S. Pat. No. 9,025,369 B2).

A Surrounding Gate Transistor (hereafter, referred to as an "SGT") has been proposed that has a structure in which a source, a gate, and a drain are arranged in a direction perpendicular to a substrate and a gate electrode surrounds a pillar-shaped semiconductor layer. SGTs allow a larger current per unit gate width to pass than double-gate transistors (for example, refer to Japanese Unexamined Patent Application Publication No. 2004-356314 and its counterpart U.S. Publication US 2004/0262681 A1). In addition, SGTs have a structure in which the gate electrode surrounds the pillar-shaped semiconductor layer. Thus, the gate width per unit area can be increased, so that an even larger current can be passed.

In a phase-change memory, a large reset current is used and hence the resistance of the source line needs to be decreased.

In existing MOS transistors, in order to successfully perform a metal gate process and a high-temperature process, a metal gate-last process of forming a metal gate after a high-temperature process is used (for example, refer to IEDM2007 K. Mistry et. al, pp 247-250). In this process, a gate is formed of polysilicon; an interlayer insulating film is subsequently deposited; chemical mechanical polishing is then performed to expose the polysilicon gate; the polysilicon gate is etched; and metal is subsequently deposited. Thus, also in the production of an SGT, in order to successfully perform a metal gate process and a high-temperature process, a metal gate-last process of forming a metal gate after a high-temperature process needs to be used.

In the metal gate-last process, after a polysilicon gate is formed, a diffusion layer is formed by ion implantation. However, in an SGT, the upper portion of the pillar-shaped silicon layer is covered with a polysilicon gate. Accordingly, it is necessary to find a way to form the diffusion layer.

Silicon has a density of about $5 \times 10^{22}$ atoms/cm$^3$. Accordingly, for narrow silicon pillars, it is difficult to make impurities be present within the silicon pillars.

In existing SGTs, it has been proposed that, while the channel concentration is set to a low impurity concentration of $10^{17}$ cm$^{-3}$ or less, the work function of the gate material is changed to adjust the threshold voltage (for example, refer to Japanese Unexamined Patent Application Publication No. 2004-356314 and U.S. Publication US 2004/0262681 A1).

A planar MOS transistor has been disclosed in which a sidewall on an LDD region is formed of a polycrystalline silicon of the same conductivity type as that of the lightly doped layer and the surface carriers of the LDD region are induced by the work-function difference between the sidewall and the LDD region, so that the impedance of the LDD region can be reduced, compared with oxide film sidewall LDD MOS transistors (for example, refer to Japanese Unexamined Patent Application Publication No. 11-297984). This publication states that the polycrystalline silicon sidewall is electrically insulated from the gate electrode. This publication also shows that, in a drawing, the polycrystalline silicon sidewall and the source-drain are insulated from each other with an interlayer insulating film.

SUMMARY OF THE INVENTION

It is an object of the present invention is to provide a semiconductor device that allows reduction in the area of cross sections (in the current flow direction) of a variable-resistance film and a lower electrode, that allows a large current to pass through a selected transistor, and that includes a variable-resistance memory element, and a method for producing the semiconductor device.

With the above and other objects in view there is provided, in accordance with a first embodiment of the invention, a semiconductor device which includes:

a first pillar-shaped semiconductor layer, a first gate insulating film formed around the first pillar-shaped semiconductor layer, a gate electrode formed of metal and formed around the first gate insulating film, a gate line formed of metal and connected to the gate electrode, a second gate insulating film formed around an upper portion of the first pillar-shaped semiconductor layer, a first contact formed of a first metal material and formed around the second gate insulating film, a second contact formed of a second metal material and connecting an upper portion of the first contact and an upper portion of the first pillar-shaped semiconductor layer, a second diffusion layer formed in a lower portion of the first pillar-shaped semiconductor layer, a pillar-shaped insulator layer formed on the second contact, a variable-resistance film formed around an upper portion of the pillar-shaped insulator layer, and a lower electrode formed around a lower portion of the pillar-shaped insulator layer and connected to the variable-resistance film.

The pillar-shaped insulator layer is preferably a nitride film and the lower electrode is preferably formed between the pillar-shaped insulator layer and the second contact.

The first metal material forming the first contact preferably has a work function of 4.0 to 4.2 eV.

The first metal material forming the first contact preferably has a work function of 5.0 to 5.2 eV.

The semiconductor device preferably includes a fin-shaped semiconductor layer formed on a semiconductor substrate so as to extend in one direction, a first insulating film formed around the fin-shaped semiconductor layer, the first pillar-shaped semiconductor layer formed on the fin-shaped semiconductor layer, and the first gate insulating film formed around and below the gate electrode and the gate line, wherein the gate line extends in a direction orthogonal to the fin-shaped semiconductor layer, and the second diffusion layer is formed in the fin-shaped semiconductor layer.

The second diffusion layer formed in the fin-shaped semiconductor layer is preferably further formed in the semiconductor substrate.

The semiconductor device preferably further includes a contact line extending parallel with the gate line and connected to the second diffusion layer.

The semiconductor device preferably includes the fin-shaped semiconductor layer formed on the semiconductor substrate, the first insulating film formed around the fin-shaped semiconductor layer, a second pillar-shaped semiconductor layer formed on the fin-shaped semiconductor layer, a contact electrode formed of metal and formed around the second pillar-shaped semiconductor layer, the contact line formed of metal, extending in a direction orthogonal to the fin-shaped semiconductor layer, and connected to the contact electrode, and the second diffusion layer formed in the fin-shaped semiconductor layer and in a lower portion of the second pillar-shaped semiconductor layer, wherein the contact electrode is connected to the second diffusion layer.

Preferably, an outer linewidth of the gate electrode is equal to a linewidth of the gate line, and a linewidth of the first pillar-shaped semiconductor layer in the direction orthogonal to the fin-shaped semiconductor layer is equal to a linewidth of the fin-shaped semiconductor layer in the direction orthogonal to the fin-shaped semiconductor layer.

A portion of the first gate insulating film is preferably formed between the second pillar-shaped semiconductor layer and the contact electrode.

A linewidth of the second pillar-shaped semiconductor layer in the direction orthogonal to the fin-shaped semiconductor layer is preferably equal to a linewidth of the fin-shaped semiconductor layer in a direction orthogonal to a direction in which the fin-shaped semiconductor layer extends.

A portion of the first gate insulating film is preferably formed around the contact electrode and around the contact line.

An outer linewidth of the contact electrode is preferably equal to a linewidth of the contact line.

The semiconductor device preferably includes the first pillar-shaped semiconductor layer formed on a semiconductor substrate, and the first gate insulating film formed around and below the gate electrode and the gate line, wherein the second diffusion layer is formed in the semiconductor substrate.

The semiconductor device preferably further includes a contact line extending parallel with the gate line and connected to the second diffusion layer.

The semiconductor device preferably further includes a second pillar-shaped semiconductor layer formed on the semiconductor substrate, a contact electrode formed of metal and formed around the second pillar-shaped semiconductor layer, a contact line connected to the contact electrode, and the second diffusion layer formed in a lower portion of the second pillar-shaped semiconductor layer, wherein the contact electrode is connected to the second diffusion layer.

An outer linewidth of the gate electrode is preferably equal to a linewidth of the gate line.

A portion of the first gate insulating film is preferably formed between the second pillar-shaped semiconductor layer and the contact electrode.

A portion of the first gate insulating film is preferably formed around the contact electrode and around the contact line.

An outer linewidth of the contact electrode is preferably equal to a linewidth of the contact line.

With the above and other objects in view there is also provided, in accordance with the invention, a method for producing a semiconductor device. The novel method includes the following steps:

a first step of forming a fin-shaped semiconductor layer on a semiconductor substrate and forming a first insulating film around the fin-shaped semiconductor layer, a second step of, after the first step, forming a first pillar-shaped semiconductor layer, a first dummy gate derived from a first polysilicon, a second pillar-shaped semiconductor layer, and a second dummy gate derived from the first polysilicon, a third step of, after the second step, forming a third dummy gate and a fourth dummy gate on side walls of the first dummy gate, the first pillar-shaped semiconductor layer, the second dummy gate, and the second pillar-shaped semiconductor layer, a fourth step of, after the third step, forming a second diffusion layer in an upper portion of the fin-shaped semiconductor layer, in a lower portion of the first pillar-shaped semiconductor layer, and in a lower portion of the second pillar-shaped semiconductor layer, a fifth step of, after the fourth step, depositing a first interlayer insulating film and exposing upper portions of the first dummy gate, the second dummy gate, the third dummy gate, and the fourth dummy gate, removing the first dummy gate, the second dummy gate, the third dummy gate, and the fourth dummy gate, forming a first gate insulating film around the first pillar-shaped semiconductor layer and around the second pillar-shaped semiconductor layer, removing the first gate insulating film from around a bottom portion of the second pillar-shaped semiconductor layer, depositing a first metal layer and performing etch back to expose an upper portion of the first pillar-shaped semiconductor layer and an upper portion of the second pillar-shaped semiconductor layer, to form a gate electrode and a gate line around the first pillar-shaped semiconductor layer, and to form a contact electrode and a contact line around the second pillar-shaped semiconductor layer, a sixth step of, after the fifth step, depositing a second gate insulating film around the first pillar-shaped semiconductor layer, on the gate electrode and the gate line, around the second pillar-shaped semiconductor layer, and on the contact electrode and the contact line, depositing a second metal layer and performing etch back to expose an upper portion of the first pillar-shaped semiconductor layer and an upper portion of the second pillar-shaped semiconductor layer, removing the second gate insulating film on the first pillar-shaped semiconductor layer, depositing a third metal layer, partially etching the third metal layer and the second metal layer to form a first contact surrounding an upper side wall of the first pillar-shaped semiconductor layer and to form a second contact connecting an upper portion of the first contact and an upper portion of the first pillar-shaped semiconductor layer, and a seventh step of, after the sixth step, depositing a second interlayer insulating film, forming a contact hole, depositing a fourth metal layer and a nitride film, removing the fourth metal layer and the nitride film on the second interlayer insulating film to form, within the contact hole, a pillar-shaped insulator layer and a lower electrode surrounding side and bottom portions of the pillar-shaped insulator layer, subjecting the second interlayer insulating film to etch back to expose an upper portion of the lower electrode surrounding the pillar-shaped insulator layer, removing the exposed upper portion of the lower electrode surrounding the pillar-shaped insulator layer, depositing a variable-resistance film so as to surround the pillar-shaped insulator layer and be connected to the lower electrode, and etching the variable-resistance film so as to have a sidewall shape on an upper portion of the pillar-shaped nitride layer.

Preferably, in the second step, a second insulating film is formed around the fin-shaped semiconductor layer, the first polysilicon is deposited on the second insulating film and planarized, a second resist for forming the gate line, the first pillar-shaped semiconductor layer, the contact line, and the second pillar-shaped semiconductor layer is formed in a direction orthogonal to a direction in which the fin-shaped semiconductor layer extends, the second resist is used as a mask and the first polysilicon, the second insulating film, and the fin-shaped semiconductor layer are etched to form the first pillar-shaped semiconductor layer, the first dummy gate derived from the first polysilicon, the second pillar-shaped semiconductor layer, and the second dummy gate derived from the first polysilicon.

After the first polysilicon is deposited on the second insulating film and planarized, a third insulating film is preferably formed on the first polysilicon.

The method for producing a semiconductor device preferably includes, as the third step, after the second step, forming a fourth insulating film around the first pillar-shaped semiconductor layer, the second pillar-shaped semiconductor layer, the first dummy gate, and the second dummy gate, depositing a second polysilicon around the fourth insulating film and etching the second polysilicon so as to remain on side walls of the first dummy gate, the first pillar-shaped semiconductor layer, the second dummy gate, and the second pillar-shaped semiconductor layer to form the third dummy gate and the fourth dummy gate.

The method for producing a semiconductor device preferably includes, as the fourth step, forming the second diffusion layer in an upper portion of the fin-shaped semiconductor layer, in a lower portion of the first pillar-shaped semiconductor layer, and in a lower portion of the second pillar-shaped semiconductor layer, forming a fifth insulating film around the third dummy gate and the fourth dummy gate and etching the fifth insulating film so as to have a sidewall shape to form sidewalls derived from the fifth insulating film, and forming a compound layer formed of metal and semiconductor on the second diffusion layer.

The method for producing a semiconductor device preferably includes, as the fifth step, after the fourth step, depositing the first interlayer insulating film and performing chemical mechanical polishing to expose upper portions of the first dummy gate, the second dummy gate, the third dummy gate, and the fourth dummy gate, removing the first dummy gate, the second dummy gate, the third dummy gate, and the fourth dummy gate, removing the second insulating film and the fourth insulating film, forming the gate insulating film around the first pillar-shaped semiconductor layer, around the second pillar-shaped semiconductor layer, and on inner sides of the fifth insulating film, forming a third resist for removing the gate insulating film from around a bottom portion of the second pillar-shaped semiconductor layer, removing the gate insulating film from around the bottom portion of the second pillar-shaped semiconductor layer, depositing a first metal layer, and performing etch back to expose an upper portion of the first pillar-shaped semiconductor layer and an upper portion of the second pillar-shaped semiconductor layer, to form the gate electrode and the gate line around the first pillar-shaped semiconductor layer and to form the contact electrode and the contact line around the second pillar-shaped semiconductor layer.

The present invention can provide a semiconductor device that allows reduction in the area of cross sections (in the current flow direction) of a variable-resistance film and a lower electrode, that allows a large current to pass through a selected transistor, and that includes a variable-resistance memory element, and a method for producing the semiconductor device.

BRIEF DESCRIPTION OF THE DRAWINGS

FIG. 1A is a plan view of a semiconductor device according to an embodiment of the present invention; FIG. 1B is a sectional view taken along line X-X' in FIG. 1A; and FIG. 1C is a sectional view taken along line Y-Y' in FIG. 1A.

FIG. 2A is a plan view of a semiconductor device according to an embodiment of the present invention; FIG. 2B is a sectional view taken along line X-X' in FIG. 2A; and FIG. 2C is a sectional view taken along line Y-Y' in FIG. 2A.

FIG. 3A is a plan view of a semiconductor device according to an embodiment of the present invention; FIG. 3B is a sectional view taken along line X-X' in FIG. 3A; and FIG. 3C is a sectional view taken along line Y-Y' in FIG. 3A.

FIG. 5A is a plan view for explaining a method for producing a semiconductor device according to an embodiment of the present invention; FIG. 5B is a sectional view taken along line X-X' in FIG. 5A; and FIG. 5C is a sectional view taken along line Y-Y' in FIG. 5A.

FIG. 6A is a plan view for explaining a method for producing a semiconductor device according to an embodiment of the present invention; FIG. 6B is a sectional view taken along line X-X' in FIG. 6A; and FIG. 6C is a sectional view taken along line Y-Y' in FIG. 6A.

FIG. 7A is a plan view for explaining a method for producing a semiconductor device according to an embodiment of the present invention; FIG. 7B is a sectional view taken along line X-X' in FIG. 7A; and FIG. 7C is a sectional view taken along line Y-Y' in FIG. 7A.

FIG. 8A is a plan view for explaining a method for producing a semiconductor device according to an embodiment of the present invention; FIG. 8B is a sectional view taken along line X-X' in FIG. 8A; and FIG. 8C is a sectional view taken along line Y-Y' in FIG. 8A.

FIG. 9A is a plan view for explaining a method for producing a semiconductor device according to an embodiment of the present invention; FIG. 9B is a sectional view taken along line X-X' in FIG. 9A; and FIG. 9C is a sectional view taken along line Y-Y' in FIG. 9A.

FIG. 10A is a plan view for explaining a method for producing a semiconductor device according to an embodiment of the present invention; FIG. 10B is a sectional view taken along line X-X' in FIG. 10A; and FIG. 10C is a sectional view taken along line Y-Y' in FIG. 10A.

FIG. 11A is a plan view for explaining a method for producing a semiconductor device according to an embodiment of the present invention; FIG. 11B is a sectional view taken along line X-X' in FIG. 11A; and FIG. 11C is a sectional view taken along line Y-Y' in FIG. 11A.

FIG. 12A is a plan view for explaining a method for producing a semiconductor device according to an embodiment of the present invention; FIG. 12B is a sectional view taken along line X-X' in FIG. 12A; and FIG. 12C is a sectional view taken along line Y-Y' in FIG. 12A.

FIG. 13A is a plan view for explaining a method for producing a semiconductor device according to an embodiment of the present invention; FIG. 13B is a sectional view taken along line X-X' in FIG. 13A; and FIG. 13C is a sectional view taken along line Y-Y' in FIG. 13A.

FIG. 14A is a plan view for explaining a method for producing a semiconductor device according to an embodiment of the present invention; FIG. 14B is a sectional view taken along line X-X' in FIG. 14A; and FIG. 14C is a sectional view taken along line Y-Y' in FIG. 14A.

FIG. 15A is a plan view for explaining a method for producing a semiconductor device according to an embodiment of the present invention; FIG. 15B is a sectional view taken along line X-X' in FIG. 15A; and FIG. 15C is a sectional view taken along line Y-Y' in FIG. 15A.

FIG. 16A is a plan view for explaining a method for producing a semiconductor device according to an embodiment of the present invention; FIG. 16B is a sectional view taken along line X-X' in FIG. 16A; and FIG. 16C is a sectional view taken along line Y-Y' in FIG. 16A.

FIG. 17A is a plan view for explaining a method for producing a semiconductor device according to an embodiment of the present invention; FIG. 17B is a sectional view taken along line X-X' in FIG. 17A; and FIG. 17C is a sectional view taken along line Y-Y' in FIG. 17A.

FIG. 18A is a plan view for explaining a method for producing a semiconductor device according to an embodiment of the present invention; FIG. 18B is a sectional view taken along line X-X' in FIG. 18A; and FIG. 18C is a sectional view taken along line Y-Y' in FIG. 18A.

FIG. 19A is a plan view for explaining a method for producing a semiconductor device according to an embodiment of the present invention; FIG. 19B is a sectional view taken along line X-X' in FIG. 19A; and FIG. 19C is a sectional view taken along line Y-Y' in FIG. 19A.

FIG. 20A is a plan view for explaining a method for producing a semiconductor device according to an embodiment of the present invention; FIG. 20B is a sectional view taken along line X-X' in FIG. 20A; and FIG. 20C is a sectional view taken along line Y-Y' in FIG. 20A.

FIG. 21A is a plan view for explaining a method for producing a semiconductor device according to an embodiment of the present invention; FIG. 21B is a sectional view taken along line X-X' in FIG. 21A; and FIG. 21C is a sectional view taken along line Y-Y' in FIG. 21A.

FIG. 23A is a plan view for explaining a method for producing a semiconductor device according to an embodiment of the present invention; FIG. 23B is a sectional view taken along line X-X' in FIG. 23A; and FIG. 23C is a sectional view taken along line Y-Y' in FIG. 23A.

FIG. 24A is a plan view for explaining a method for producing a semiconductor device according to an embodiment of the present invention; FIG. 24B is a sectional view taken along line X-X' in FIG. 24A; and FIG. 24C is a sectional view taken along line Y-Y' in FIG. 24A.

FIG. 25A is a plan view for explaining a method for producing a semiconductor device according to an embodiment of the present invention; FIG. 25B is a sectional view taken along line X-X' in FIG. 25A; and FIG. 25C is a sectional view taken along line Y-Y' in FIG. 25A.

FIG. 26A is a plan view for explaining a method for producing a semiconductor device according to an embodiment of the present invention; FIG. 26B is a sectional view taken along line X-X' in FIG. 26A; and FIG. 26C is a sectional view taken along line Y-Y' in FIG. 26A.

FIG. 27A is a plan view for explaining a method for producing a semiconductor device according to an embodiment of the present invention; FIG. 27B is a sectional view taken along line X-X' in FIG. 27A; and FIG. 27C is a sectional view taken along line Y-Y' in FIG. 27A.

FIG. 28A is a plan view for explaining a method for producing a semiconductor device according to an embodiment of the present invention; FIG. 28B is a sectional view taken along line X-X' in FIG. 28A; and FIG. 28C is a sectional view taken along line Y-Y' in FIG. 28A.

FIG. 29A is a plan view for explaining a method for producing a semiconductor device according to an embodiment of the present invention; FIG. 29B is a sectional view taken along line X-X' in FIG. 29A; and FIG. 29C is a sectional view taken along line Y-Y' in FIG. 29A.

FIG. 30A is a plan view for explaining a method for producing a semiconductor device according to an embodiment of the present invention; FIG. 30B is a sectional view taken along line X-X' in FIG. 30A; and FIG. 30C is a sectional view taken along line Y-Y' in FIG. 30A.

FIG. 31A is a plan view for explaining a method for producing a semiconductor device according to an embodiment of the present invention; FIG. 31B is a sectional view taken along line X-X' in FIG. 31A; and FIG. 31C is a sectional view taken along line Y-Y' in FIG. 31A.

FIG. 32A is a plan view for explaining a method for producing a semiconductor device according to an embodiment of the present invention; FIG. 32B is a sectional view taken along line X-X' in FIG. 32A; and FIG. 32C is a sectional view taken along line Y-Y' in FIG. 32A.

FIG. 33A is a plan view for explaining a method for producing a semiconductor device according to an embodiment of the present invention; FIG. 33B is a sectional view taken along line X-X' in FIG. 33A; and FIG. 33C is a sectional view taken along line Y-Y' in FIG. 33A.

FIG. 35A is a plan view for explaining a method for producing a semiconductor device according to an embodiment of the present invention; FIG. 35B is a sectional view taken along line X-X' in FIG. 35A; and FIG. 35C is a sectional view taken along line Y-Y' in FIG. 35A.

FIG. 36A is a plan view for explaining a method for producing a semiconductor device according to an embodiment of the present invention; FIG. 36B is a sectional view taken along line X-X' in FIG. 36A; and FIG. 36C is a sectional view taken along line Y-Y' in FIG. 36A.

FIG. 37A is a plan view for explaining a method for producing a semiconductor device according to an embodiment of the present invention; FIG. 37B is a sectional view taken along line X-X' in FIG. 37A; and FIG. 37C is a sectional view taken along line Y-Y' in FIG. 37A.

FIG. 38A is a plan view for explaining a method for producing a semiconductor device according to an embodiment of the present invention; FIG. 38B is a sectional view taken along line X-X' in FIG. 38A; and FIG. 38C is a sectional view taken along line Y-Y' in FIG. 38A.

FIG. 40A is a plan view for explaining a method for producing a semiconductor device according to an embodiment of the present invention; FIG. 40B is a sectional view taken along line X-X' in FIG. 40A; and FIG. 40C is a sectional view taken along line Y-Y' in FIG. 40A.

FIG. 41A is a plan view for explaining a method for producing a semiconductor device according to an embodiment of the present invention; FIG. 41B is a sectional view taken along line X-X' in FIG. 41A; and FIG. 41C is a sectional view taken along line Y-Y' in FIG. 41A.

FIG. 42A is a plan view for explaining a method for producing a semiconductor device according to an embodiment of the present invention; FIG. 42B is a sectional view taken along line X-X' in FIG. 42A; and FIG. 42C is a sectional view taken along line Y-Y' in FIG. 42A.

FIG. 45A is a plan view for explaining a method for producing a semiconductor device according to an embodiment of the present invention; FIG. 45B is a sectional view taken along line X-X' in FIG. 45A; and FIG. 45C is a sectional view taken along line Y-Y' in FIG. 45A.

FIG. 46A is a plan view for explaining a method for producing a semiconductor device according to an embodiment of the present invention; FIG. 46B is a sectional view taken along line X-X' in FIG. 46A; and FIG. 46C is a sectional view taken along line Y-Y' in FIG. 46A.

FIG. 47A is a plan view for explaining a method for producing a semiconductor device according to an embodiment of the present invention; FIG. 47B is a sectional view taken along line X-X' in FIG. 47A; and FIG. 47C is a sectional view taken along line Y-Y' in FIG. 47A.

FIG. 48A is a plan view for explaining a method for producing a semiconductor device according to an embodiment of the present invention; FIG. 48B is a sectional view taken along line X-X' in FIG. 48A; and FIG. 48C is a sectional view taken along line Y-Y' in FIG. 48A.

FIG. 49A is a plan view for explaining a method for producing a semiconductor device according to an embodiment of the present invention; FIG. 49B is a sectional view taken along line X-X' in FIG. 49A; and FIG. 49C is a sectional view taken along line Y-Y' in FIG. 49A.

FIG. 51A is a plan view for explaining a method for producing a semiconductor device according to an embodiment of the present invention; FIG. 51B is a sectional view taken along line X-X' in FIG. 51A; and FIG. 51C is a sectional view taken along line Y-Y' in FIG. 51A.

FIG. 54A is a plan view for explaining a method for producing a semiconductor device according to an embodiment of the present invention; FIG. 54B is a sectional view taken along line X-X' in FIG. 54A; and FIG. 54C is a sectional view taken along line Y-Y' in FIG. 54A.

FIG. 55A is a plan view for explaining a method for producing a semiconductor device according to an embodiment of the present invention; FIG. 55B is a sectional view taken along line X-X' in FIG. 55A; and FIG. 55C is a sectional view taken along line Y-Y' in FIG. 55A.

FIG. 56A is a plan view for explaining a method for producing a semiconductor device according to an embodiment of the present invention; FIG. 56B is a sectional view taken along line X-X' in FIG. 56A; and FIG. 56C is a sectional view taken along line Y-Y' in FIG. 56A.

FIG. 59A is a plan view for explaining a method for producing a semiconductor device according to an embodiment of the present invention; FIG. 59B is a sectional view taken along line X-X' in FIG. 59A; and FIG. 59C is a sectional view taken along line Y-Y' in FIG. 59A.

FIG. 61A is a plan view for explaining a method for producing a semiconductor device according to an embodiment of the present invention; FIG. 61B is a sectional view taken along line X-X' in FIG. 61A; and FIG. 61C is a sectional view taken along line Y-Y' in FIG. 61A.

DESCRIPTION OF THE PREFERRED EMBODIMENTS

Figure 4A:
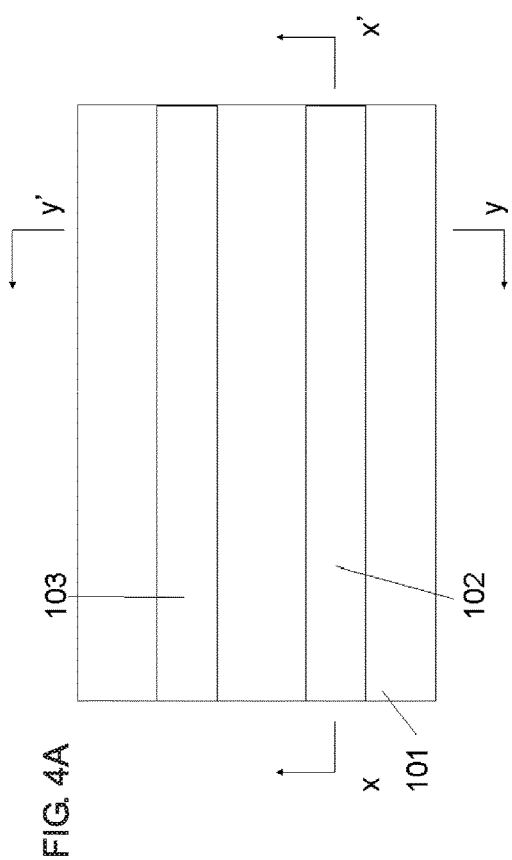
FIG. 4A is a plan view for explaining a method for producing a semiconductor device according to an embodiment of the present invention.

Referring now to the figures of the drawing in detail and first, particularly, to FIGS. 1A to 1C thereof, there is shown the structure of a semiconductor device according to an exemplary embodiment of the present invention.

As illustrated in FIGS. 1A to 1C, in the 3×2 matrix cell arrangement, memory cells according to the embodiment are disposed in the first row and the first column, in the first row and the third column, in the second row and the first column, and in the second row and the third column. In the 3×2 matrix cell arrangement, contact devices that have a contact electrode and a contact line for connecting source lines to each other are disposed in the first row and the second column and in the second row and the second column.

The memory cell that is positioned in the second row and the first column includes a fin-shaped silicon layer 104 formed on a semiconductor substrate 101 so as to extend in the horizontal direction, a first insulating film 106 formed around the fin-shaped silicon layer 104, a first pillar-shaped silicon layer 129 formed on the fin-shaped silicon layer 104, a gate insulating film 162 formed around the first pillar-shaped silicon layer 129, a gate electrode 168a formed of metal and formed around the gate insulating film 162, and a gate line 168b formed of metal and connected to the gate electrode 168a. The gate line 168b extends in a direction orthogonal to the fin-shaped silicon layer 104.

The memory cell that is positioned in the second row and the first column further includes the gate insulating film 162 formed around and below the gate electrode 168a and the gate line 168b, a second gate insulating film 173 formed around an upper portion of the first pillar-shaped silicon layer 129, a first contact 179a formed of a first metal material and formed around the second gate insulating film 173, a second contact 183a formed of a second metal material and connecting an upper portion of the first contact 179a and an upper portion of the first pillar-shaped silicon layer 129, and a second diffusion layer 143a formed in a lower portion of the first pillar-shaped silicon layer 129. The second diffusion layer 143a is formed in the fin-shaped silicon layer 104.

The memory cell that is positioned in the second row and the first column further includes a pillar-shaped nitride layer 202 formed on the second contact 183a, a variable-resistance film 211 formed around an upper portion of the pillar-shaped nitride layer 202, and a lower electrode 206 formed around a lower portion of the pillar-shaped nitride layer 202 and connected to the variable-resistance film 211. The pillar-shaped nitride layer 202 is formed of a nitride film. The lower electrode 206 is formed between the pillar-shaped nitride layer 202 and the second contact 183a.

The variable-resistance film 211 is preferably constituted by a phase-change film formed of chalcogenide glass (GST: $Ge_2Sb_2Te_5$), for example. The lower electrode 206 that is a heater element is preferably formed of titanium nitride, for example.

The memory cell positioned in the second row and the third column includes a fin-shaped silicon layer 104 formed on a semiconductor substrate 101 so as to extend in the horizontal direction, a first insulating film 106 formed around the fin-shaped silicon layer 104, a first pillar-shaped silicon layer 131 formed on the fin-shaped silicon layer 104, a gate insulating film 163 formed around the first pillar-shaped silicon layer 131, a gate electrode 170a formed of metal and formed around the gate insulating film 163, and a gate line 170b formed of metal and connected to the gate electrode 170a. The gate line 170b extends in a direction orthogonal to the fin-shaped silicon layer 104.

The memory cell positioned in the second row and the third column further includes the gate insulating film 163 formed around and below the gate electrode 170a and the gate line 170b, a second gate insulating film 174 formed around an upper portion of the first pillar-shaped silicon layer 131, a first contact 181a formed of a first metal material and formed around the second gate insulating film 174, a second contact 185a formed of a second metal material and connecting an upper portion of the first contact 181a and an upper portion of the first pillar-shaped silicon layer 131, and a second diffusion layer 143a formed in a lower portion of the first pillar-shaped silicon layer 131. The second diffusion layer 143a is formed in the fin-shaped silicon layer 104.

The memory cell that is positioned in the second row and the third column further includes a pillar-shaped nitride layer 203 formed on the second contact 185a, a variable-resistance film 212 formed around an upper portion of the pillar-shaped nitride layer 203, and a lower electrode 207 formed around a lower portion of the pillar-shaped nitride layer 203 and connected to the variable-resistance film 212. The pillar-shaped nitride layer 203 is formed of a nitride film. The lower electrode 207 is formed between the pillar-shaped nitride layer 203 and the second contact 185a.

The variable-resistance film 211 is connected to the variable-resistance film 212 via a bit line 219.

The memory cell positioned in the first row and the first column includes a fin-shaped silicon layer 105 formed on a semiconductor substrate 101 so as to extend in the horizontal direction, a first insulating film 106 formed around the fin-shaped silicon layer 105, a first pillar-shaped silicon layer 132 formed on the fin-shaped silicon layer 105, a gate insulating film 162 formed around the first pillar-shaped silicon layer 132, a gate electrode 168a formed of metal and formed around the gate insulating film 162, and a gate line 168b formed of metal and connected to the gate electrode 168a. The gate line 168b extends in a direction orthogonal to the fin-shaped silicon layer 105.

The memory cell positioned in the first row and the first column further includes the gate insulating film 162 formed around and below the gate electrode 168a and the gate line 168b, a second gate insulating film 173 formed around an upper portion of the first pillar-shaped silicon layer 132, a first contact 179b formed of a first metal material and formed around the second gate insulating film 173, a second contact 183b formed of a second metal material and connecting an upper portion of the first contact 179b and an upper portion of the first pillar-shaped silicon layer 132, and a second diffusion layer 143b formed in a lower portion of the first pillar-shaped silicon layer 132. The second diffusion layer 143b is formed in the fin-shaped silicon layer 105.

The memory cell that is positioned in the first row and the first column further includes a pillar-shaped nitride layer 204 formed on the second contact 183b, a variable-resistance film 213 formed around an upper portion of the pillar-shaped nitride layer 204, and a lower electrode 208 formed around a lower portion of the pillar-shaped nitride layer 204 and connected to the variable-resistance film 213. The pillar-shaped nitride layer 204 is formed of a nitride film. The lower electrode 208 is formed between the pillar-shaped nitride layer 204 and the second contact 183b.

The memory cell positioned in the first row and the third column includes a fin-shaped silicon layer 105 formed on a semiconductor substrate 101 so as to extend in the horizontal direction, a first insulating film 106 formed around the fin-shaped silicon layer 105, a first pillar-shaped silicon layer 134 formed on the fin-shaped silicon layer 105, a gate insulating film 163 formed around the first pillar-shaped silicon layer 134, a gate electrode 170a formed of metal and formed around the gate insulating film 163, and a gate line 170b formed of metal and connected to the gate electrode 170a. The gate line 170b extends in a direction orthogonal to the fin-shaped silicon layer 105.

The memory cell positioned in the first row and the third column further includes the gate insulating film 163 formed around and below the gate electrode 170a and the gate line 170b, a second gate insulating film 174 formed around an upper portion of the first pillar-shaped silicon layer 134, a first contact 181b formed of a first metal material and formed around the second gate insulating film 174, a second contact 185b formed of a second metal material and connecting an upper portion of the first contact 181b and an upper portion of the first pillar-shaped silicon layer 134, and a second diffusion layer 143b formed in a lower portion of the first pillar-shaped silicon layer 134. The second diffusion layer 143b is formed in the fin-shaped silicon layer 105.

The memory cell that is positioned in the first row and the third column further includes a pillar-shaped nitride layer 205 formed on the second contact 185b, a variable-resistance film 214 formed around an upper portion of the pillar-shaped nitride layer 205, and a lower electrode 209 formed around a lower portion of the pillar-shaped nitride layer 205 and connected to the variable-resistance film 214. The pillar-shaped nitride layer 205 is formed of a nitride film. The lower electrode 209 is formed between the pillar-shaped nitride layer 205 and the second contact 185b.

The variable-resistance film 213 is connected to the variable-resistance film 214 via a bit line 220.

A semiconductor device according to the embodiment includes the pillar-shaped nitride layers 202, 203, 204, and 205, the variable-resistance films 211, 212, 213, and 214 formed around upper portions of the pillar-shaped nitride layers 202, 203, 204, and 205, and the lower electrodes 206, 207, 208, and 209 formed around lower portions of the pillar-shaped nitride layers 202, 203, 204, and 205 and connected to the variable-resistance films 211, 212, 213, and 214. This allows reduction in the area of cross sections in the current flow directions in phase-change films that are the variable-resistance films 211, 212, 213, and 214 and heater elements that are the lower electrodes 206, 207, 208, and 209.

In addition, the pillar-shaped nitride layers 202, 203, 204, and 205 are nitride films, which promotes cooling of phase-change films that are the variable-resistance films 211, 212, 213, and 214. In addition, since the lower electrodes 206, 207, 208, and 209 are formed below the pillar-shaped nitride layers 202, 203, 204, and 205, the contact resistance between the lower electrodes 206, 207, 208, and 209 and cell transistors can be reduced.

SGTs allow a larger current per unit gate width to pass than double-gate transistors. In addition, SGTs have a structure in which the gate electrode surrounds the pillar-shaped semiconductor layer. Thus, the gate width per unit area can be increased, so that an even larger current can be passed. Thus, SGTs allow a large reset current to pass, so that phase-change films that are the variable-resistance films 211, 212, 213, and 214 can be melted at a high temperature (with a large current). For the subthreshold swing of SGTs, an ideal value can be achieved. Accordingly, off current can be decreased, so that phase-change films that are the variable-resistance films 211, 212, 213, and 214 can be rapidly cooled (by stopping the current).

In a semiconductor device according to the embodiment, the gate electrodes 168a and 170a and the gate lines 168b and 170b are formed of metal. Furthermore, the first contacts 179a, 179b, 181a, and 181b formed around the second gate insulating films 173 and 174 and formed of a first metal material, and the second contacts 183a, 183b, 185a, and 185b connecting upper portions of the first contacts 179a, 179b, 181a, and 181b and upper portions of the pillar-shaped silicon layers 129, 131, 132, and 134 and formed of a second metal material, are also formed of metal. Thus, a large amount of metal is used so that the heat dissipation effect of the metal can promote cooling of portions heated by a large reset current. In addition, the semiconductor device according to the embodiment includes the gate insulating films 162 and 163 formed around and below the gate electrodes 168a and 170a and the gate lines 168b and 170b. Accordingly, a gate last process of forming metal gates at the final stage of the heat-treatment step is carried out to form the gate electrodes 168a and 170a that are metal gates. Thus, both of the metal gate process and the high-temperature process can be successfully performed.

The semiconductor device according to the embodiment includes the gate insulating films 162 and 163 formed around and below the gate electrodes 168a and 170a and the gate lines 168b and 170b. The gate electrodes 168a and 170a and the gate lines 168b and 170b are formed of metal. The gate lines 168b and 170b extend in a direction orthogonal to the fin-shaped silicon layers 104 and 105. The second diffusion layers 143a and 143b are formed in the fin-shaped silicon layers 104 and 105. The gate electrodes 168a and 170a have outer linewidths equal to the linewidths of the gate lines 168b and 170b. Also, the first pillar-shaped silicon layers 129, 131, 132, and 134 have linewidths equal to the linewidths of the fin-shaped silicon layers 104 and 105. Accordingly, in the semiconductor device according to the embodiment, the fin-shaped silicon layers 104 and 105, the first pillar-shaped silicon layers 129, 131, 132, and 134, the gate electrodes 168a and 170a, and the gate lines 168b and 170b are formed by self alignment with two masks. As a result, the number of steps required to produce the semiconductor device can be reduced.

The contact device positioned in the second row and the second column includes a fin-shaped silicon layer 104 formed on a semiconductor substrate 101 so as to extend in the horizontal direction, a first insulating film 106 formed around the fin-shaped silicon layer 104, and a second pillar-shaped silicon layer 130 formed on the fin-shaped silicon layer 104. A width of the second pillar-shaped silicon layer 130 in a direction orthogonal to the fin-shaped silicon layer 104 is equal to a width of the fin-shaped silicon layer 104 in the direction orthogonal to the fin-shaped silicon layer 104.

The contact device positioned in the second row and the second column further includes a contact electrode 169a formed of metal and formed around the second pillar-shaped silicon layer 130, a gate insulating film 165 formed between the second pillar-shaped silicon layer 130 and the contact electrode 169a, a contact line 169b formed of metal, extending in a direction orthogonal to the fin-shaped silicon layer 104, and connected to the contact electrode 169a, and a gate insulating film 164 formed around the contact electrode 169a and the contact line 169b. The outer linewidth of the contact electrode 169a is equal to the linewidth of the contact line 169b. A second diffusion layer 143a, which is formed in the fin-shaped silicon layer 104 and in a lower portion of the second pillar-shaped silicon layer 130, is connected to the contact electrode 169a.

The contact device positioned in the second row and the second column further includes a second gate insulating film 175 formed around an upper portion of the second pillar-shaped silicon layer 130, and a third contact 180a formed of a first metal material and formed around the second gate insulating film 175. The third contact 180a is connected to the contact electrode 169a. A fourth contact 184a is formed of a second metal material and connects an upper portion of the third contact 180a and an upper portion of the second pillar-shaped silicon layer 130.

Thus, the second diffusion layer 143a, the contact electrode 169a, the contact line 169b, and the third contact 180a are connected to the fourth contact 184a.

The contact device positioned in the first row and the second column includes a fin-shaped silicon layer 105 formed on a semiconductor substrate 101 so as to extend in the horizontal direction, a first insulating film 106 formed around the fin-shaped silicon layer 105, and a second pillar-shaped silicon layer 133 formed on the fin-shaped silicon layer 105. A width of the second pillar-shaped silicon layer 133 in a direction orthogonal to the fin-shaped silicon layer 105 is equal to a width of the fin-shaped silicon layer 105 in the direction orthogonal to the fin-shaped silicon layer 105.

The contact device positioned in the first row and the second column further includes a contact electrode 169a formed of metal and formed around the second pillar-shaped silicon layer 133, a gate insulating film 166 formed between the second pillar-shaped silicon layer 133 and the contact electrode 169a, a contact line 169b formed of metal, extending in a direction orthogonal to the fin-shaped silicon layer 105, and connected to the contact electrode 169a, and a gate insulating film 164 formed around the contact electrode 169a and the contact line 169b. The outer linewidth of the contact electrode 169a is equal to the linewidth of the contact line 169b. A second diffusion layer 143b, which is formed in the fin-shaped silicon layer 105 and in a lower portion of the second pillar-shaped silicon layer 133, is connected to the contact electrode 169a.

The contact device positioned in the first row and the second column further includes a second gate insulating film 176 formed around an upper portion of the second pillar-shaped silicon layer 133, and a third contact 180b formed around the second gate insulating film 176 and formed of a first metal material. The third contact 180b is connected to the contact electrode 169a. A fourth contact 184b is formed that connects an upper portion of the third contact 180b and an upper portion of the second pillar-shaped silicon layer 133 and is formed of a second metal material.

Thus, the second diffusion layer 143b, the contact electrode 169a, the contact line 169b, and the third contact 180b are connected to the fourth contact 184b.

The semiconductor device according to this embodiment includes the contact line 169b extending parallel with the gate lines 168b and 170b and connected to the second diffusion layers 143a and 143b. Thus, the second diffusion layers 143a and 143b are connected to each other and the resistance of the source lines can be decreased. As a result, a large reset current can be passed through the source lines. The contact line 169b extending parallel with the gate lines 168b and 170b is preferably disposed such that, for example, a single contact line 169b is disposed every 2, 4, 8, 16, 32, or 64 memory cells arranged in a line in the direction in which the bit lines 207 and 208 extend.

In this embodiment, the structure including the second pillar-shaped silicon layers 130 and 133 and the contact electrode 169a and the contact line 169b formed around the second pillar-shaped silicon layers 130 and 133, is the same as the transistor structure of the memory cell positioned, for example, in the first row and the first column except that the contact electrode 169a is electrically connected to the second diffusion layers 143a and 143b. All the source lines constituted by the second diffusion layers 143a and 143b and extending parallel with the gate lines 168b and 170b are connected to the contact line 169b. As a result, the number of steps required to produce the semiconductor device can be reduced.

FIGS. 2A to 2C illustrate a structure in which, compared with the second diffusion layers 143a and 143b in FIGS. 1A to 1C, a second diffusion layer 143c is formed to a deep level in the semiconductor substrate 101 and is formed in the fin-shaped silicon layers 104 and 105, and is connected in the same manner as in the second diffusion layers 143a and 143b in FIGS. 1A to 1C. This structure allows a further decrease in the source resistance.

FIGS. 3A to 3C illustrate a semiconductor device that has a structure in which the fin-shaped silicon layer 105 and the first insulating film 106 formed around the fin-shaped silicon layer 105 in FIGS. 2A to 2C are not formed, and a second diffusion layer 143d is directly formed in the semiconductor substrate 101. This structure allows a further decrease in the source resistance.

Hereinafter, steps for producing a semiconductor device according to an embodiment of the present invention will be described with reference to FIGS. 4A to 61C.

Hereafter, a first step according to an embodiment of the present invention will be described. The first step includes forming fin-shaped silicon layers 104 and 105 on a semiconductor substrate 101 and forming a first insulating film 106 around the fin-shaped silicon layers 104 and 105. In this embodiment, a silicon substrate is used as the semiconductor substrate 101. Alternatively, a substrate that is formed of another semiconductor material may be used.

Figure 4C:
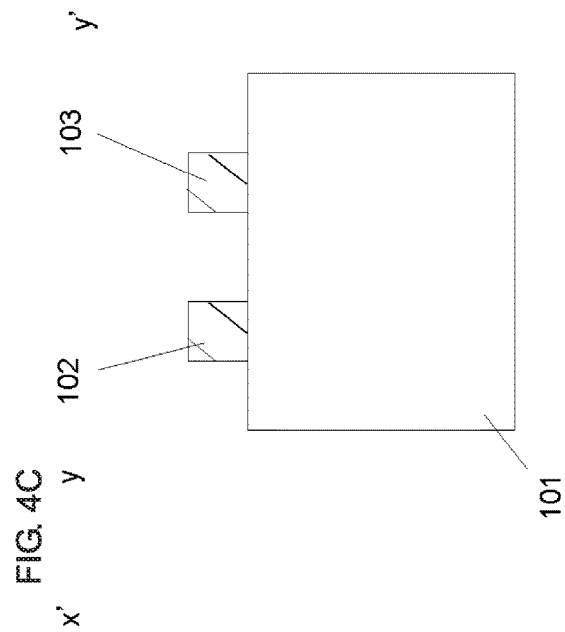
FIG. 4C is a sectional view taken along line Y-Y' in FIG. 4A.
Figure 4B:
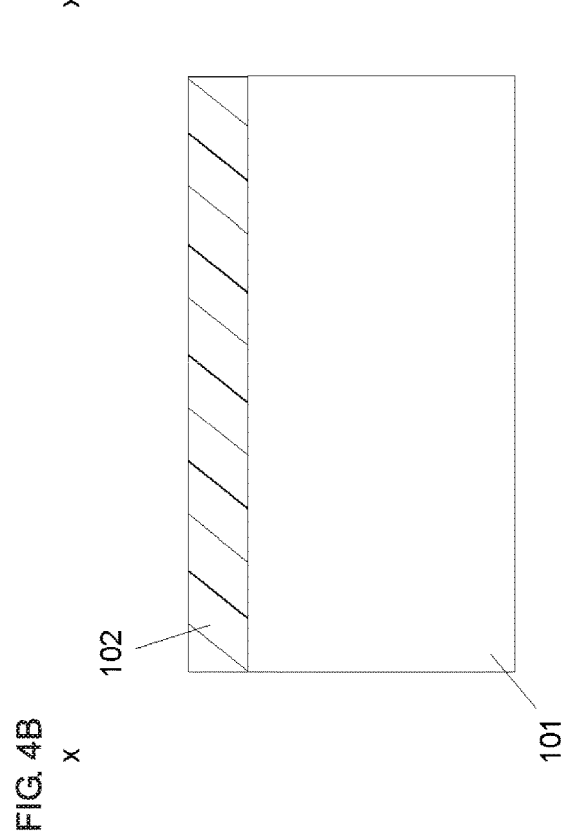
FIG. 4B is a sectional view taken along line X-X' in FIG. 4A.

As illustrated in FIGS. 4A to 4C, first resists 102 and 103 for forming fin-shaped silicon layers 104 and 105 on a silicon substrate 101 are formed.

Subsequently, as illustrated in FIGS. 5A to 5C, the silicon substrate 101 is etched to form the fin-shaped silicon layers 104 and 105. Here, the fin-shaped silicon layers 104 and 105 are formed with the resists serving as masks. Alternatively, instead of the resists, hard masks such as oxide films and nitride films may be used.

Subsequently, as illustrated in FIGS. 6A to 6C, the first resists 102 and 103 are removed.

Subsequently, as illustrated in FIGS. 7A to 7C, a first insulating film 106 is deposited around the fin-shaped silicon layers 104 and 105. The first insulating film 106 may be an oxide film formed with high-density plasma or an oxide film formed by low-pressure CVD (Chemical Vapor Deposition).

Subsequently, as illustrated in FIGS. 8A to 8C, the first insulating film 106 is subjected to etch back to expose upper portions of the fin-shaped silicon layers 104 and 105.

Thus, the first step according to the embodiment has been described, the first step including forming fin-shaped silicon layers 104 and 105 on a semiconductor substrate 101 and forming a first insulating film 106 around the fin-shaped silicon layers 104 and 105.

Hereafter, a second step according to an embodiment of the present invention will be described. In the second step, after the first step, second insulating films 107 and 108 are formed around the fin-shaped silicon layers 104 and 105, and a first polysilicon 109 is deposited on the second insulating films 107 and 108 and planarized. Subsequently, second resists 111, 112, and 113 for forming gate lines 168b and 170b, first pillar-shaped silicon layers 129, 131, 132, and 134, second pillar-shaped silicon layers 130 and 133, and a contact line 169b are formed so as to extend in a direction orthogonal to a direction in which the fin-shaped silicon layers 104 and 105 extend. Subsequently, while the second resists 111, 112, and 113 are used as masks, the first polysilicon 109, the second insulating films 107 and 108, and the fin-shaped silicon layers 104 and 105 are etched to form the first pillar-shaped silicon layers 129, 131, 132, and 134, first dummy gates 117 and 119 derived from the first polysilicon 109, the second pillar-shaped silicon layers 130 and 133, and a second dummy gate 118 derived from the first polysilicon 109.

First, as illustrated in FIGS. 9A to 9C, second insulating films 107 and 108 are formed around the fin-shaped silicon layers 104 and 105 formed on the semiconductor substrate 101 so as to extend in the horizontal direction. The second insulating films 107 and 108 are preferably oxide films.

Subsequently, as illustrated in FIGS. 10A to 10C, a first polysilicon 109 is deposited on the second insulating films 107 and 108 and planarized.

Subsequently, as illustrated in FIGS. 11A to 11C, a third insulating film 110 is formed on the first polysilicon 109. The third insulating film 110 is preferably a nitride film.

Subsequently, as illustrated in FIGS. 12A to 12C, second resists 111, 112, and 113 for forming gate lines 168b and 170b, first pillar-shaped silicon layers 129, 131, 132, and 134, second pillar-shaped silicon layers 130 and 133, and a contact line 169b, are formed so as to extend in a direction orthogonal to a direction in which the fin-shaped silicon layers 104 and 105 extend.

Subsequently, as illustrated in FIGS. 13A to 13C, while the second resists 111, 112, and 113 are used as masks, the third insulating film 110, the first polysilicon 109, the second insulating films 107 and 108, and the fin-shaped silicon layers 104 and 105 are etched to form the first pillar-shaped silicon layers 129, 131, 132, and 134, first dummy gates 117 and 119 derived from the first polysilicon 109, the second pillar-shaped silicon layers 130 and 133, and a second dummy gate 118 derived from the first polysilicon 109. Here, the third insulating film 110 is divided into a plurality of portions to provide third insulating films 114, 115, and 116 on the first dummy gates 117 and 119 and the second dummy gate 118. The second insulating films 107 and 108 are divided into a plurality of portions to provide second insulating films 123, 124, 125, 126, 127, and 128. In a case where the second resists 111, 112, and 113 are removed during this etching, the third insulating films 114, 115, and 116 function as hard masks. On the other hand, in a case where the second resists 111, 112, and 113 are not removed during the etching, it is not necessary to use the third insulating films 114, 115, and 116 as masks.

Subsequently, as illustrated in FIGS. 14A to 14C, the second resists 111, 112, and 113 are removed.

Thus, the second step has been described. In the second step, after the first step, second insulating films 107 and 108 are formed around the fin-shaped silicon layers 104 and 105, and a first polysilicon 109 is deposited on the second insulating films 107 and 108 and planarized. Subsequently, second resists 111, 112, and 113 for forming gate lines 168b and 170b, first pillar-shaped silicon layers 129, 131, 132, and 134, second pillar-shaped silicon layers 130 and 133, and a contact line 169b are formed so as to extend in a direction orthogonal to a direction in which the fin-shaped silicon layers 104 and 105 extend. Subsequently, while the second resists 111, 112, and 113 are used as masks, the first polysilicon 109, the second insulating films 107 and 108, and the fin-shaped silicon layers 104 and 105 are etched to form the first pillar-shaped silicon layers 129, 131, 132, and 134, first dummy gates 117 and 119 derived from the first polysilicon 109, the second pillar-shaped silicon layers 130 and 133, and a second dummy gate 118 derived from the first polysilicon 109.

Hereafter, a third step according to an embodiment of the present invention will be described. In the third step, after the second step, a fourth insulating film 135 is formed around the first pillar-shaped silicon layers 129, 131, 132, and 134, the second pillar-shaped silicon layers 130 and 133, the first dummy gates 117 and 119, and the second dummy gate 118. Subsequently, a second polysilicon 136 is deposited around the fourth insulating film 135 and etched so as to remain on side walls of the first dummy gates 117 and 119, the first pillar-shaped silicon layers 129, 131, 132, and 134, the second dummy gate 118, and the second pillar-shaped silicon layers 130 and 133 to form third dummy gates 137 and 139 and a fourth dummy gate 138.

First, as illustrated in FIGS. 15A to 15C, a fourth insulating film 135 is formed around the first pillar-shaped silicon layers 129, 131, 132, and 134, the second pillar-shaped silicon layers 130 and 133, the first dummy gates 117 and 119, and the second dummy gate 118. Subsequently, a second polysilicon 136 is deposited around the fourth insulating film 135.

Subsequently, as illustrated in FIGS. 16A to 16C, the second polysilicon 136 is etched so as to remain on side walls of the first dummy gates 117 and 119, the first pillar-shaped silicon layers 129, 131, 132, and 134, the second dummy gate 118, and the second pillar-shaped silicon layers 130 and 133. As a result, third dummy gates 137 and 139 and a fourth dummy gate 138 are formed. At this time, the fourth insulating film 135 may be divided into a plurality of portions to provide fourth insulating films 140, 141, and 142.

Thus, the third step has been described. In the third step, after the second step, a fourth insulating film 135 is formed around the first pillar-shaped silicon layers 129, 131, 132, and 134, the second pillar-shaped silicon layers 130 and 133, the first dummy gates 117 and 119, and the second dummy gate 118. Subsequently, a second polysilicon 136 is deposited around the fourth insulating film 135 and etched so as to remain on side walls of the first dummy gates 117 and 119, the first pillar-shaped silicon layers 129, 131, 132, and 134, the second dummy gate 118, and the second pillar-shaped silicon layers 130 and 133 to form third dummy gates 137 and 139 and a fourth dummy gate 138.

Hereafter, a fourth step according to an embodiment of the present invention will be described. In the fourth step, after the third step, second diffusion layers 143a and 143b are formed in upper portions of the fin-shaped silicon layers 104 and 105, lower portions of the first pillar-shaped silicon layers 129, 131, 132, and 134, and lower portions of the second pillar-shaped silicon layers 130 and 133. Subsequently, a fifth insulating film 144 is formed around the third dummy gates 137 and 139 and the fourth dummy gate 138 and etched so as to have a sidewall shape to form sidewalls 145, 146, and 147 derived from the fifth insulating film 144. Compound layers 148, 149, 150, 151, 152, 153, 154, and 155 formed of metal and semiconductor are formed on the second diffusion layers 143a and 143b.

First, as illustrated in FIGS. 17A to 17C, an impurity is introduced to form second diffusion layers 143a and 143b in lower portions of the first pillar-shaped silicon layers 129, 131, 132, and 134 and lower portions of the second pillar-shaped silicon layers 130 and 133. In a case where the impurity is introduced to form n-type diffusion layers, arsenic or phosphorus is preferably introduced. On the other hand, in a case where the impurity is introduced to form p-type diffusion layers, boron is preferably introduced. The diffusion layers may be formed after formation of sidewalls 145, 146, and 147 derived from a fifth insulating film 144 described below.

Subsequently, as illustrated in FIGS. 18A to 18C, a fifth insulating film 144 is formed around the third dummy gates 137 and 139 and the fourth dummy gate 138. The fifth insulating film 144 is preferably a nitride film.

Subsequently, as illustrated in FIGS. 19A to 19C, the fifth insulating film 144 is etched so as to have a sidewall shape. As a result, sidewalls 145, 146, and 147 are formed from the fifth insulating film.

Subsequently, as illustrated in FIGS. 20A to 20C, compound layers 148, 149, 150, 151, 152, 153, 154, and 155 formed of metal and semiconductor are formed on the second diffusion layers 143a and 143b. At this time, compound layers 156, 158, and 157 formed of metal and semiconductor are also formed in upper portions of the third dummy gates 137 and 139 and an upper portion of the fourth dummy gate 138.

Thus, the fourth step has been described. In the fourth step, second diffusion layers 143a and 143b are formed in upper portions of the fin-shaped silicon layers 104 and 105, lower portions of the first pillar-shaped silicon layers 129, 131, 132, and 134, and lower portions of the second pillar-shaped silicon layers 130 and 133. Subsequently, a fifth insulating film 144 is formed around the third dummy gates 137 and 139 and the fourth dummy gate 138 and etched so as to have a sidewall shape to form sidewalls 145, 146, and 147 derived from the fifth insulating film 144. Compound layers 148, 149, 150, 151, 152, 153, 154, and 155 formed metal and semiconductor are formed on the second diffusion layers 143a and 143b.

Hereafter, a fifth step according to an embodiment of the present invention will be described. In the fifth step, after the fourth step, a first interlayer insulating film 159 is deposited and chemical mechanical polishing (CMP) is performed to expose upper portions of the first dummy gates 117 and 119, the second dummy gate 118, the third dummy gates 137 and 139, and the fourth dummy gate 138; and the first dummy gates 117 and 119, the second dummy gate 118, the third dummy gates 137 and 139, and the fourth dummy gate 138 are removed. Subsequently, the second insulating films 123, 124, 125, 126, 127, and 128 and the fourth insulating films 140, 141, and 142 are removed; and a gate insulating film 160 is formed around the first pillar-shaped silicon layers 129, 131, 132, and 134, around the second pillar-shaped silicon layers 130 and 133, and on inner sides of the fifth insulating film 144. Subsequently, a third resist 161 for removing the gate insulating film 160 from around the bottom portions of the second pillar-shaped silicon layers 130 and 133 is formed; the gate insulating film 160 is removed from around the bottom portions of the second pillar-shaped silicon layers 130 and 133; and a metal layer 167 is deposited. Etch back is performed to expose upper portions of the first pillar-shaped silicon layers 129, 131, 132, and 134 and upper portions of the second pillar-shaped silicon layers 130 and 133, so that gate electrodes 168a and 170a and gate lines 168b and 170b are formed around the first pillar-shaped silicon layers 129, 131, 132, and 134. After that, a contact electrode 169a and a contact line 169b are formed around the second pillar-shaped silicon layers 130 and 133.

First, as illustrated in FIGS. 21A to 21C, a first interlayer insulating film 159 is deposited. Here, a contact stopper film may be used.

Figure 22C:
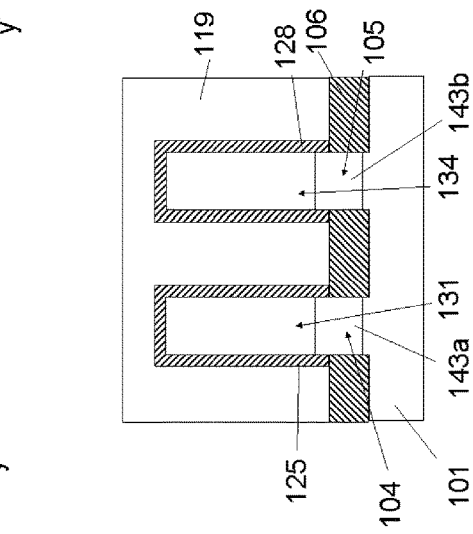
FIG. 22C is a sectional view taken along line Y-Y' in FIG. 22A.
Figure 22A:
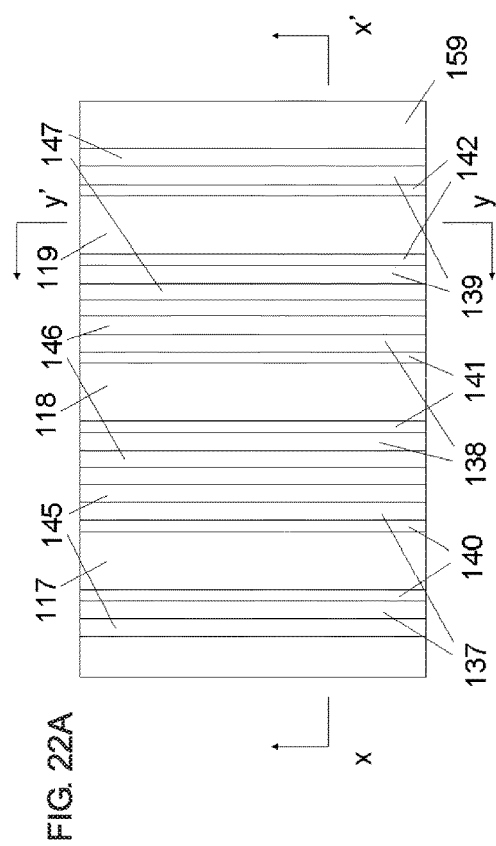
FIG. 22A is a plan view for explaining a method for producing a semiconductor device according to an embodiment of the present invention.
Figure 22B:
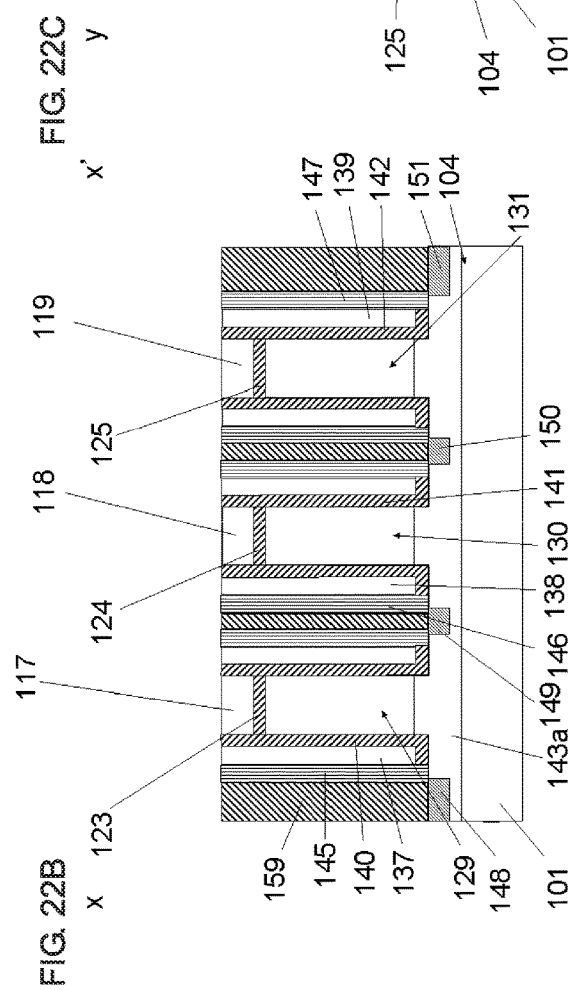
FIG. 22B is a sectional view taken along line X-X' in FIG. 22A.

Subsequently, as illustrated in FIGS. 22A to 22C, chemical mechanical polishing (CMP) is performed to expose upper portions of the first dummy gates 117 and 119, the second dummy gate 118, the third dummy gates 137 and 139, and the fourth dummy gate 138. At this time, the compound layers 156, 158, and 157 formed of metal and semiconductor and formed in the upper portions of the third dummy gates 137 and 139 and in the upper portion of the fourth dummy gate 138 are removed.

Subsequently, as illustrated in FIGS. 23A to 23C, the first dummy gates 117 and 119, the second dummy gate 118, the third dummy gates 137 and 139, and the fourth dummy gate 138 are removed.

Subsequently, as illustrated in FIGS. 24A to 24C, the second insulating films 123, 124, 125, 126, 127, and 128 and the fourth insulating films 140, 141, and 142 are removed.

Subsequently, as illustrated in FIGS. 25A to 25C, a gate insulating film 160 is formed around the first pillar-shaped silicon layers 129, 131, 132, and 134, around the second pillar-shaped silicon layers 130 and 133, and on inner sides of sidewalls 145, 146, and 147 derived from the fifth insulating film 144.

Subsequently, as illustrated in FIGS. 26A to 26C, a third resist 161 for removing the gate insulating film 160 from around the bottom portions of the second pillar-shaped silicon layers 130 and 133 is formed.

Subsequently, as illustrated in FIGS. 27A to 27C, the gate insulating film 160 is removed from around the bottom portions of the second pillar-shaped silicon layers 130 and 133. The gate insulating film 160 is divided into a plurality of portions to provide gate insulating films 162, 163, 164, 165, and 166. Incidentally, the gate insulating films 164, 165, and 166 may be removed by isotropic etching.

Subsequently, as illustrated in FIGS. 28A to 28C, the third resist 161 is removed.

Subsequently, as illustrated in FIGS. 29A to 29C, a metal layer 167 is deposited.

Subsequently, as illustrated in FIGS. 30A to 30C, the metal layer 167 is subjected to etch back to form gate electrodes 168a and 170a and gate lines 168b and 170b around the first pillar-shaped silicon layers 129, 131, 132, and 134 and to form a contact electrode 169a and a contact line 169b around the second pillar-shaped silicon layers 130 and 133.

Thus, the fifth step has been described. In the fifth step, after the fourth step, a first interlayer insulating film 159 is deposited and chemical mechanical polishing (CMP) is performed to expose upper portions of the first dummy gates 117 and 119, the second dummy gate 118, the third dummy gates 137 and 139, and the fourth dummy gate 138; and the first dummy gates 117 and 119, the second dummy gate 118, the third dummy gates 137 and 139, and the fourth dummy gate 138 are removed. Subsequently, the second insulating films 123, 124, 125, 126, 127, and 128 and the fourth insulating films 140, 141, and 142 are removed; and a gate insulating film 160 is formed around the first pillar-shaped silicon layers 129, 131, 132, and 134, around the second pillar-shaped silicon layers 130 and 133, and on inner sides of the fifth insulating film 144. Subsequently, a third resist 161 for removing the gate insulating film 160 from around the bottom portions of the second pillar-shaped silicon layers 130 and 133 is formed; the gate insulating film 160 is removed from around the bottom portions of the second pillar-shaped silicon layers 130 and 133; and a metal layer 167 is deposited. Etch back is performed to expose upper portions of the first pillar-shaped silicon layers 129, 131, 132, and 134 and upper portions of the second pillar-shaped silicon layers 130 and 133 to form gate electrodes 168a and 170a and gate lines 168b and 170b around the first pillar-shaped silicon layers 129, 131, 132, and 134. After that, a contact electrode 169a and a contact line 169b are formed around the second pillar-shaped silicon layers 130 and 133.

Hereafter, a sixth step according to an embodiment of the present invention will be described. In the sixth step, after the fifth step, a gate insulating film 171 is deposited around the first pillar-shaped silicon layers 129, 131, 132, and 134, on the gate electrodes 168a and 170a and the gate lines 168b and 170b, around the second pillar-shaped silicon layers 130 and 133, and on the contact electrode 169a and the contact line 169b. Furthermore, a metal layer 178 is deposited. Subsequently, upper portions of the first pillar-shaped silicon layers 129, 131, 132, and 134 and upper portions of the second pillar-shaped silicon layers 130 and 133 are exposed. The gate insulating film 171 on the first pillar-shaped silicon layers 129, 131, 132, and 134 is removed. Subsequently, a metal layer 182 is deposited and the metal layer 182 and the metal layer 178 are partially etched to form, from the metal layer 178, first contacts 179a, 179b, 181a, and 181b surrounding upper side walls of the first pillar-shaped silicon layers 129, 131, 132, and 134 and to form, from the metal layer 182, second contacts 183a, 183b, 185a, and 185b connecting upper portions of the first contacts 179a, 179b, 181a, and 181b and upper portions of the first pillar-shaped silicon layers 129, 131, 132, and 134.

First, as illustrated in FIGS. 31A to 31C, the exposed gate insulating films 162, 163, 164, 165, and 166 are removed.

Subsequently, as illustrated in FIGS. 32A to 32C, a gate insulating film 171 is deposited around the first pillar-shaped silicon layers 129, 131, 132, and 134, on the gate electrodes 168a and 170a and the gate lines 168b and 170b, around the second pillar-shaped silicon layers 130 and 133, and on the contact electrode 169a and the contact line 169b.

Subsequently, as illustrated in FIGS. 33A to 33C, a fourth resist 172 for removing at least a portion of the gate insulating film 171 on the contact electrode 169a and the contact line 169b is formed.

Figure 34C:
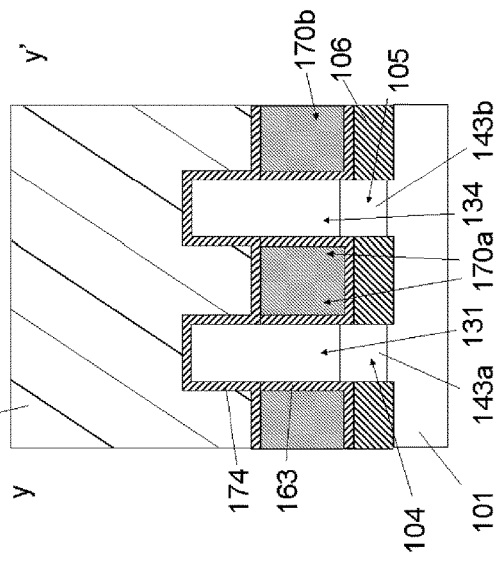
FIG. 34C is a sectional view taken along line Y-Y' in FIG. 34A.
Figure 34A:
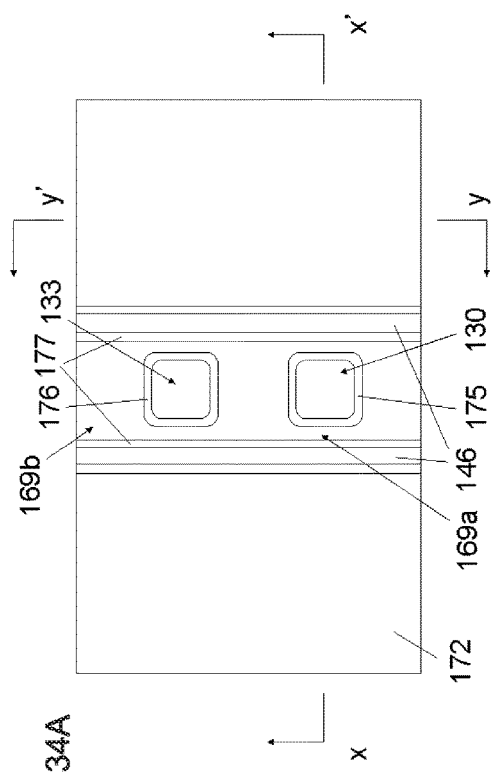
FIG. 34A is a plan view for explaining a method for producing a semiconductor device according to an embodiment of the present invention.
Figure 34B:
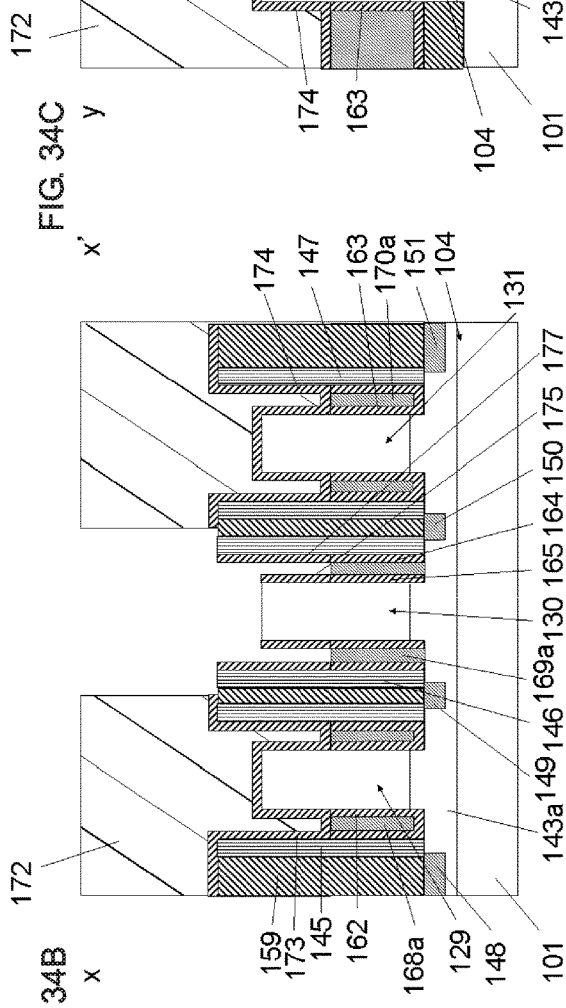
FIG. 34B is a sectional view taken along line X-X' in FIG. 34A.

Subsequently, as illustrated in FIGS. 34A to 34C, at least a portion of the gate insulating film 171 on the contact electrode 169a and the contact line 169b is removed. The gate insulating film 171 is divided into a plurality of portions to provide gate insulating films 173, 174, 175, 176, and 177. Incidentally, the gate insulating films 175, 176, and 177 may be removed by isotropic etching.

As described above, contacts are formed by etching only for the thickness of the gate insulating film 160 and the thickness of the gate insulating film 171. This eliminates the necessity of performing the steps of forming deep contact holes.

Subsequently, as illustrated in FIGS. 35A to 35C, the fourth resist 172 is removed.

Subsequently, as illustrated in FIGS. 36A to 36C, a metal layer 178 is deposited. In a case where the transistor to be formed is of an n-type, the first metal material forming the metal layer 178 preferably has a work function of 4.0 to 4.2 eV. In this case, examples of the first metal material include a compound (TaTi) formed of tantalum and titanium and tantalum nitride (TaN). On the other hand, in a case where the transistor to be formed is of a p-type, the first metal material forming the metal layer 178 preferably has a work function of 5.0 to 5.2 eV. In this case, examples of the first metal material include ruthenium (Ru) and titanium nitride (TiN).

Subsequently, as illustrated in FIGS. 37A to 37C, the metal 178 is subjected to etch back to expose upper portions of the first pillar-shaped silicon layers 129, 131, 132, and 134 and upper portions of the second pillar-shaped silicon layers 130 and 133. At this time, metal lines 179, 180, and 181 are formed from the metal 178.

Subsequently, as illustrated in FIGS. 38A to 38C, the exposed second gate insulating films 173 and 174 on the first pillar-shaped silicon layers 129, 131, 132, and 134 are removed.

Figure 39A:
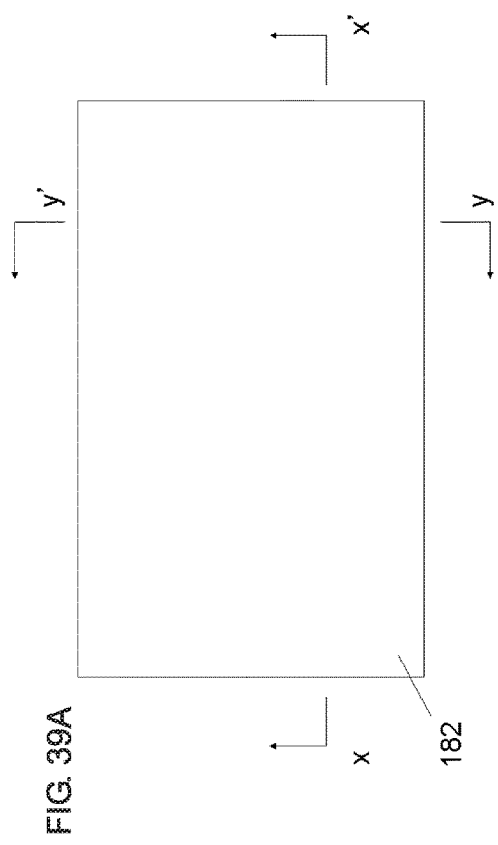
FIG. 39A is a plan view for explaining a method for producing a semiconductor device according to an embodiment of the present invention.
Figure 39C:
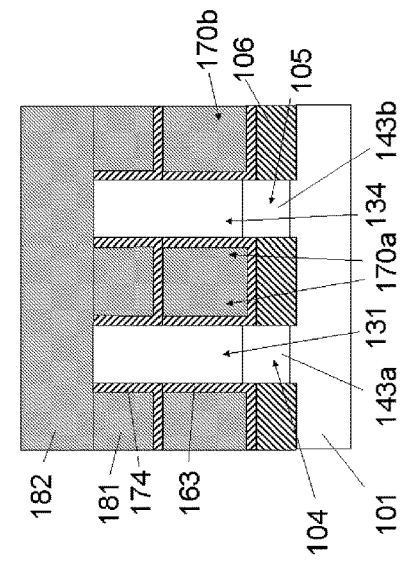
FIG. 39C is a sectional view taken along line Y-Y' in FIG. 39A.
Figure 39B:
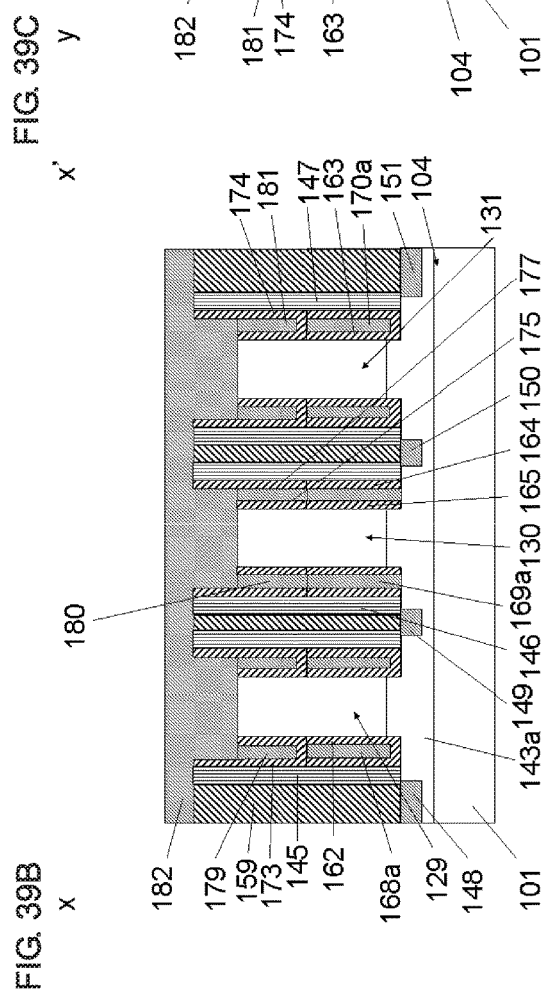
FIG. 39B is a sectional view taken along line X-X' in FIG. 39A.

Subsequently, as illustrated in FIGS. 39A to 39C, a metal layer 182 is deposited. The metal layer 182 may be formed of the same metal material as that for the metal 178 and the type of the metal material is not particularly limited.

Subsequently, as illustrated in FIGS. 40A to 40C, the metal layer 182 is subjected to etch back to form metal lines 183, 184, and 185.

Subsequently, as illustrated in FIGS. 41A to 41C, fifth resists 186 and 187 are formed so as to be orthogonal to the direction in which the metal lines 179, 180, and 181 and the metal lines 183, 184, and 185 extend.

Subsequently, as illustrated in FIGS. 42A to 42C, the metal lines 179, 180, and 181 and the metal lines 183, 184, and 185 are etched to form first contacts 179a, 179b, 181a, and 181b, second contacts 183a, 183b, 185a, and 185b, third contacts 180a and 180b, and fourth contacts 184a and 184b.

Figure 43A:
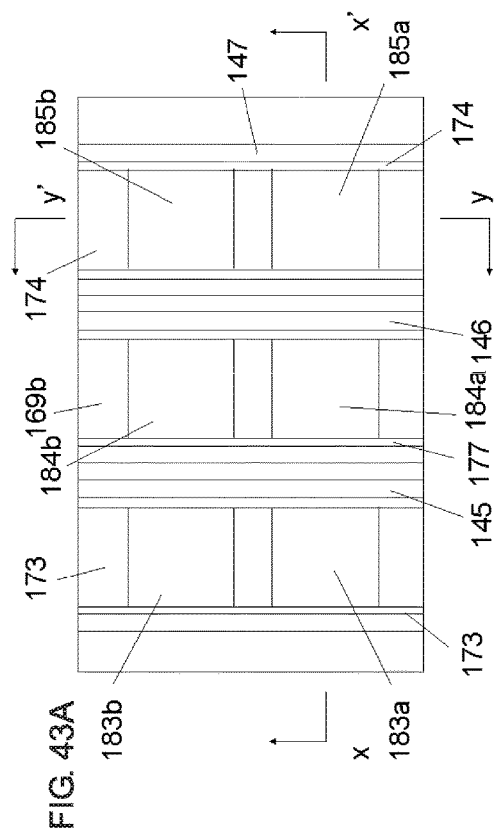
FIG. 43A is a plan view for explaining a method for producing a semiconductor device according to an embodiment of the present invention.
Figure 43C:
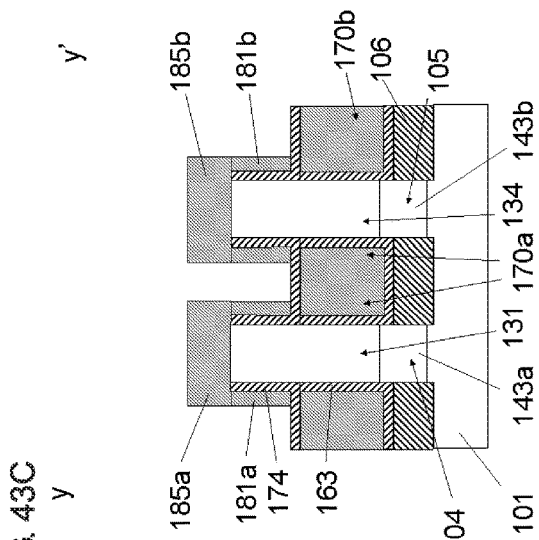
FIG. 43C is a sectional view taken along line Y-Y' in FIG. 43A.
Figure 43B:
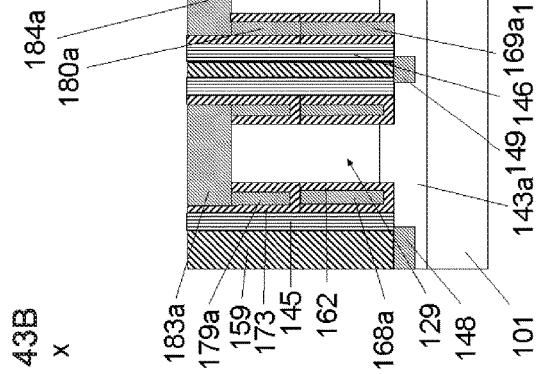
FIG. 43B is a sectional view taken along line X-X' in FIG. 43A.

Subsequently, as illustrated in FIGS. 43A to 43C, the fifth resists 186 and 187 are removed.

Thus, the sixth step has been described. In the sixth step, after the fifth step, a gate insulating film 171 is deposited around the first pillar-shaped silicon layers 129, 131, 132, and 134, on the gate electrodes 168a and 170a and the gate lines 168b and 170b, around the second pillar-shaped silicon layers 130 and 133, and on the contact electrode 169a and the contact line 169b. Furthermore, a metal layer 178 is deposited. Subsequently, upper portions of the first pillar-shaped silicon layers 129, 131, 132, and 134 and upper portions of the second pillar-shaped silicon layers 130 and 133 are exposed. The gate insulating film 171 on the first pillar-shaped silicon layers 129, 131, 132, and 134 is removed. Subsequently, a metal layer 182 is deposited and the metal layer 182 and the metal layer 178 are partially etched to form, from the metal layer 178, first contacts 179a, 179b, 181a, and 181b surrounding upper side walls of the first pillar-shaped silicon layers 129, 131, 132, and 134 and to form, from the metal layer 182, second contacts 183a, 183b, 185a, and 185b connecting upper portions of the first contacts 179a, 179b, 181a, and 181b and upper portions of the first pillar-shaped silicon layers 129, 131, 132, and 134.

Hereafter, a seventh step according to an embodiment of the present invention will be described. In the seventh step, after the sixth step, a second interlayer insulating film 194 is deposited and contact holes 196, 197, 198, and 199 are formed. Subsequently, a metal layer 200 and a nitride film 201 are deposited and the metal layer 200 and the nitride film 201 on the second interlayer insulating film 194 are removed to form, within the contact holes 196, 197, 198, and 199, the pillar-shaped nitride layers 202, 203, 204, and 205 and lower electrodes 206, 207, 208, and 209 surrounding side and bottom portions of the pillar-shaped nitride layers 202, 203, 204, and 205. Subsequently, the second interlayer insulating film 194 is subjected to etch back to expose upper portions of the lower electrodes 206, 207, 208, and 209 surrounding side and bottom portions of the pillar-shaped nitride layers 202, 203, 204, and 205, and the exposed upper portions of the lower electrodes 206, 207, 208, and 209 surrounding the pillar-shaped nitride layers 202, 203, 204, and 205 are removed. Subsequently, a variable-resistance film 210 is deposited so as to surround the pillar-shaped nitride layers 202, 203, 204, and 205 and be connected to the lower electrodes 206, 207, 208, and 209, and the variable-resistance film 210 is etched so as to have a sidewall shape on upper portions of the pillar-shaped nitride layers 202, 203, 204, and 205.

Figure 44C:
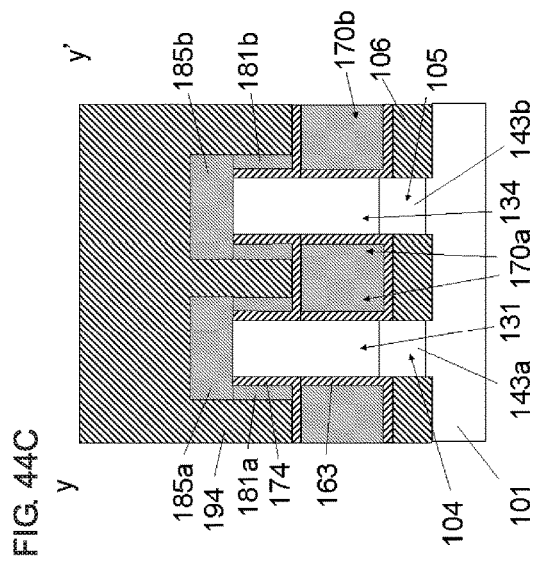
FIG. 44C is a sectional view taken along line Y-Y' in FIG. 44A.
Figure 44A:
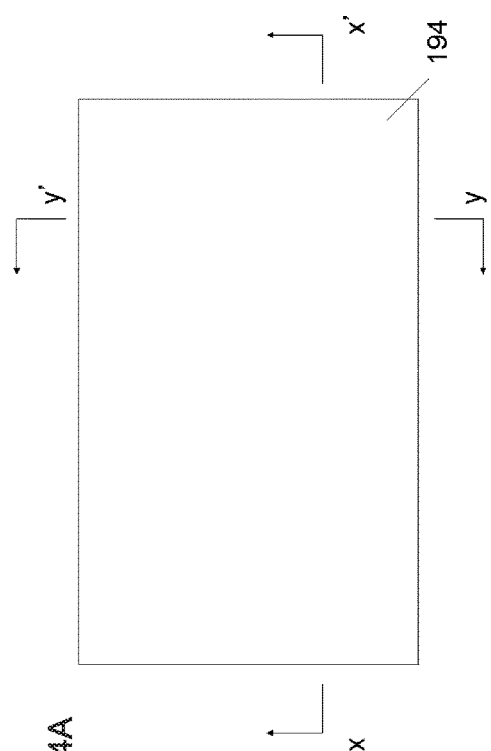
FIG. 44A is a plan view for explaining a method for producing a semiconductor device according to an embodiment of the present invention.
Figure 44B:
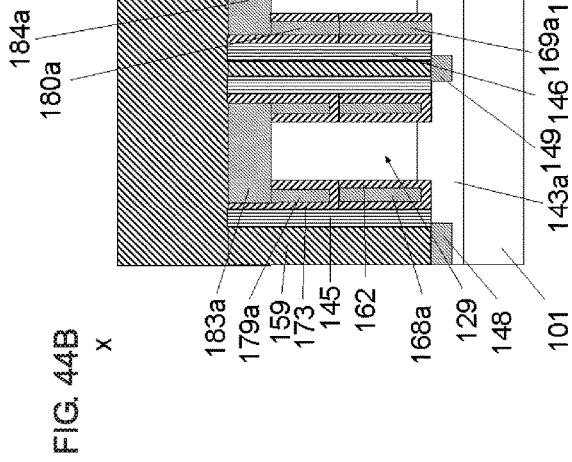
FIG. 44B is a sectional view taken along line X-X' in FIG. 44A.

First, as illustrated in FIGS. 44A to 44C, a second interlayer insulating film 194 is deposited.

Subsequently, as illustrated in FIGS. 45A to 45C, a sixth resist 195 for forming contact holes is formed.

Subsequently, as illustrated in FIGS. 46A to 46C, contact holes 196, 197, 198, and 199 are formed.

Subsequently, as illustrated in FIGS. 47A to 47C, the sixth resist 195 is stripped.

Subsequently, as illustrated in FIGS. 48A to 48C, a metal layer 200 is deposited. The metal layer 200 is preferably formed of titanium nitride.

Subsequently, as illustrated in FIGS. 49A to 49C, a nitride film 201 is deposited.

Figure 50A:
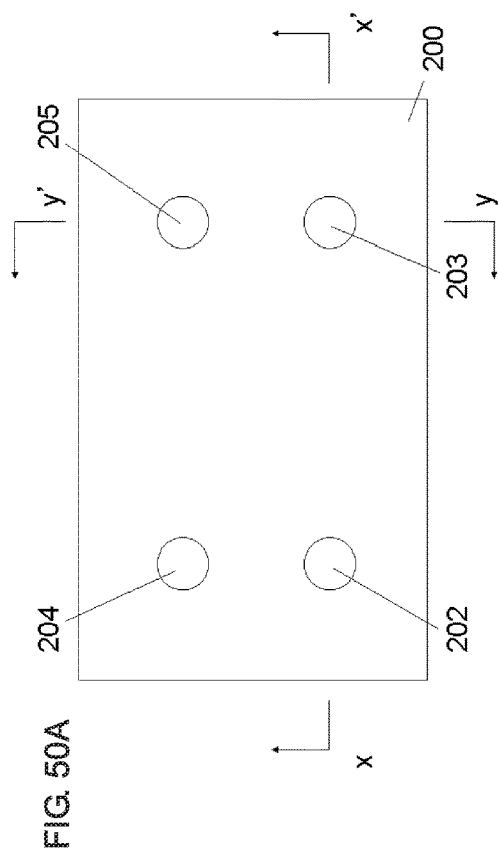
FIG. 50A is a plan view for explaining a method for producing a semiconductor device according to an embodiment of the present invention.
Figure 50C:
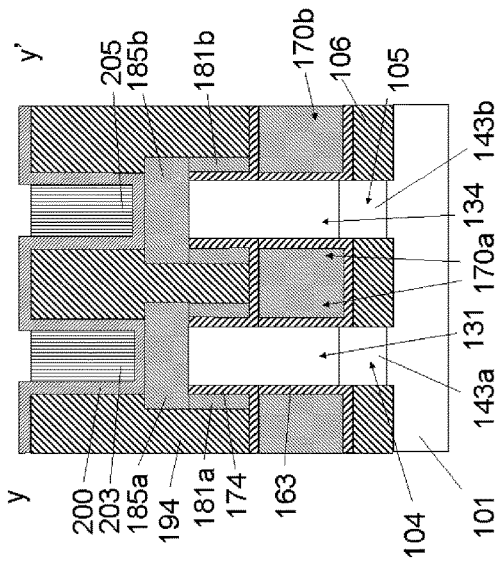
FIG. 50C is a sectional view taken along line Y-Y' in FIG. 50A.
Figure 50B:
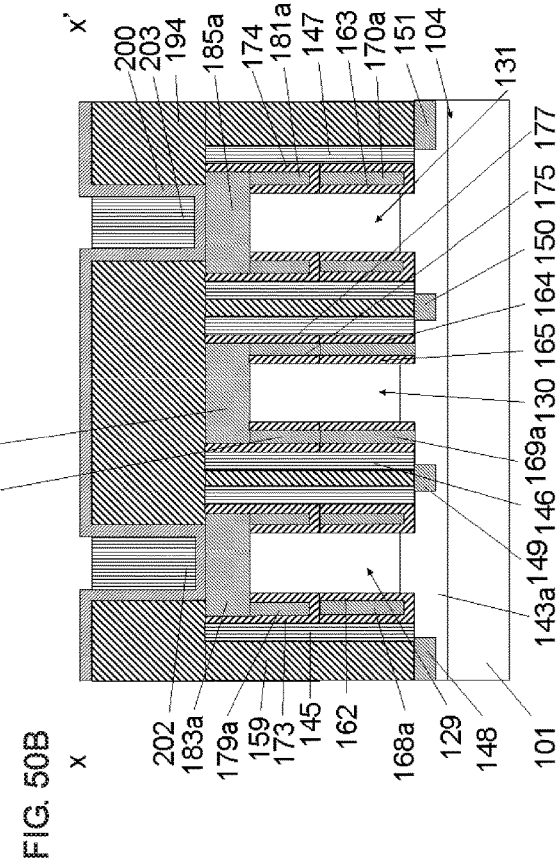
FIG. 50B is a sectional view taken along line X-X' in FIG. 50A.

Subsequently, as illustrated in FIGS. 50A to 50C, the nitride film 201 is subjected to etch back to remove the nitride film 201 on the second interlayer insulating film 194. At this time, pillar-shaped nitride layers 202, 203, 204, and 205 are formed.

Subsequently, as illustrated in FIGS. 51A to 51C, the metal layer 200 on the second interlayer insulating film 194 is removed. As a result, lower electrodes 206, 207, 208, and 209 surrounding side and bottom portions of the pillar-shaped nitride layers 202, 203, 204, and 205 are formed.

Figure 52A:
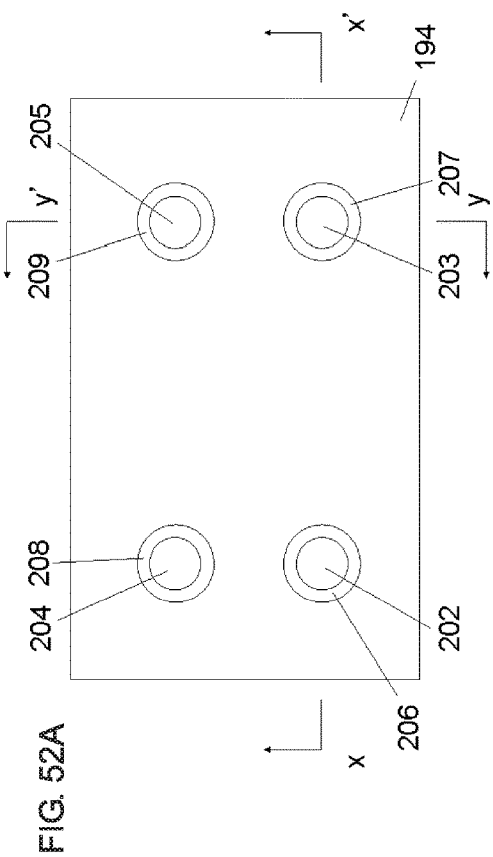
FIG. 52A is a plan view for explaining a method for producing a semiconductor device according to an embodiment of the present invention.
Figure 52C:
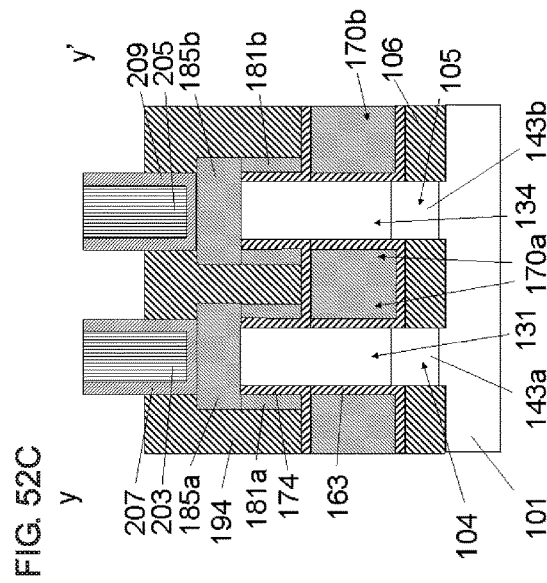
FIG. 52C is a sectional view taken along line Y-Y' in FIG. 52A.
Figure 52B:
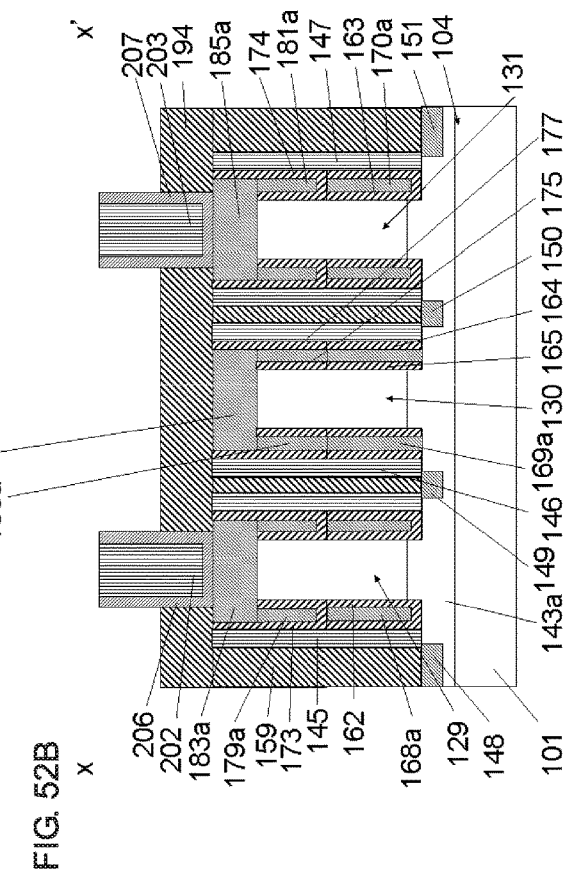
FIG. 52B is a sectional view taken along line X-X' in FIG. 52A.

Subsequently, as illustrated in FIGS. 52A to 52C, the second interlayer insulating film 194 is subjected to etch back to expose upper portions of the lower electrodes 206, 207, 208, and 209 surrounding the pillar-shaped nitride layers 202, 203, 204, and 205.

Figure 53A:
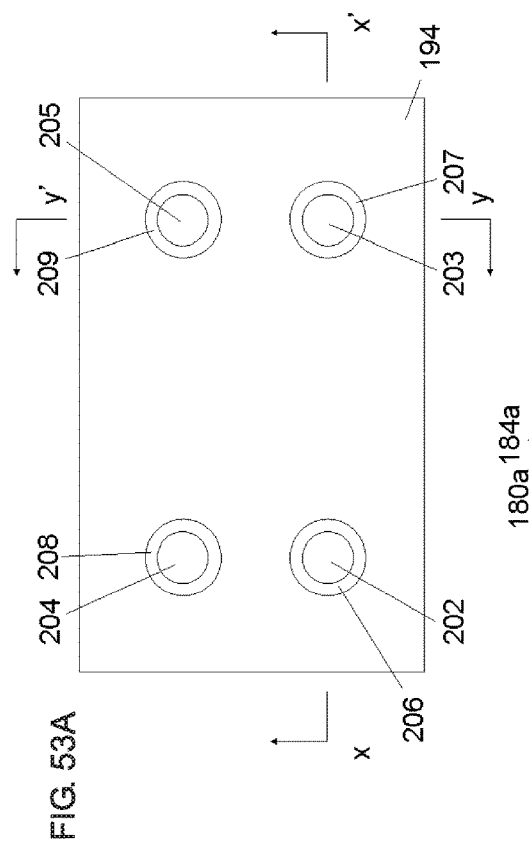
FIG. 53A is a plan view for explaining a method for producing a semiconductor device according to an embodiment of the present invention.
Figure 53C:
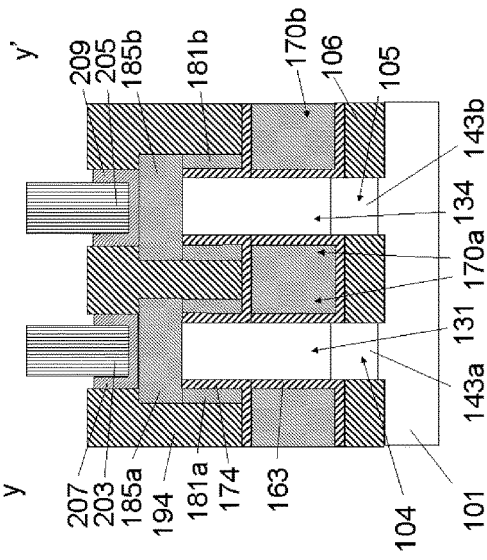
FIG. 53C is a sectional view taken along line Y-Y' in FIG. 53A.
Figure 53B:
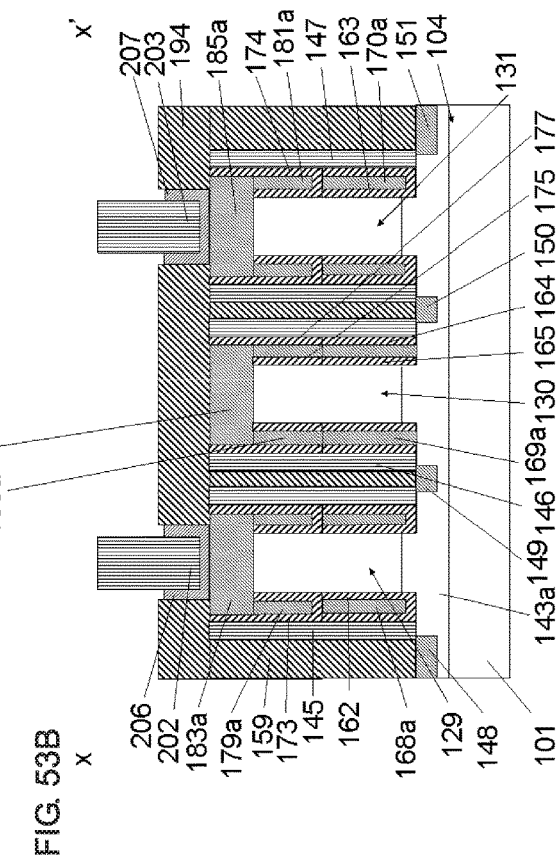
FIG. 53B is a sectional view taken along line X-X' in FIG. 53A.

Subsequently, as illustrated in FIGS. 53A to 53C, the exposed upper portions of the lower electrodes 206, 207, 208, and 209 surrounding the pillar-shaped nitride layers 202, 203, 204, and 205 are removed.

Subsequently, as illustrated in FIGS. 54A to 54C, the second interlayer insulating film 194 is subjected to etch back to expose upper portions of the lower electrodes 206, 207, 208, and 209 surrounding the pillar-shaped nitride layers 202, 203, 204, and 205. Incidentally, in a case where the upper portions of the lower electrodes 206, 207, 208, and 209 are exposed after the step illustrated in FIGS. 53A to 53C, the step illustrated in FIGS. 54A to 54C is not necessary.

Subsequently, as illustrated in FIGS. 55A to 55C, a variable-resistance film 210 is deposited so as to surround the pillar-shaped nitride layers 202, 203, 204, and 205 and be connected to the lower electrodes 206, 207, 208, and 209. The variable-resistance film 210 is preferably a phase-change film formed of chalcogenide glass (GST: $Ge_2Sb_2Te_5$), for example.

Subsequently, as illustrated in FIGS. 56A to 56C, the variable-resistance film 210 is etched so as to have a sidewall shape on upper portions of the pillar-shaped nitride layers 202, 203, 204, and 205. The variable-resistance film 210 is divided into a plurality of portions to provide variable-resistance films 211, 212, 213, and 214. At this time, the variable-resistance film 210 may remain as variable-resistance films 215, 216, 217, and 218 on upper side walls of the lower electrodes 206, 207, 208, and 209.

Thus, the seventh step has been described. In the seventh step, after the sixth step, a second interlayer insulating film 194 is deposited and contact holes 196, 197, 198, and 199 are formed. Subsequently, a metal 200 and a nitride film 201 are deposited and the metal layer 200 and the nitride film 201 on the second interlayer insulating film 194 are removed to form, within the contact holes 196, 197, 198, and 199, pillar-shaped nitride layers 202, 203, 204, and 205 and lower electrodes 206, 207, 208, and 209 surrounding side and bottom portions of the pillar-shaped nitride layers 202, 203, 204, and 205. Subsequently, the second interlayer insulating film 194 is subjected to etch back to expose upper portions of the lower electrodes 206, 207, 208, and 209 surrounding side and bottom portions of the pillar-shaped nitride layers 202, 203, 204, and 205, and the exposed upper portions of the lower electrodes 206, 207, 208, and 209 surrounding the pillar-shaped nitride layers 202, 203, 204, and 205 are removed. Subsequently, a variable-resistance film 210 is deposited so as to surround the pillar-shaped nitride layers 202, 203, 204, and 205 and be connected to the lower electrodes 206, 207, 208, and 209, and the variable-resistance film 210 is etched so as to have a sidewall shape on upper portions of the pillar-shaped nitride layers 202, 203, 204, and 205. In the seventh step, the above-described structure is formed with a single mask for forming the contact holes 196, 197, 198, and 199. As a result, the number of steps required to produce the semiconductor device can be reduced.

Figure 57A:
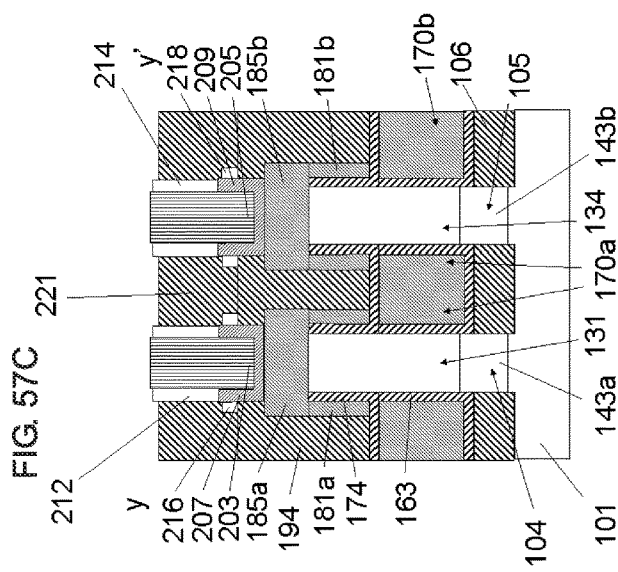
FIG. 57A is a plan view for explaining a method for producing a semiconductor device according to an embodiment of the present invention.
Figure 57B:
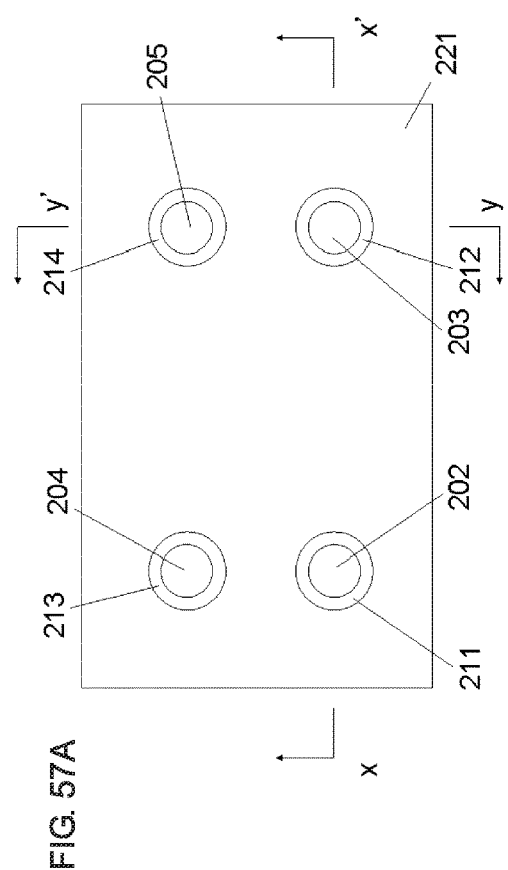
FIG. 57B is a sectional view taken along line X-X' in FIG. 57A.
Figure 57C:
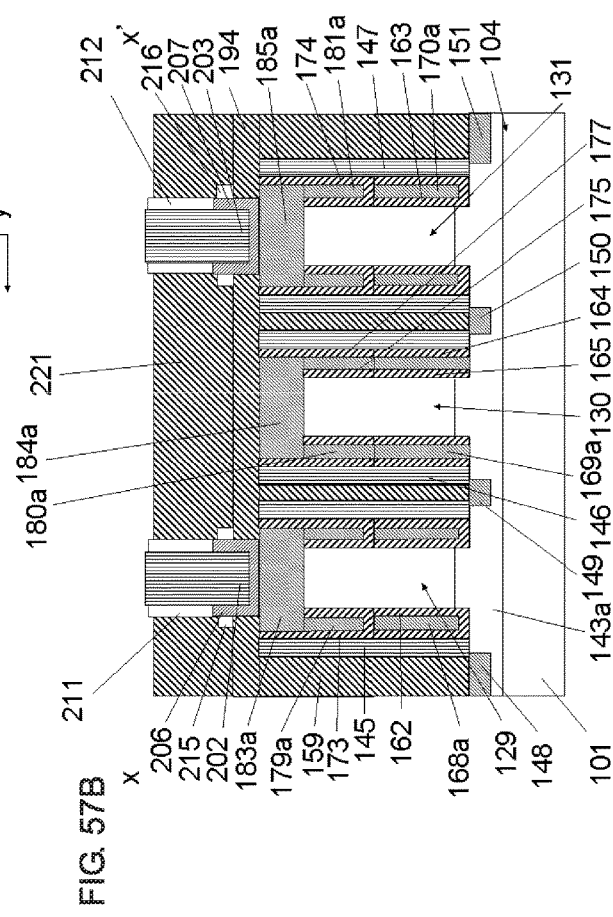
FIG. 57C is a sectional view taken along line Y-Y' in FIG. 57A.

After that, as illustrated in FIGS. 57A to 57C, a third interlayer insulating film 221 is deposited and planarized to expose upper portions of the variable-resistance films 211, 212, 213, and 214.

Figure 58C:
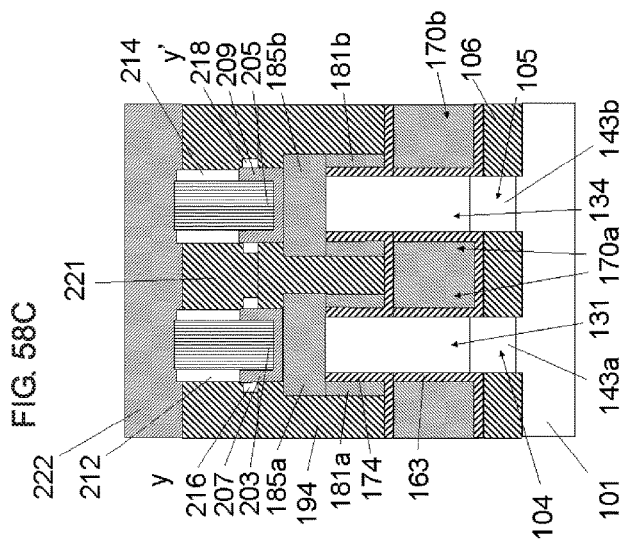
FIG. 58C is a sectional view taken along line Y-Y' in FIG. 58A.
Figure 58A:
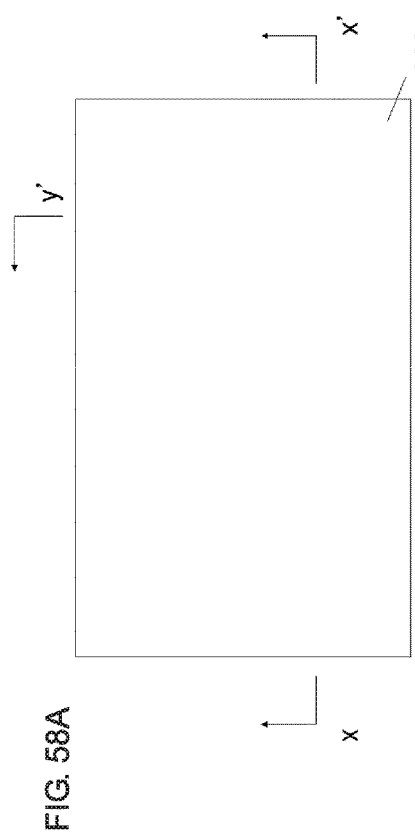
FIG. 58A is a plan view for explaining a method for producing a semiconductor device according to an embodiment of the present invention.
Figure 58B:
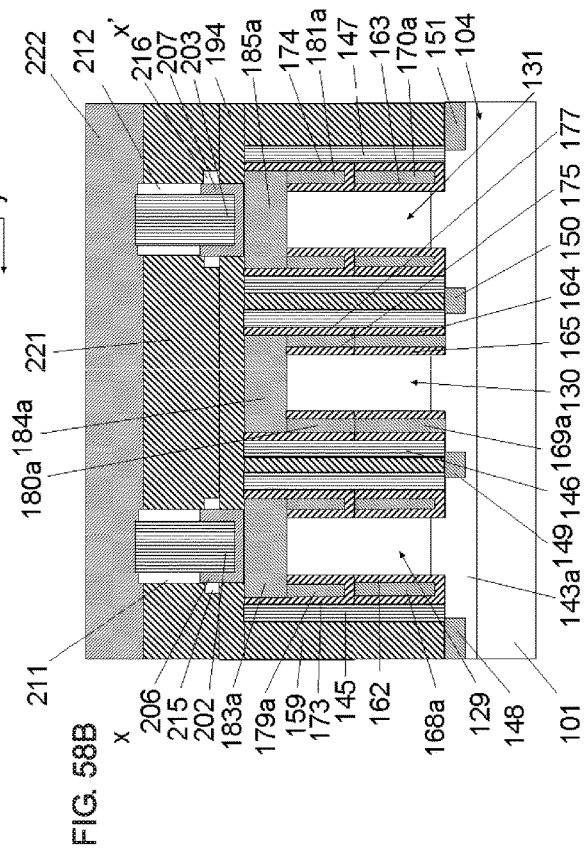
FIG. 58B is a sectional view taken along line X-X' in FIG. 58A.

Subsequently, as illustrated in FIGS. 58A to 58C, a metal layer 222 is deposited.

Subsequently, as illustrated in FIGS. 59A to 59C, seventh resists 223 and 224 for forming bit lines are formed.

Figure 60C:
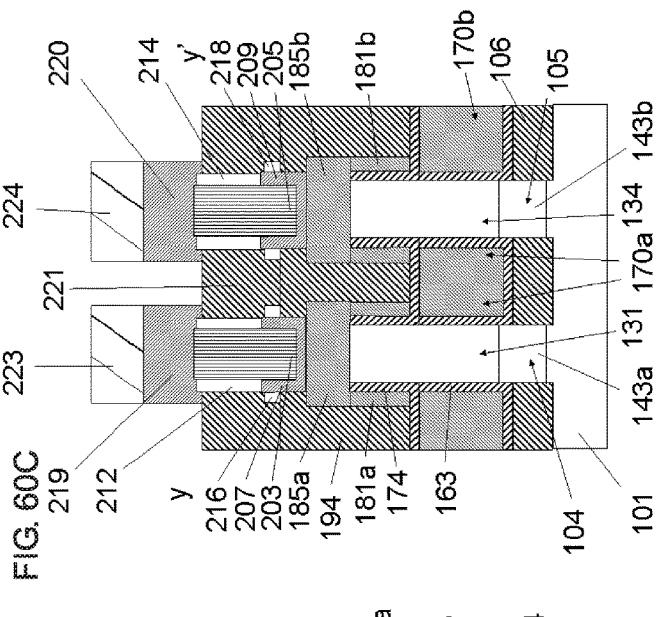
FIG. 60C is a sectional view taken along line Y-Y' in FIG. 60A.
Figure 60A:
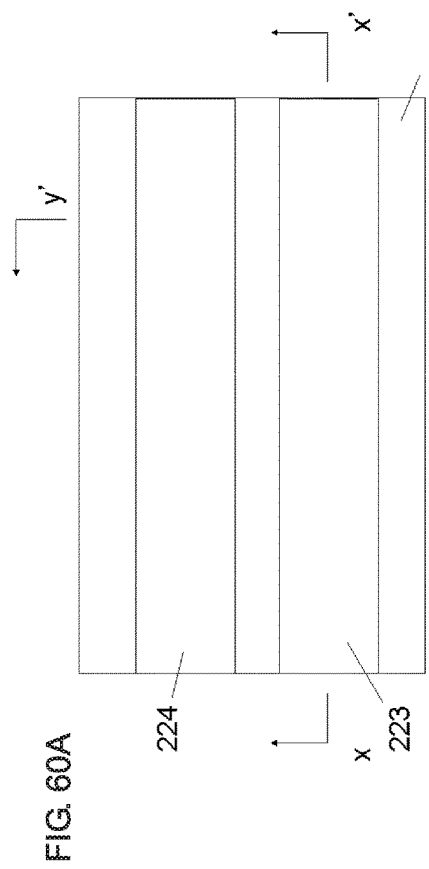
FIG. 60A is a plan view for explaining a method for producing a semiconductor device according to an embodiment of the present invention.
Figure 60B:
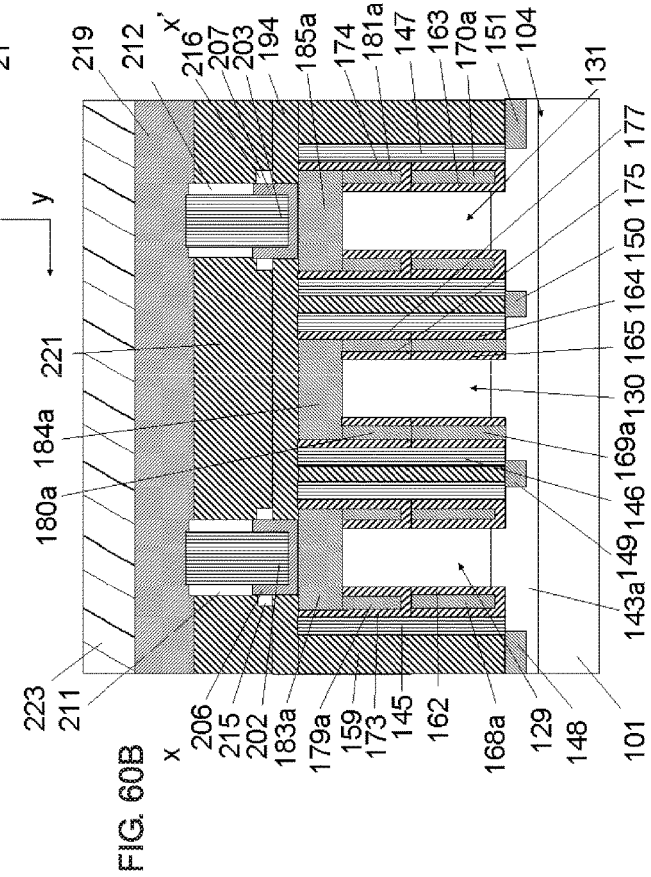
FIG. 60B is a sectional view taken along line X-X' in FIG. 60A.

Subsequently, as illustrated in FIGS. 60A to 60C, the metal layer 222 is etched to form bit lines 219 and 220.

Finally, as illustrated in FIGS. 61A to 61C, the seventh resists 223 and 224 are stripped.

Thus, production steps for forming the structure of a semiconductor device according to an embodiment of the present invention have been described.

The semiconductor device according to the above-described embodiment includes variable-resistance films 189, 190, 191, and 192 formed around upper portions of the first pillar-shaped silicon layers 129, 131, 132, and 134, and lower electrodes 184, 185, 186, and 187 formed around lower portions of the pillar-shaped nitride layers 180, 181, 182, and 183 and connected to the variable-resistance films 189, 190, 191, and 192. This allows reduction in the area of cross sections (in the current flow directions) of the phase-change films that are the variable-resistance films 189, 190, 191, and 192 and heater elements that are the lower electrodes 184, 185, 186, and 187.

In addition, the storage device according to the embodiment includes the pillar-shaped nitride layers 180, 181, 182, and 183 that are nitride films so that cooling of phase-change films that are the variable-resistance films 189, 190, 191, and 192 can be promoted. The storage device further includes the lower electrodes 184, 185, 186, and 187 below the pillar-shaped nitride layers 180, 181, 182, and 183. This allows a decrease in the contact resistance between the lower electrodes 184, 185, 186, and 187 and cell transistors.

SGTs allow a larger current per unit gate width to pass than double-gate transistors. In addition, SGTs have a structure in which the gate electrode surrounds the pillar-shaped semiconductor layer. Thus, the gate width per unit area can be increased, so that an even larger current can be passed. Thus, SGTs allow a large reset current to pass, so that phase-change films that are the variable-resistance films 189, 190, 191, and 192 can be melted at a high temperature (with a large current). For the subthreshold swing of SGTs, an ideal value can be achieved. Accordingly, off current can be decreased, so that phase-change films that are the variable-resistance films 189, 190, 191, and 192 can be rapidly cooled (by stopping the current).

The semiconductor device according to the embodiment includes the gate insulating film 194 formed around upper portions of the first pillar-shaped silicon layers 129, 131, 132, and 134, the first contacts 179a, 179b, 181a, and 181b formed around the gate insulating film 194 and derived from the metal layer 178, and the second contacts 183a, 183b, 185a, and 185b connecting upper portions of the first contacts 179a, 179b, 181a, and 181b and upper portions of the first pillar-shaped silicon layers 129, 131, 132, and 134 and derived from the metal layer 182. This provides an SGT in which upper portions of the first pillar-shaped silicon layers 129, 131, 132, and 134 function as n-type semiconductor layers or p-type semiconductor layers by using the work function difference between metal and semiconductor. This eliminates the necessity of performing the step of forming diffusion layers in upper portions of the first pillar-shaped silicon layers 129, 131, 132, and 134.

A large amount of metal is used. For example, the gate electrode 168a and the gate line 168b are formed of metal. The first contacts 179a, 179b, 181a, and 181b formed around the gate insulating film 173 are formed of metal. The second contacts 183a, 183b, 185a, and 185b connecting upper portions of the first contacts 179a, 179b, 181a, and 181b and upper portions of the first pillar-shaped silicon layers 129, 131, 132, and 134 are formed of metal. As a result, the heat dissipation effect of the metal can promote cooling of portions heated by a large reset current. In addition, the gate insulating film 162 formed around and below the gate electrode 168a and the gate line 168b is formed. Accordingly, a gate last process of forming metal gates at the final stage of the heat-treatment step is carried out to form the gate electrodes 168a and 170a that are metal gates. Thus, both of the metal gate process and the high-temperature process can be successfully performed.

The semiconductor device according to the embodiment includes the fin-shaped silicon layers 104 and 105 formed on the semiconductor substrate 101, the first insulating film 106 formed around the fin-shaped silicon layers 104 and 105, the first pillar-shaped silicon layers 129, 131, 132, and 134 formed on the fin-shaped silicon layers 104 and 105, and the gate insulating films 162 and 163 formed around and below the gate electrodes 168a and 170a and the gate lines 168b and 170b. The gate electrodes 168a and 170a and the gate lines 168b and 170b are formed of metal. The gate lines 168b and 170b extend in a direction orthogonal to the fin-shaped silicon layers 104 and 105. The second diffusion layers 143a and 143b are formed in the fin-shaped silicon layers 104 and 105. The outer linewidths of the gate electrodes 168a and 170a are equal to the linewidths of the gate lines 168b and 170b. The linewidths of the first pillar-shaped silicon layers 129, 131, 132, and 134 are equal to the linewidths of the fin-shaped silicon layers 104 and 105. Thus, in the semiconductor device according to the embodiment, the fin-shaped silicon layers 104 and 105, the first pillar-shaped silicon layers 129, 131, 132, and 134, the gate electrodes 168a and 170a, and the gate lines 168b and 170b are formed by self alignment with two masks. As a result, according to the embodiment, the number of steps required to produce the semiconductor device can be reduced.

The semiconductor device according to the embodiment includes the contact line 169b extending parallel with the gate lines 168b and 170b and connected to the second diffusion layers 143a and 143b. Thus, the second diffusion layers 143a and 143b are connected to each other and the resistance of the source lines can be decreased. As a result, a large reset current can be passed through the source lines. The contact line 169b extending parallel with the gate lines 168b and 170b is preferably disposed such that, for example, a single contact line 169b is disposed every 2, 4, 8, 16, 32, or 64 memory cells arranged in a line in the direction in which the bit lines 207 and 208 extend.

In the semiconductor device according to the embodiment, the structure including the second pillar-shaped silicon layers 130 and 133 and the contact electrode 169a and the contact line 169b formed around the second pillar-shaped silicon layers 130 and 133, is the same as the transistor structure of the memory cell positioned, for example, in the first row and the first column except that the contact electrode 169a is connected to the second diffusion layers 143a and 143b. All the source lines constituted by the second diffusion layers 143a and 143b and extending parallel with the gate lines 168b and 170b are connected to the contact line 169b. As a result, the number of steps required to produce the semiconductor device can be reduced.

Note that the present invention encompasses various embodiments and modifications without departing from the broad spirit and scope of the present invention. The above-described embodiments are used to describe examples of the present invention and do not limit the scope of the present invention.

For example, a method for producing a semiconductor device in which the p-type (including $p^+$ type) and the n-type (including $n^+$ type) in the above-described embodiment are changed to the opposite conductivity types and a semiconductor device produced by this method are obviously within the technical scope of the present invention.

The invention claimed is:

1. A semiconductor device, comprising:
    a first pillar-shaped semiconductor layer,
    a first gate insulating film formed around said first pillar-shaped semiconductor layer,
    a gate electrode formed of metal and formed around said first gate insulating film,
    a gate line formed of metal and connected to said gate electrode,
    a second gate insulating film formed around an upper portion of said first pillar-shaped semiconductor layer,
    a first contact formed of a first metal material and formed around said second gate insulating film,
    a second contact formed of a second metal material and connecting an upper portion of said first contact and an upper portion of said first pillar-shaped semiconductor layer,
    a diffusion layer formed in a lower portion of said first pillar-shaped semiconductor layer,
    a pillar-shaped insulator layer formed on said second contact,
    a variable-resistance film formed around an upper portion of said pillar-shaped insulator layer, and
    a lower electrode formed around a lower portion of said pillar-shaped insulator layer and connected to said variable-resistance film.

2. The semiconductor device according to claim 1, wherein said pillar-shaped insulator layer is a nitride film and said lower electrode is formed between said pillar-shaped insulator layer and said second contact.

3. The semiconductor device according to claim 1, wherein said first metal material forming said first contact has a work function of 4.0 to 4.2 eV.

4. The semiconductor device according to claim 1, wherein said first metal material forming said first contact has a work function of 5.0 to 5.2 eV.

5. The semiconductor device according to claim 1, comprising:
    a fin-shaped semiconductor layer formed on a semiconductor substrate so as to extend in one direction,
    a first insulating film formed around said fin-shaped semiconductor layer,
    said first pillar-shaped semiconductor layer formed on said fin-shaped semiconductor layer, and
    said first gate insulating film formed around and below said gate electrode and said gate line,
    wherein said gate line extends in a direction orthogonal to said fin-shaped semiconductor layer, and
    said diffusion layer is formed in said fin-shaped semiconductor layer.

6. The semiconductor device according to claim 5, wherein said diffusion layer formed in said fin-shaped semiconductor layer is further formed in said semiconductor substrate.

7. The semiconductor device according to claim 5, further comprising a contact line extending parallel with said gate line and connected to said diffusion layer.

8. The semiconductor device according to claim 7, comprising:
    said fin-shaped semiconductor layer formed on said semiconductor substrate,
    said first insulating film formed around said fin-shaped semiconductor layer,
    a second pillar-shaped semiconductor layer formed on said fin-shaped semiconductor layer,
    a contact electrode formed of metal and formed around said second pillar-shaped semiconductor layer,
    said contact line formed of metal, extending in a direction orthogonal to said fin-shaped semiconductor layer, and connected to said contact electrode, and
    said diffusion layer formed in said fin-shaped semiconductor layer and in a lower portion of said second pillar-shaped semiconductor layer,
    wherein said contact electrode is connected to said diffusion layer.

9. The semiconductor device according to claim 8, wherein a portion of said first gate insulating film is formed between said second pillar-shaped semiconductor layer and said contact electrode.

10. The semiconductor device according to claim 9, wherein a portion of said first gate insulating film is formed around said contact electrode and around said contact line.

11. The semiconductor device according to claim 8, wherein a linewidth of said second pillar-shaped semiconductor layer in the direction orthogonal to said fin-shaped semiconductor layer is equal to a linewidth of said fin-shaped semiconductor layer in a direction orthogonal to a direction in which said fin-shaped semiconductor layer extends.

12. The semiconductor device according to claim 8, wherein an outer linewidth of said contact electrode is equal to a linewidth of said contact line.

13. The semiconductor device according to claim 5, wherein an outer linewidth of said gate electrode is equal to a linewidth of said gate line, and
    a linewidth of said first pillar-shaped semiconductor layer in said direction orthogonal to said fin-shaped semiconductor layer is equal to a linewidth of said fin-shaped semiconductor layer in the direction orthogonal to said fin-shaped semiconductor layer.

14. The semiconductor device according to claim 1, comprising:
    said first pillar-shaped semiconductor layer formed on a semiconductor substrate, and
    said first gate insulating film formed around and below said gate electrode and said gate line,
    wherein said diffusion layer is formed in said semiconductor substrate.

15. The semiconductor device according to claim 14, further comprising a contact line extending parallel with said gate line and connected to said diffusion layer.

16. The semiconductor device according to claim 14, further comprising:
   a second pillar-shaped semiconductor layer formed on said semiconductor substrate,
   a contact electrode formed of metal and formed around said second pillar-shaped semiconductor layer,
   a contact line connected to said contact electrode, and
   said diffusion layer formed in a lower portion of said second pillar-shaped semiconductor layer,
   wherein said contact electrode is connected to said diffusion layer.

17. The semiconductor device according to claim 16, wherein a portion of said first gate insulating film is formed between said second pillar-shaped semiconductor layer and said contact electrode.

18. The semiconductor device according to claim 17, wherein a portion of said first gate insulating film is formed around said contact electrode and around said contact line.

19. The semiconductor device according to claim 16, wherein an outer linewidth of said contact electrode is equal to a linewidth of said contact line.

20. The semiconductor device according to claim 14, wherein an outer linewidth of said gate electrode is equal to a linewidth of said gate line.

21. A method for producing a semiconductor device, the method comprising:
   a first step of forming a fin-shaped semiconductor layer on a semiconductor substrate and forming a first insulating film around the fin-shaped semiconductor layer,
   a second step, following the first step, of forming a first pillar-shaped semiconductor layer, a first dummy gate derived from a first polysilicon, a second pillar-shaped semiconductor layer, and a second dummy gate derived from the first polysilicon,
   a third step, following the second step, of forming a third dummy gate and a fourth dummy gate on side walls of the first dummy gate, the first pillar-shaped semiconductor layer, the second dummy gate, and the second pillar-shaped semiconductor layer,
   a fourth step, following the third step, of forming a diffusion layer in an upper portion of the fin-shaped semiconductor layer, in a lower portion of the first pillar-shaped semiconductor layer, and in a lower portion of the second pillar-shaped semiconductor layer,
   a fifth step, following the fourth step, of depositing a first interlayer insulating film and exposing upper portions of the first dummy gate, the second dummy gate, the third dummy gate, and the fourth dummy gate, removing the first dummy gate, the second dummy gate, the third dummy gate, and the fourth dummy gate, forming a first gate insulating film around the first pillar-shaped semiconductor layer and around the second pillar-shaped semiconductor layer, removing the first gate insulating film from around a bottom portion of the second pillar-shaped semiconductor layer, depositing a first metal layer and performing etch back to expose an upper portion of the first pillar-shaped semiconductor layer and an upper portion of the second pillar-shaped semiconductor layer, to form a gate electrode and a gate line around the first pillar-shaped semiconductor layer, and to form a contact electrode and a contact line around the second pillar-shaped semiconductor layer,
   a sixth step, following the fifth step, of depositing a second gate insulating film around the first pillar-shaped semiconductor layer, on the gate electrode and the gate line, around the second pillar-shaped semiconductor layer, and on the contact electrode and the contact line, depositing a second metal layer and performing etch back to expose an upper portion of the first pillar-shaped semiconductor layer and an upper portion of the second pillar-shaped semiconductor layer, removing the second gate insulating film on the first pillar-shaped semiconductor layer, depositing a third metal layer, partially etching the third metal layer and the second metal layer to form a first contact surrounding an upper side wall of the first pillar-shaped semiconductor layer and to form a second contact connecting an upper portion of the first contact and an upper portion of the first pillar-shaped semiconductor layer,
   a seventh step, following the sixth step, of depositing a second interlayer insulating film, forming a contact hole, depositing a fourth metal layer and a nitride film, removing the fourth metal layer and the nitride film on the second interlayer insulating film to form, within the contact hole, a pillar-shaped insulator layer and a lower electrode surrounding side and bottom portions of the pillar-shaped insulator layer, subjecting the second interlayer insulating film to etch back to expose an upper portion of the lower electrode surrounding the pillar-shaped insulator layer, removing the exposed upper portion of the lower electrode surrounding the pillar-shaped insulator layer, depositing a variable-resistance film so as to surround the pillar-shaped insulator layer and be connected to the lower electrode, and etching the variable-resistance film so as to have a sidewall shape on an upper portion of the pillar-shaped nitride layer, and
   depositing a third interlayer insulating film directly physically contacting the variable-resistance film and extending to physically contact another variable-resistance film.

22. The method for producing a semiconductor device according to claim 21, wherein the second step comprises:
   forming a second insulating film around the fin-shaped semiconductor layer,
   depositing the first polysilicon on the second insulating film and planarizing the first polysilicon,
   forming a second resist for forming the gate line, the first pillar-shaped semiconductor layer, the contact line, and the second pillar-shaped semiconductor layer in a direction orthogonal to a direction in which the fin-shaped semiconductor layer extends, and
   while using the second resist as a mask, etching the first polysilicon, the second insulating film, and the fin-shaped semiconductor layer to form the first pillar-shaped semiconductor layer, the first dummy gate derived from the first polysilicon, the second pillar-shaped semiconductor layer, and the second dummy gate derived from the first polysilicon.

23. The method for producing a semiconductor device according to claim 22, which comprises, after the first polysilicon is deposited on the second insulating film and planarized, forming a third insulating film on the first polysilicon.

24. The method for producing a semiconductor device according to claim 22, comprising, as the third step, after the second step, forming a fourth insulating film around the first pillar-shaped semiconductor layer, the second pillar-shaped semiconductor layer, the first dummy gate, and the second dummy gate, depositing a second polysilicon around the fourth insulating film and etching the second polysilicon so as to remain on side walls of the first dummy gate, the first pillar-shaped semiconductor layer, the second dummy gate, and the second pillar-shaped semiconductor layer to form the third dummy gate and the fourth dummy gate.

25. The method for producing a semiconductor device according to claim 24, comprising, as the fourth step, forming the diffusion layer in an upper portion of the fin-shaped semiconductor layer, in a lower portion of the first pillar-shaped semiconductor layer, and in a lower portion of the second pillar-shaped semiconductor layer, forming a fifth insulating film around the third dummy gate and the fourth dummy gate and etching the fifth insulating film so as to have a sidewall shape to form sidewalls derived from the fifth insulating film, and forming a compound layer formed of metal and semiconductor on the diffusion layer.

26. The method for producing a semiconductor device according to claim 25, comprising, as the fifth step, after the fourth step, depositing the first interlayer insulating film and performing chemical mechanical polishing to expose upper portions of the first dummy gate, the second dummy gate, the third dummy gate, and the fourth dummy gate, removing the first dummy gate, the second dummy gate, the third dummy gate, and the fourth dummy gate, removing the second insulating film and the fourth insulating film, forming a gate insulating film around the first pillar-shaped semiconductor layer, around the second pillar-shaped semiconductor layer, and on inner sides of the fifth insulating film, forming a third resist for removing the gate insulating film from around a bottom portion of the second pillar-shaped semiconductor layer, removing the gate insulating film from around the bottom portion of the second pillar-shaped semiconductor layer, depositing a first metal layer, and performing etch back to expose an upper portion of the first pillar-shaped semiconductor layer and an upper portion of the second pillar-shaped semiconductor layer, to form the gate electrode and the gate line around the first pillar-shaped semiconductor layer and to form the contact electrode and the contact line around the second pillar-shaped semiconductor layer.

* * * * *